United States Patent [19]

Keane et al.

[11] Patent Number: 5,195,045

[45] Date of Patent: Mar. 16, 1993

[54] AUTOMATIC IMPEDANCE MATCHING APPARATUS AND METHOD

[75] Inventors: Anthony R. A. Keane, Webster, N.Y.; Steven E. Hauer, Berlin, N.J.

[73] Assignee: ASTEC America, Inc., Oceanside, Calif.

[21] Appl. No.: 661,813

[22] Filed: Feb. 27, 1991

[51] Int. Cl.$^5$ .............................................. H03H 7/40
[52] U.S. Cl. .................... 364/482; 333/17.3; 333/32; 331/36 R; 315/111.51
[58] Field of Search ............... 364/482, 483, 484; 333/17.3, 17.1, 17.2, 32; 315/111.51; 331/1 R, 36 R, 36 C, 36 L

[56] References Cited

U.S. PATENT DOCUMENTS

| | | | |
|---|---|---|---|
| 3,129,386 | 4/1964 | Daly | 325/174 |
| 3,569,777 | 3/1971 | Beaudry | 315/111.21 |
| 3,601,717 | 8/1971 | Kuecken | 333/17.3 |
| 3,648,191 | 3/1972 | Beaudry | 330/192 |
| 4,004,102 | 1/1977 | Ott | 379/398 |
| 4,356,458 | 10/1982 | Armitage | 333/17.3 |
| 4,373,581 | 2/1983 | Toellner | 166/53 |
| 4,375,051 | 2/1983 | Theall | 333/17.3 |
| 4,493,112 | 1/1985 | Bruene | 455/123 |
| 4,551,690 | 11/1985 | Quist | 331/36 L |
| 4,626,728 | 12/1986 | Flackenecker et al. | 310/316 |
| 4,629,940 | 12/1986 | Gagne et al. | 315/111.51 |
| 4,679,007 | 7/1987 | Reese et al. | 333/17.3 |
| 4,763,089 | 8/1988 | Pon | 333/202 |
| 5,001,649 | 3/1991 | Lo et al. | 364/484 |

OTHER PUBLICATIONS

Product specification datasheet for the "S83C552/S80C552 Single-Chip 8-Bit Microcontroller with A/D, Capture/Compare Timer, With High-Speed Outputs, PWM," *Signetcis Microcontroller Users' Guide,* Signetics Philips Components, Feb. 1989, pp. 2-112 to 2-122.

Product spec. datasheet for "CMOS Dual 8-Bit Buffered Multiplying DAC AD7528," *Data Conversion Products Databook,* Analog Devices Inc., Apr., 1988, pp. 2-193 to 2-196.

Product specification datasheet for "CMOS Low Cost 10-Bit Multiplying DAC AD7533," *Data Conversion Products Databook,* Analog Devices Inc., Apr. 1988, pp. 2-197 to 2-202.

Product specification datasheet for the "L298 Dual Full-H Driver," Texas Instruments, Oct., 1986, pp. 5-17 to 5-18.

*Primary Examiner*—Vincent N. Trans
*Attorney, Agent, or Firm*—McCubbrey, Bartels, Meyer & Ward

[57] ABSTRACT

An automatic impedance matching apparatus for matching an RF-signal generator to a load, such as a plasma etching chamber, is disclosed. The matching apparatus comprises a matching network having two variable impedance devices, a tune detector for detecting the condition of the impedance match between the RF-signal and the load, and a controller for modifying the values of the variable impedance components in response to the measured tune condition. The present invention disclosed improve reset and convergence unit and eliminates the need for the "dead-band" provided around the matching point found in prior art impedance matching controllers. Also disclosed is an improved adjustment unit for adjusting the variable impedance components which is faster and more stable than found in prior art controllers. Also disclosed is a normalization unit for normalizing the input detection siganls such that variations in turning performance due to variations in input power level from the source are substantially reduced.

43 Claims, 23 Drawing Sheets

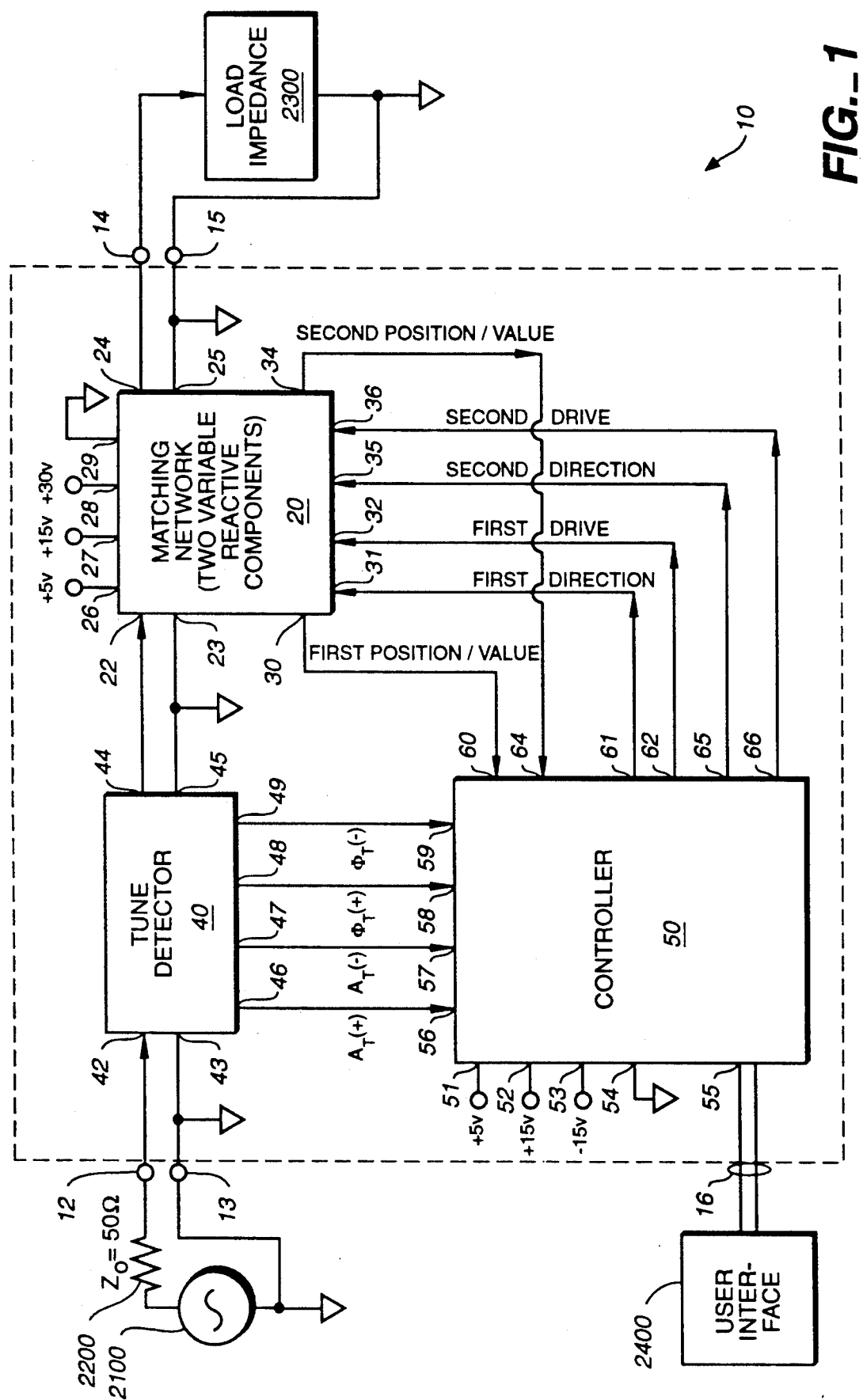
FIG._1

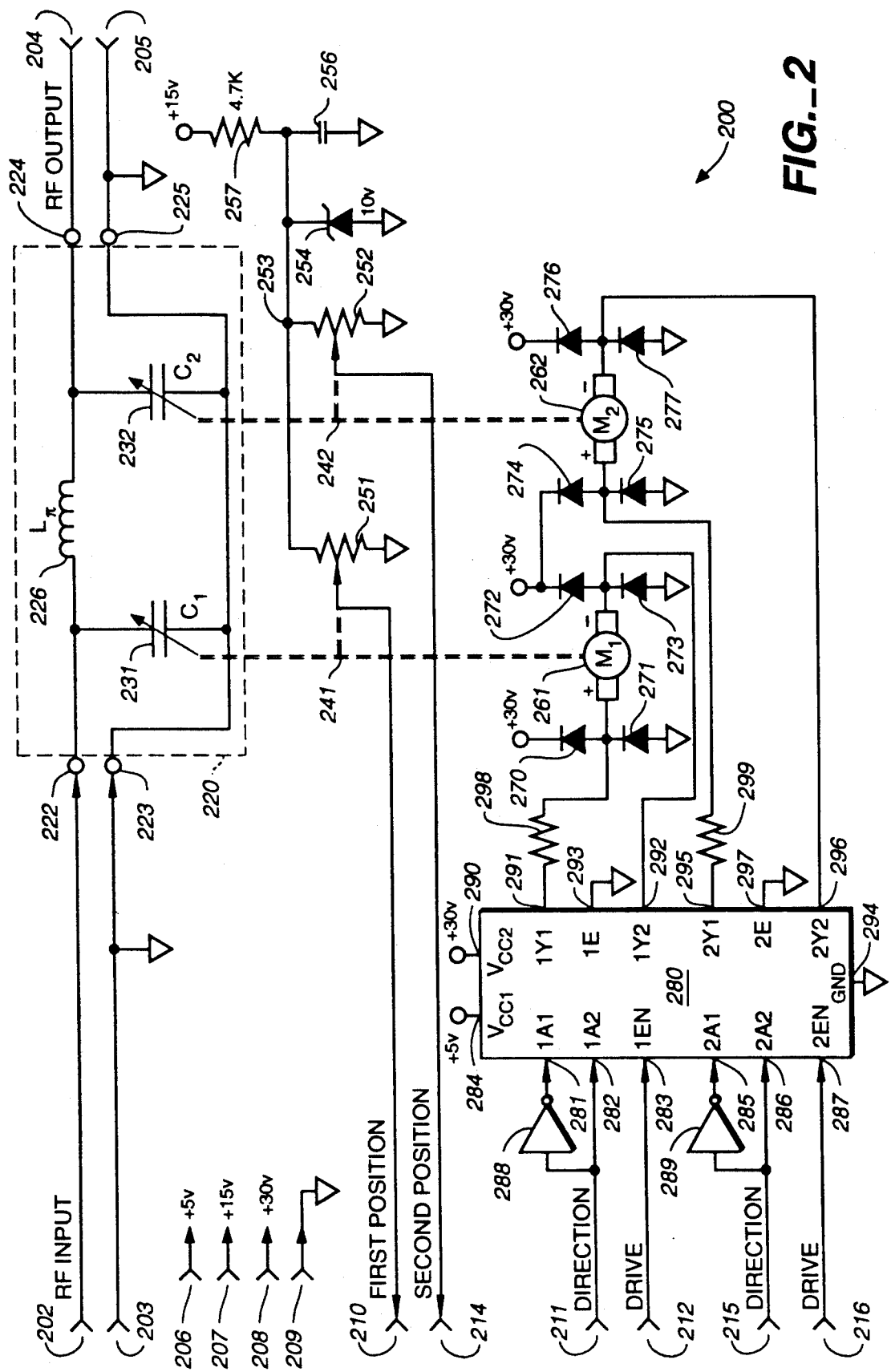
FIG._2

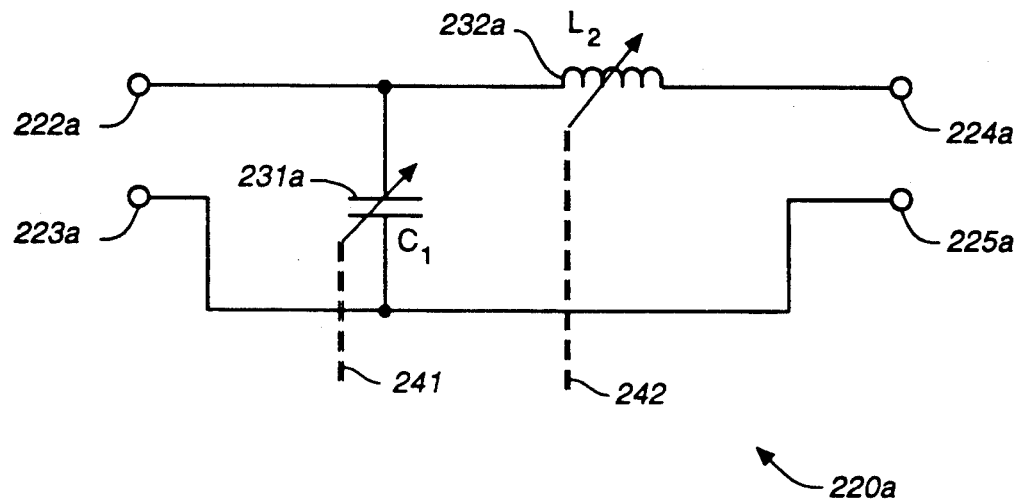
FIG._2A
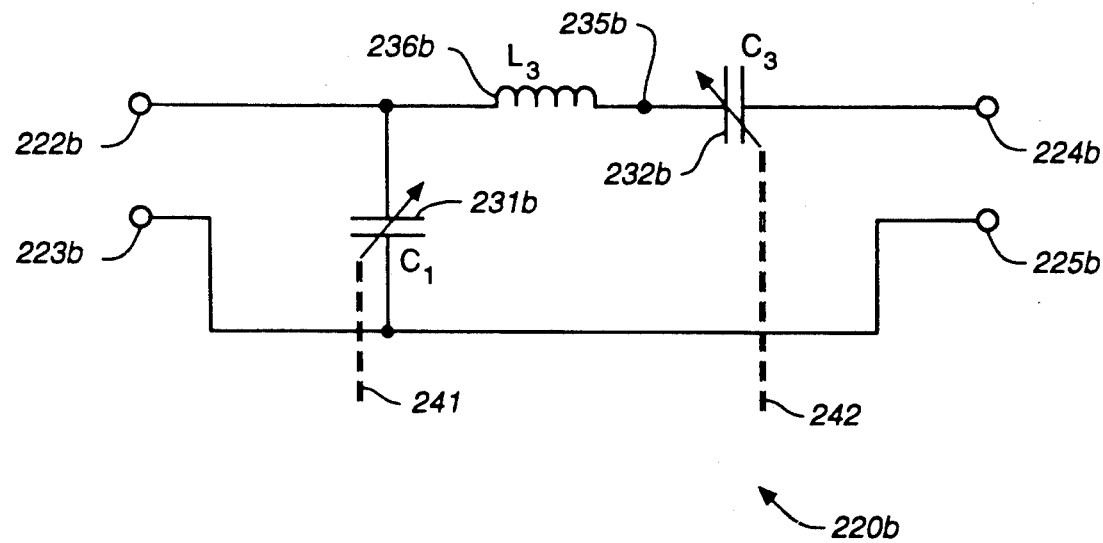
FIG._2B

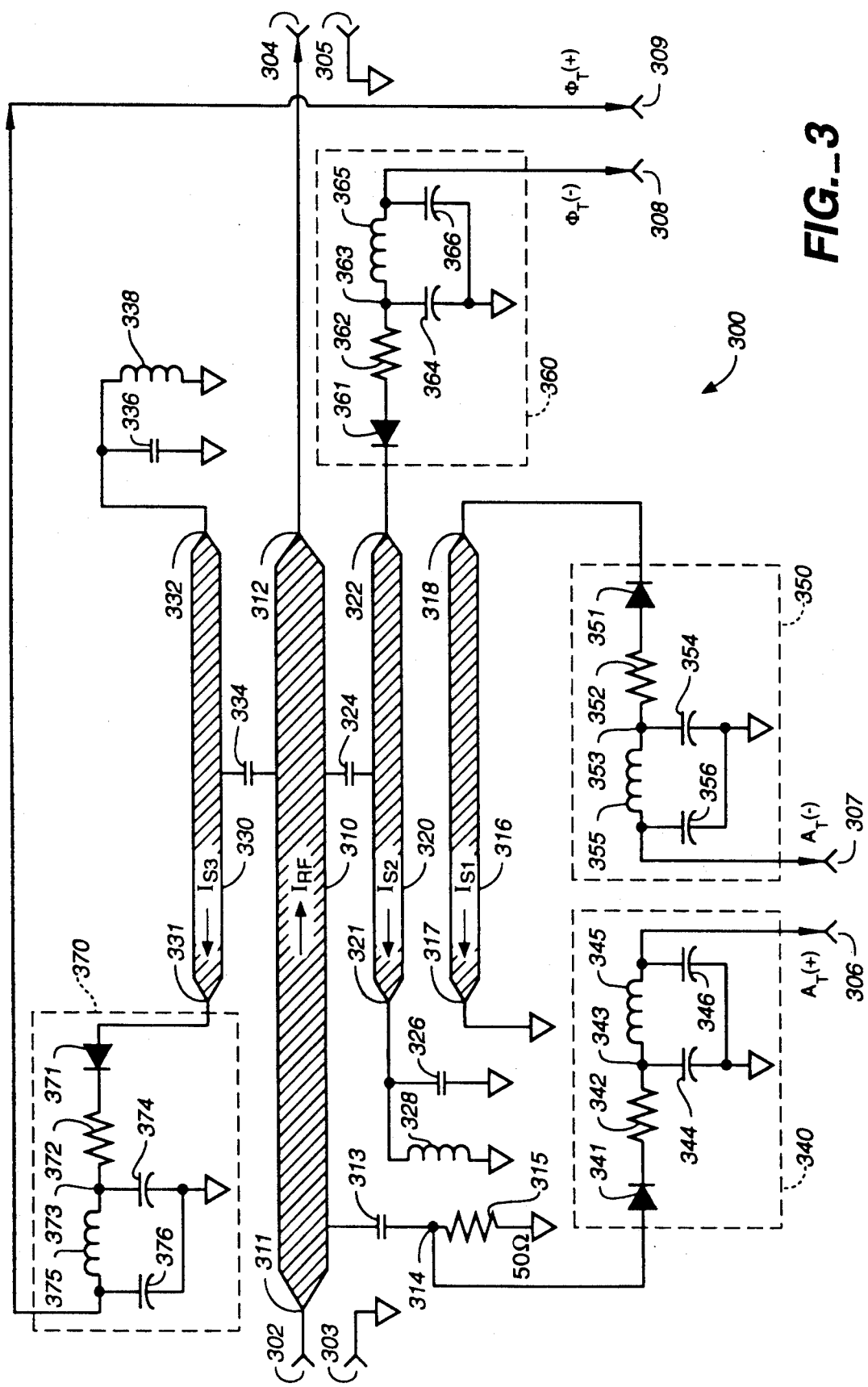
FIG._3

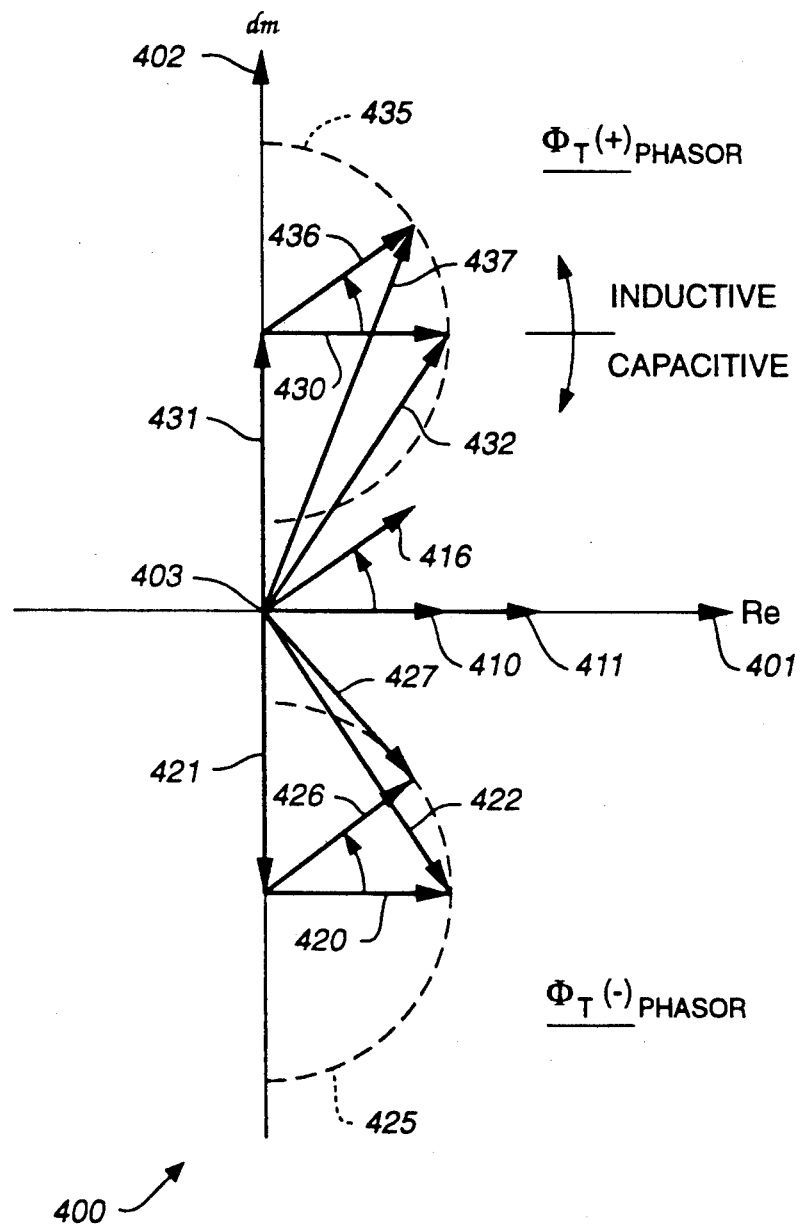
FIG._4

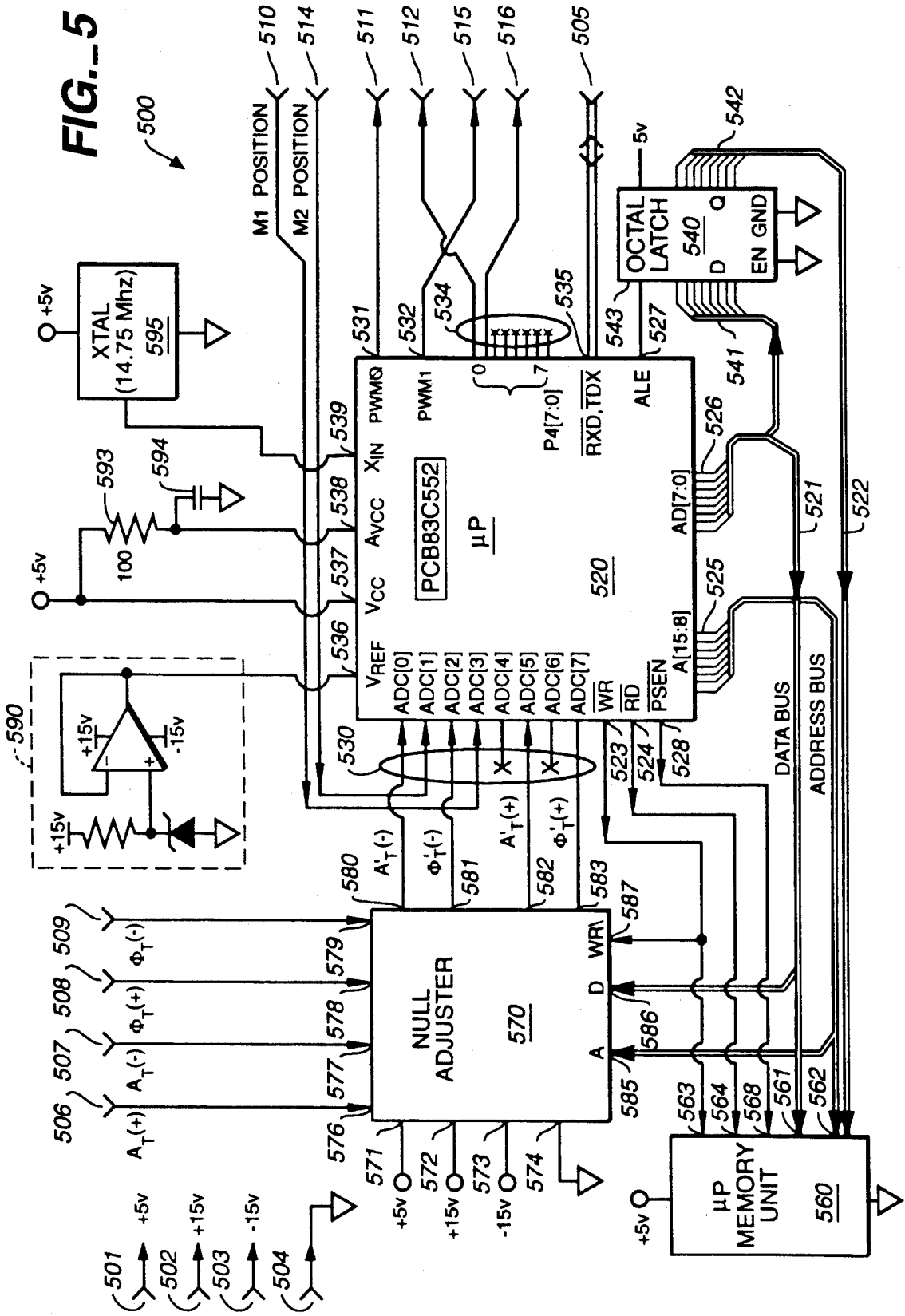
FIG._5

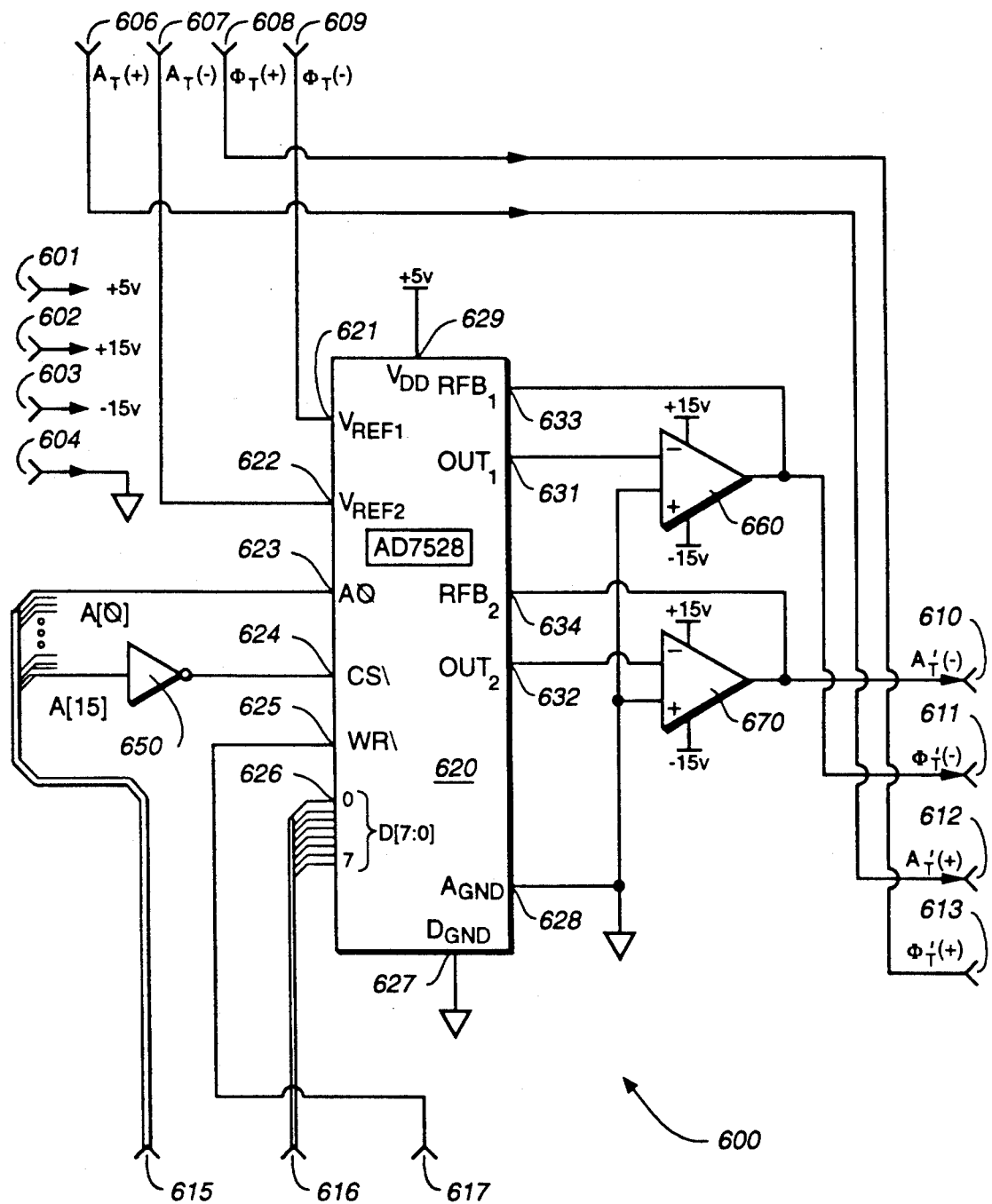
FIG._6

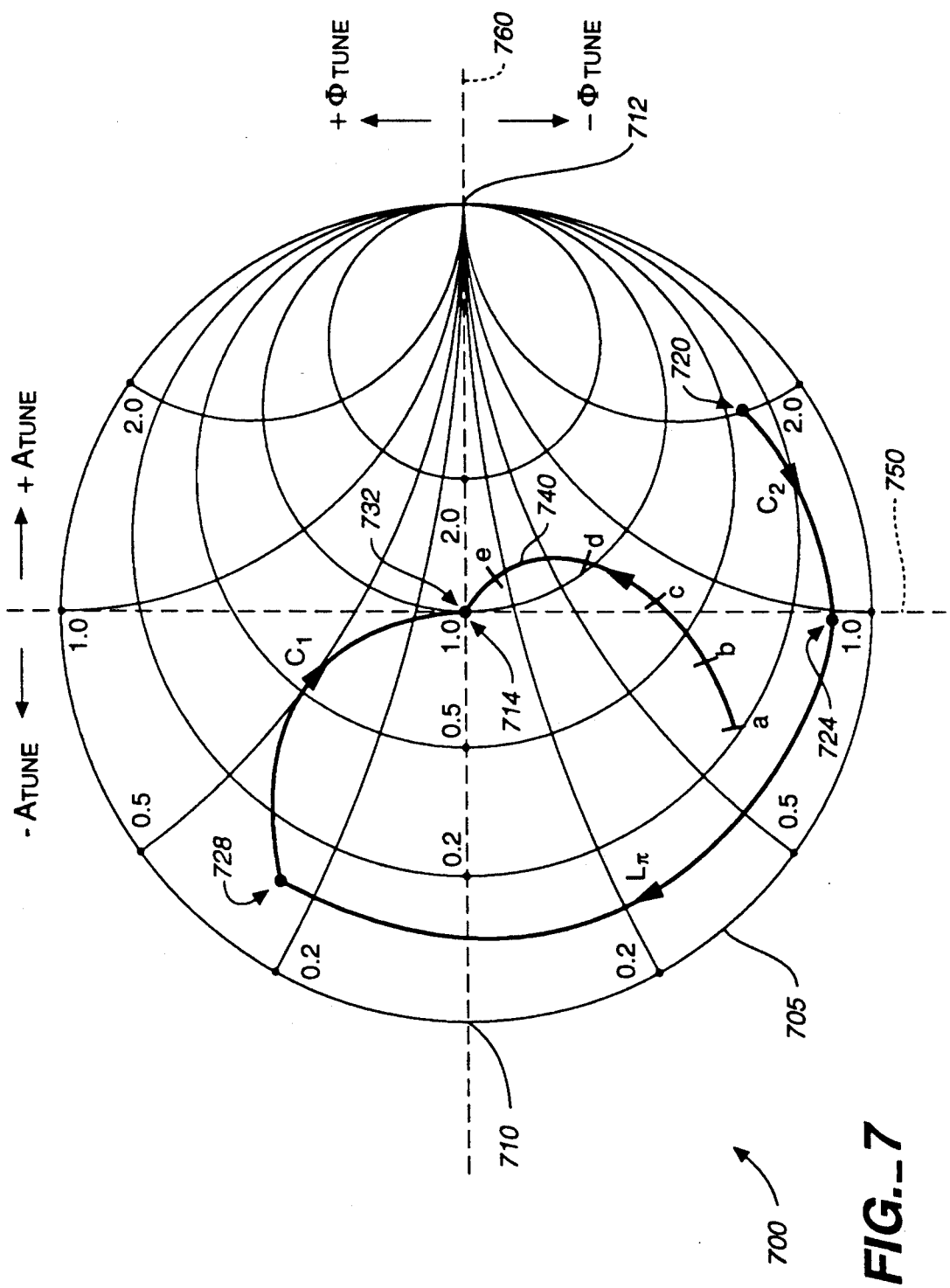
FIG._7

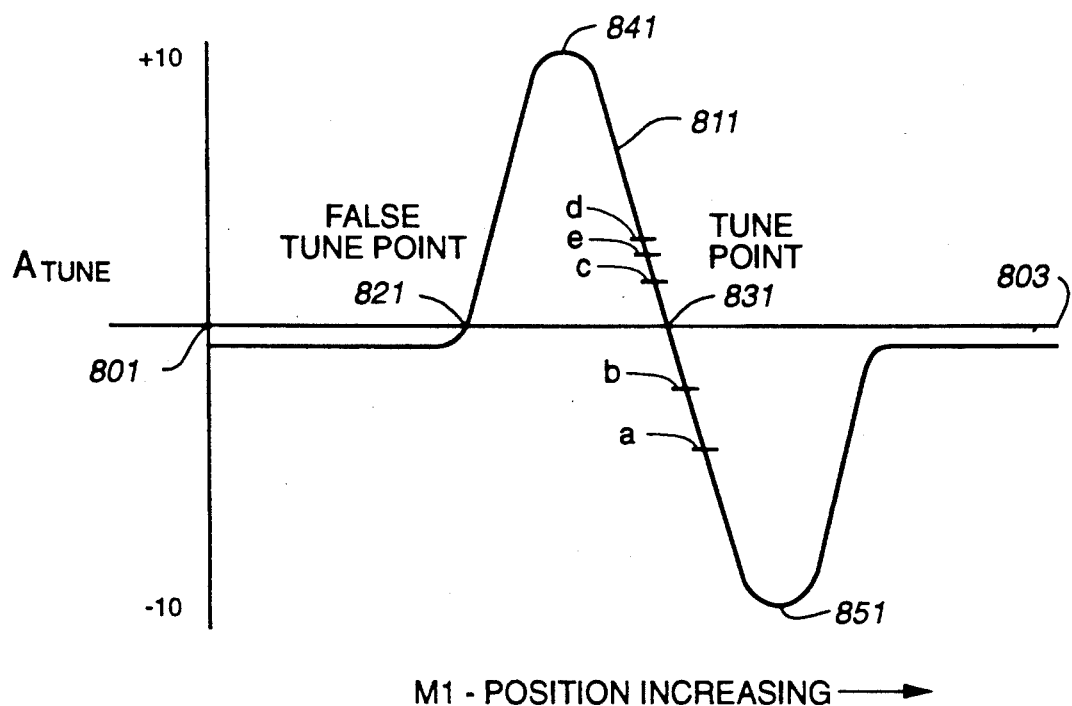
FIG._8A
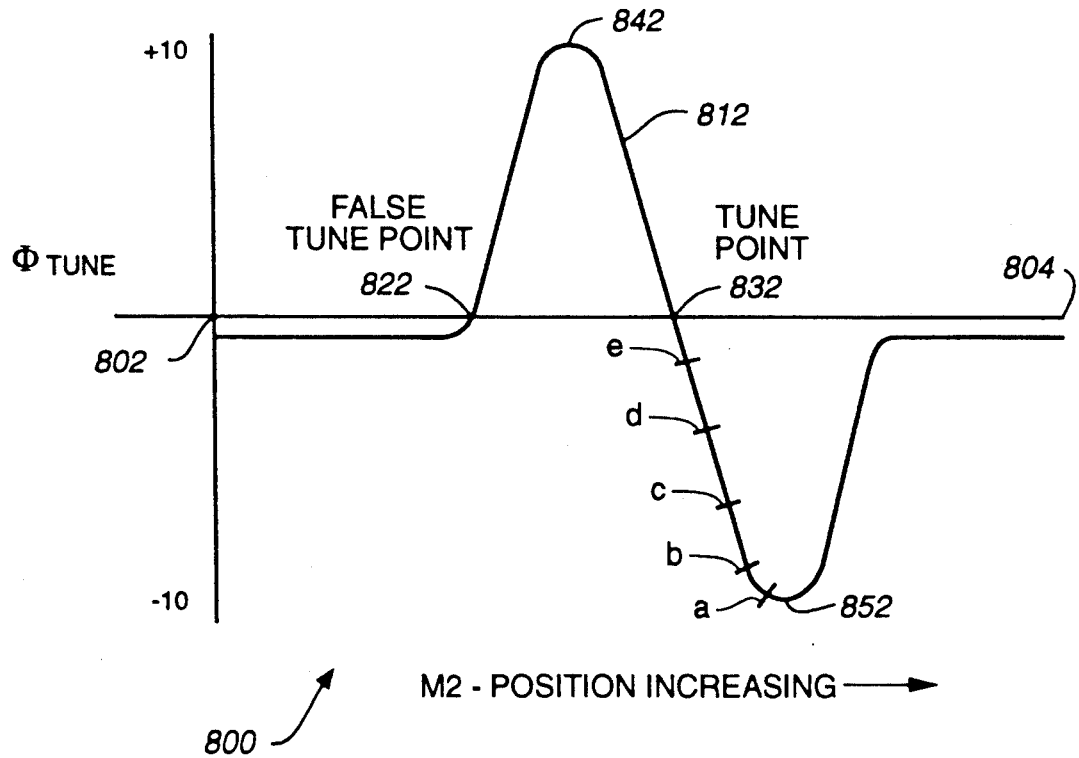
FIG._8B

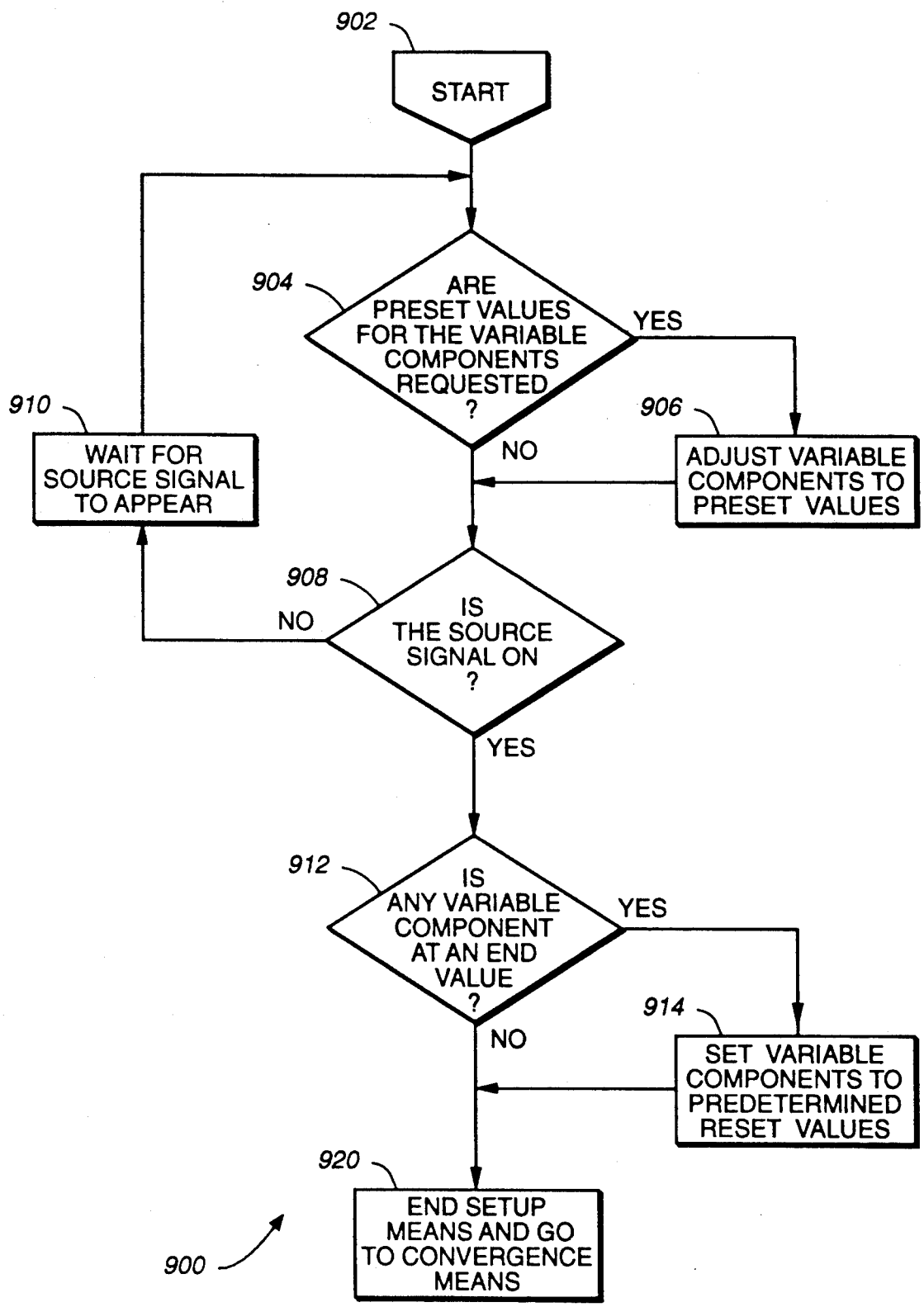
FIG._9

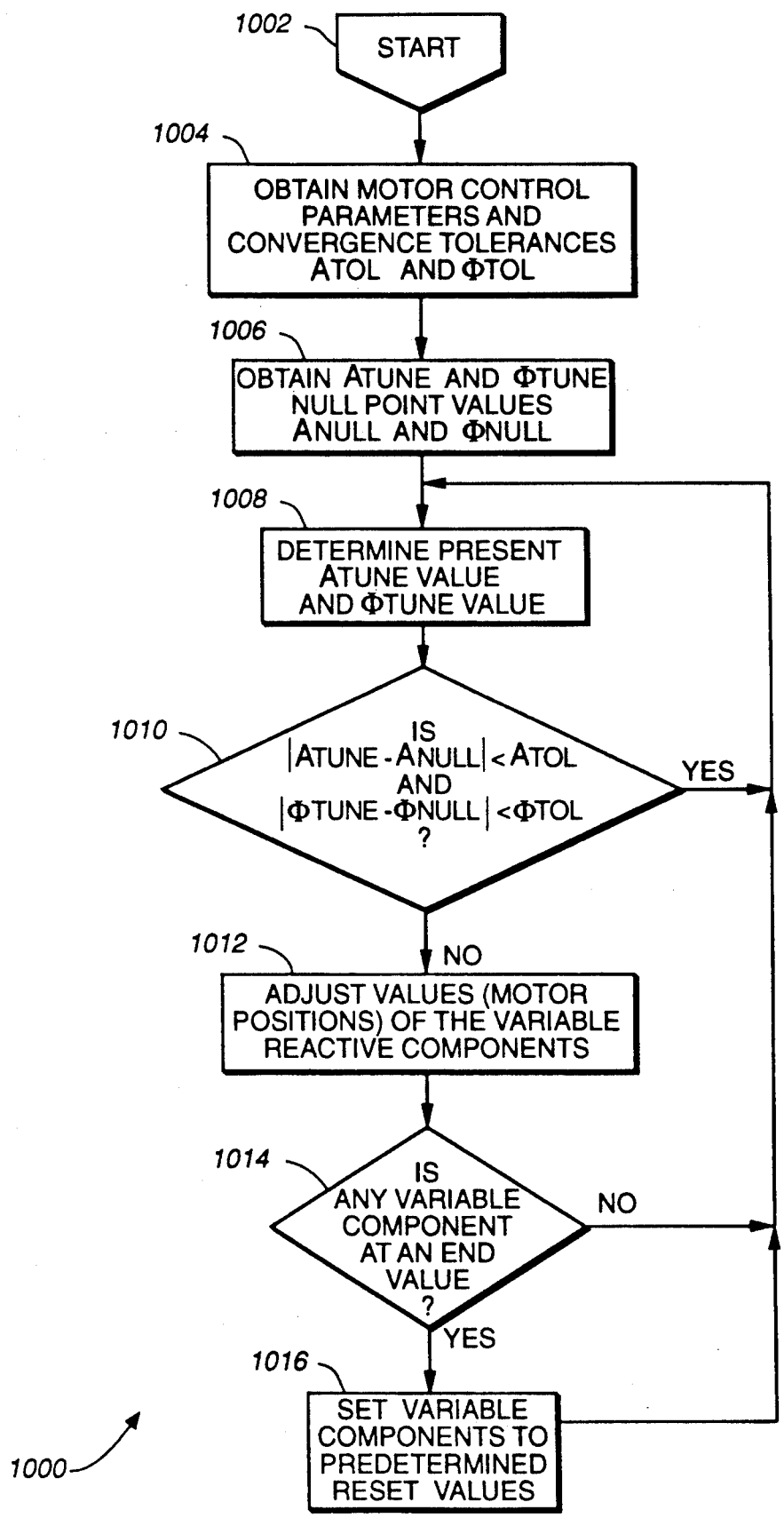
FIG._10

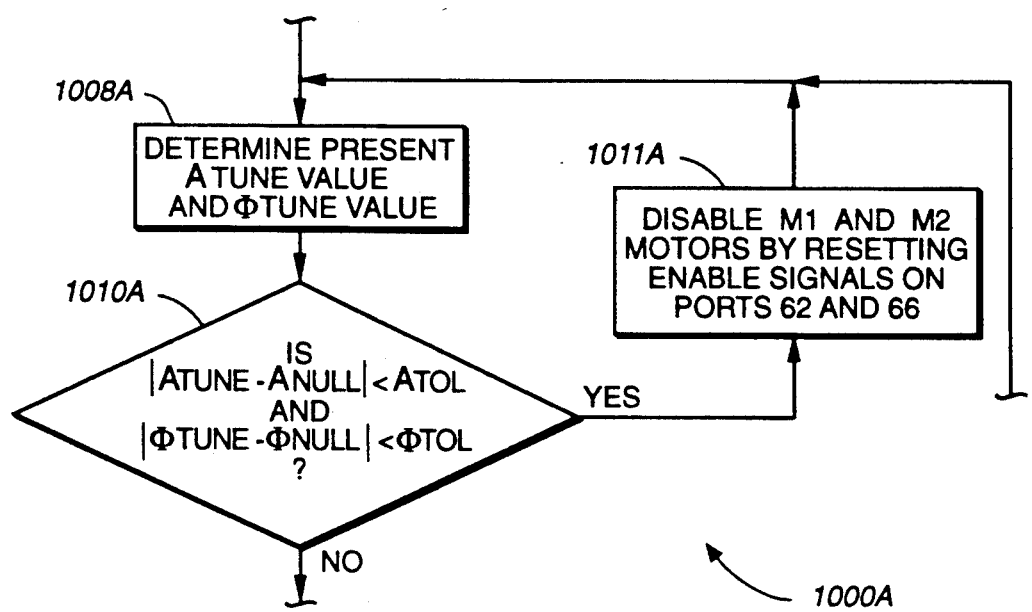
FIG._10A
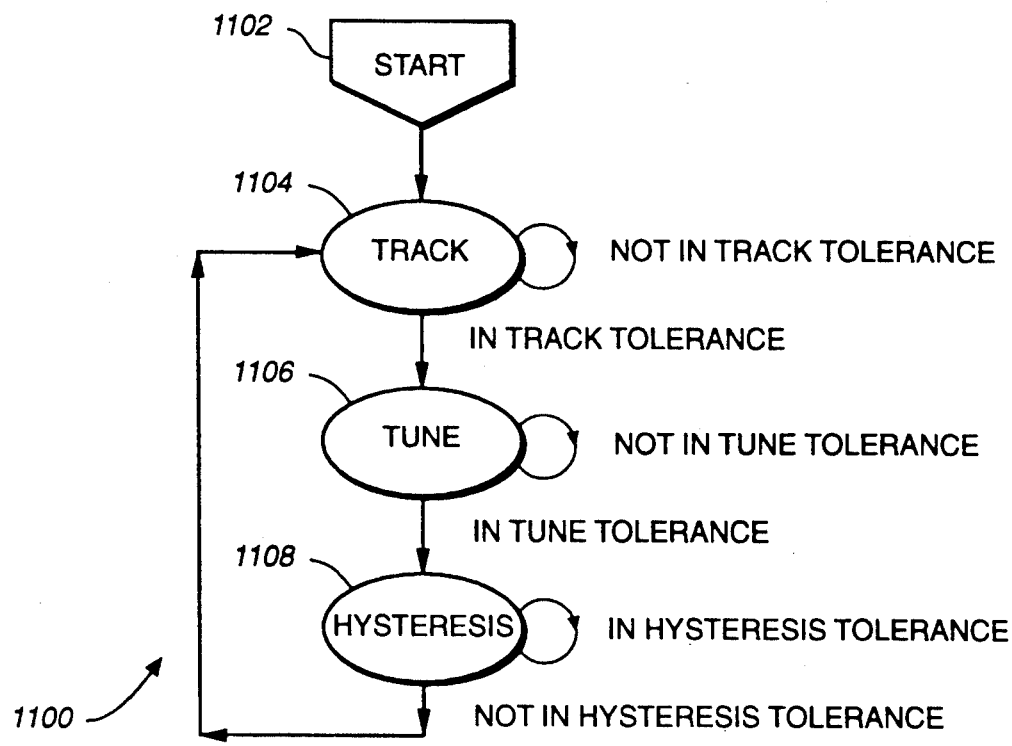
FIG._11

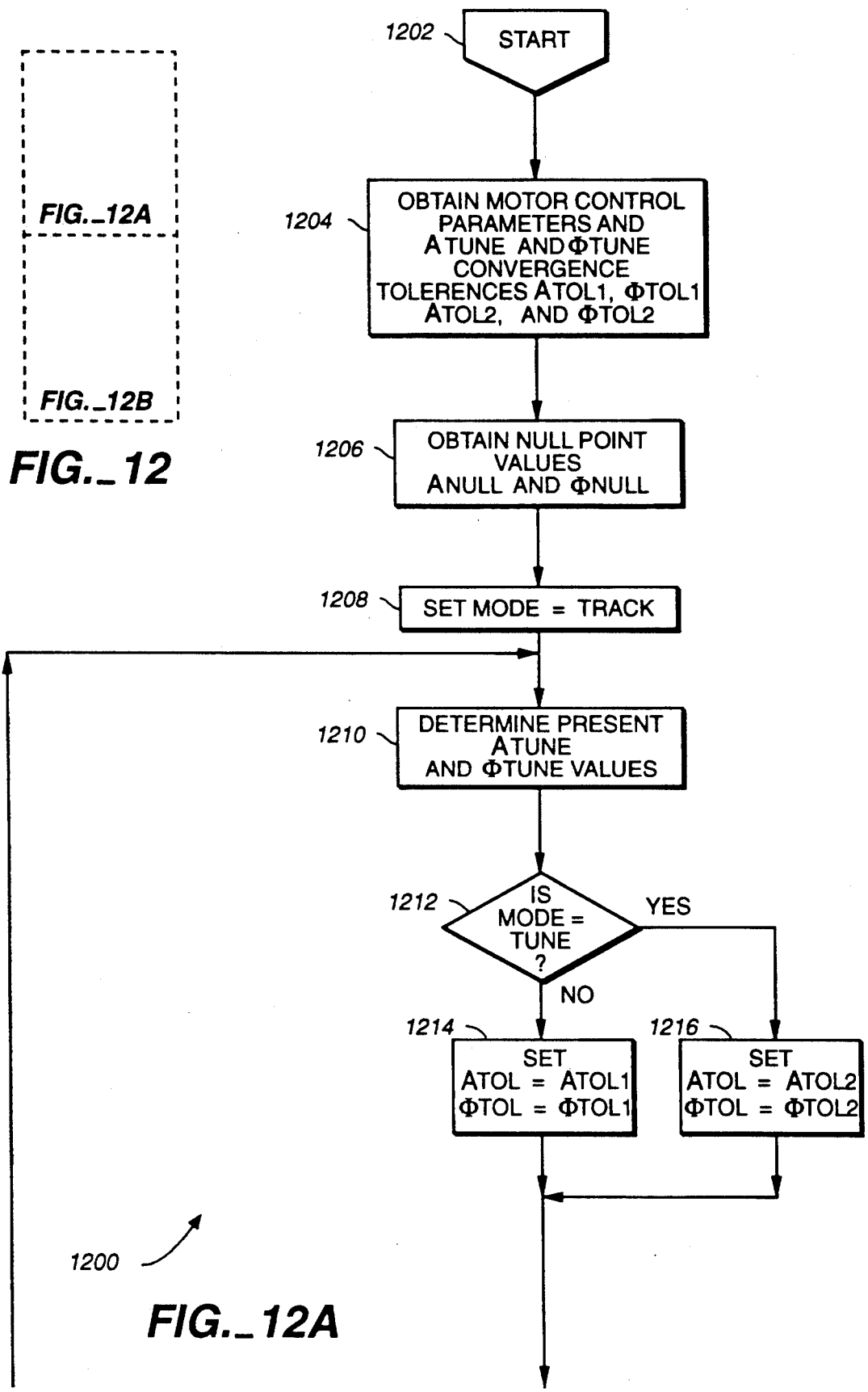

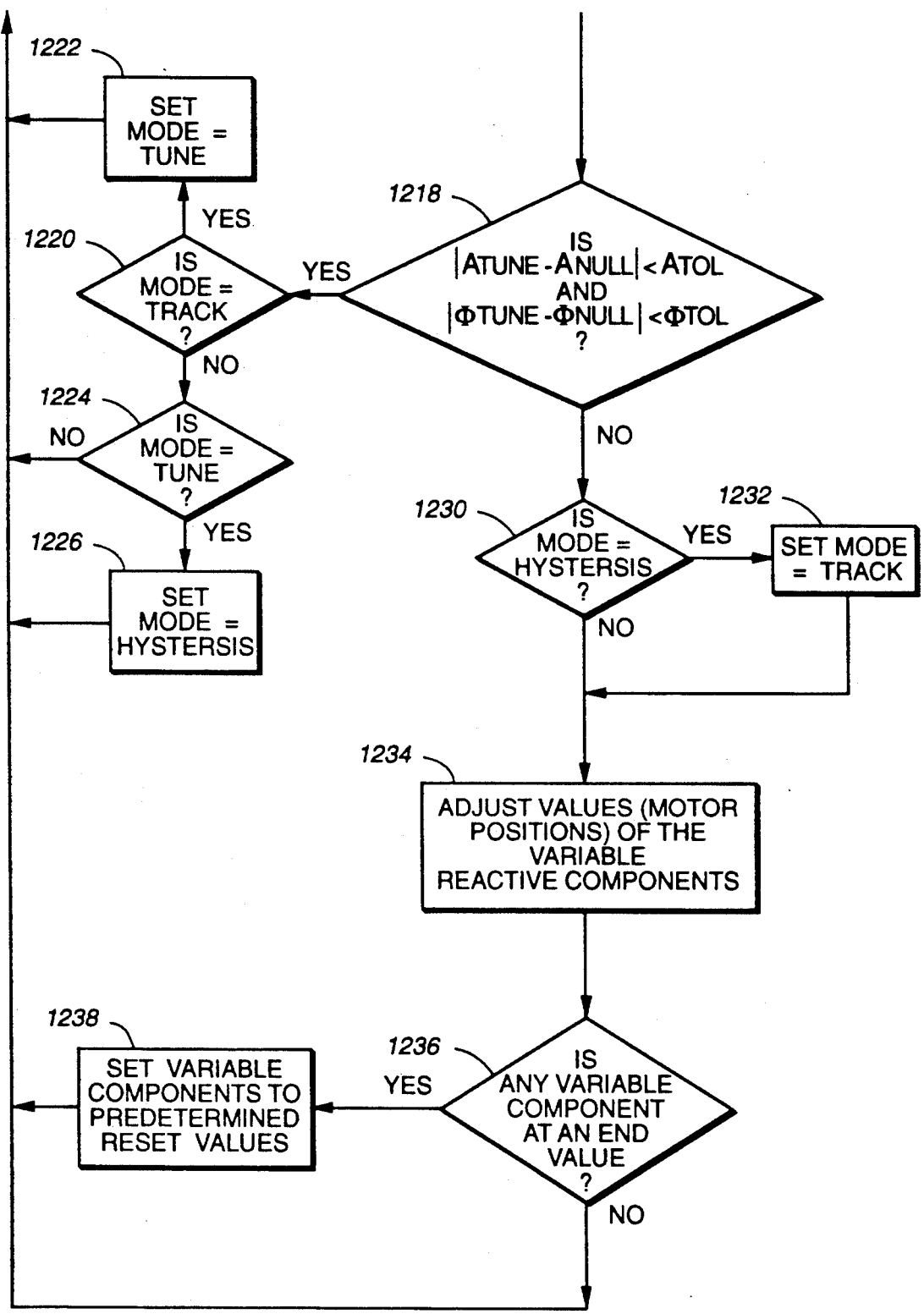
FIG._12B

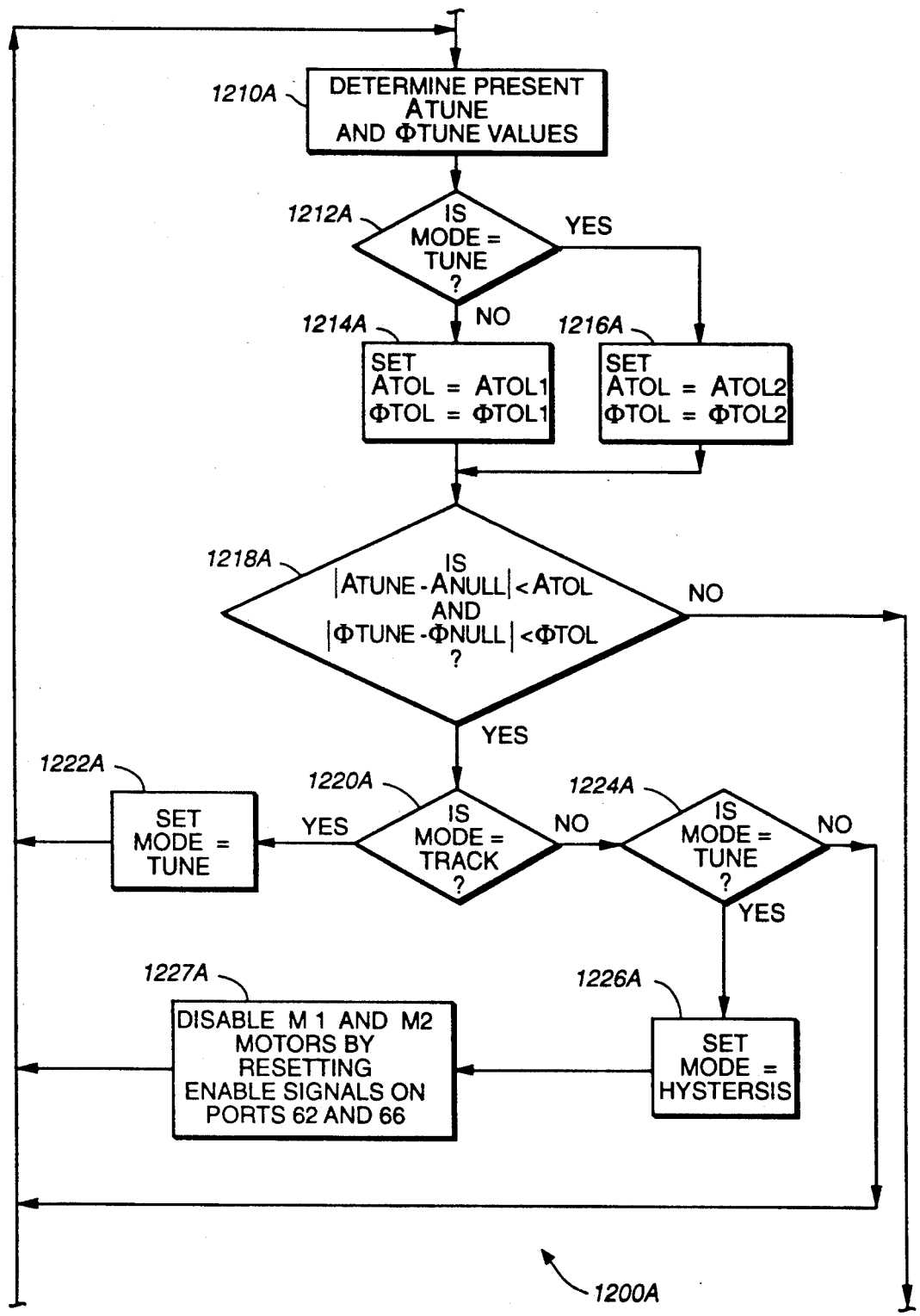
FIG._12C

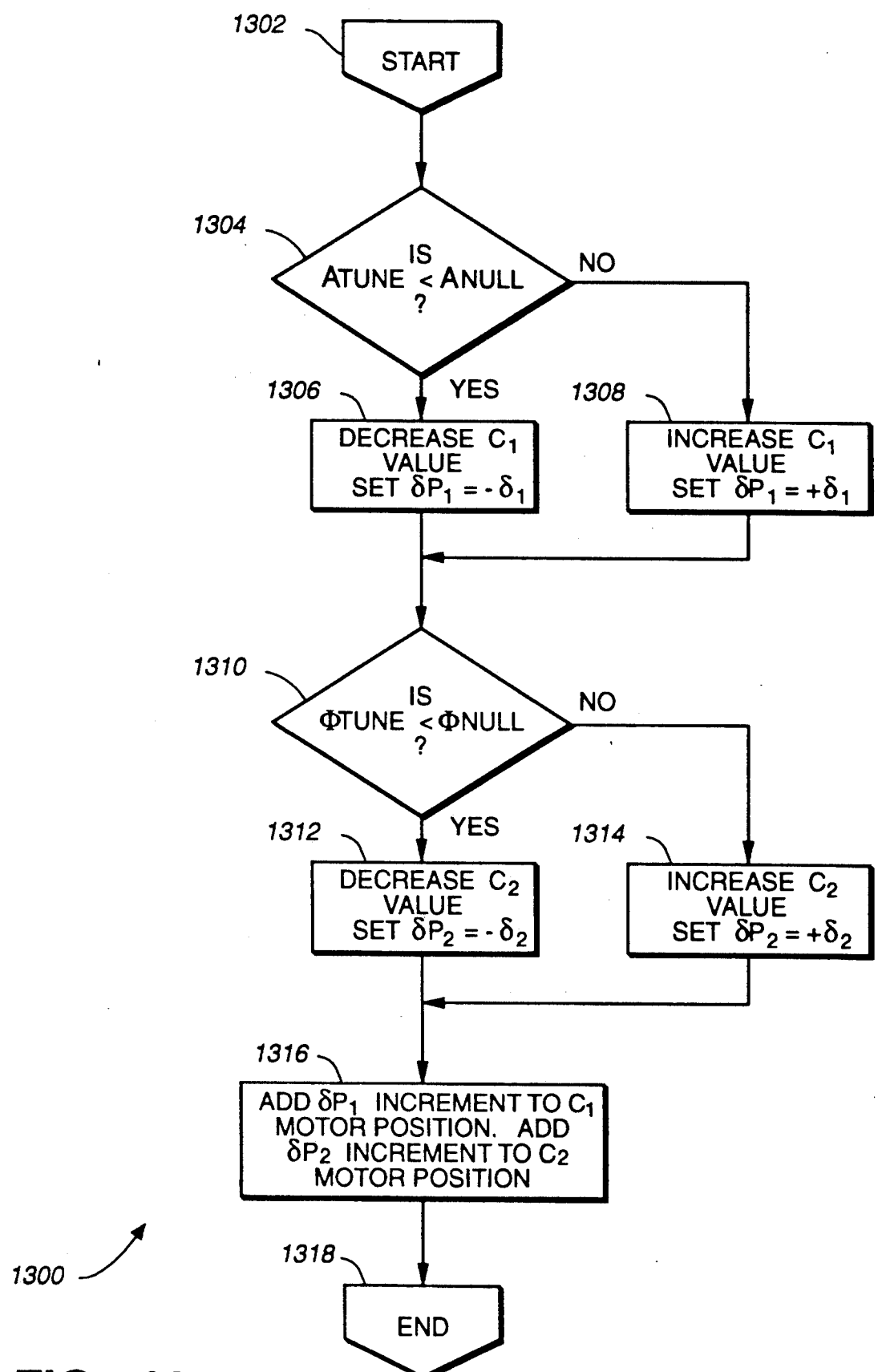
FIG._13

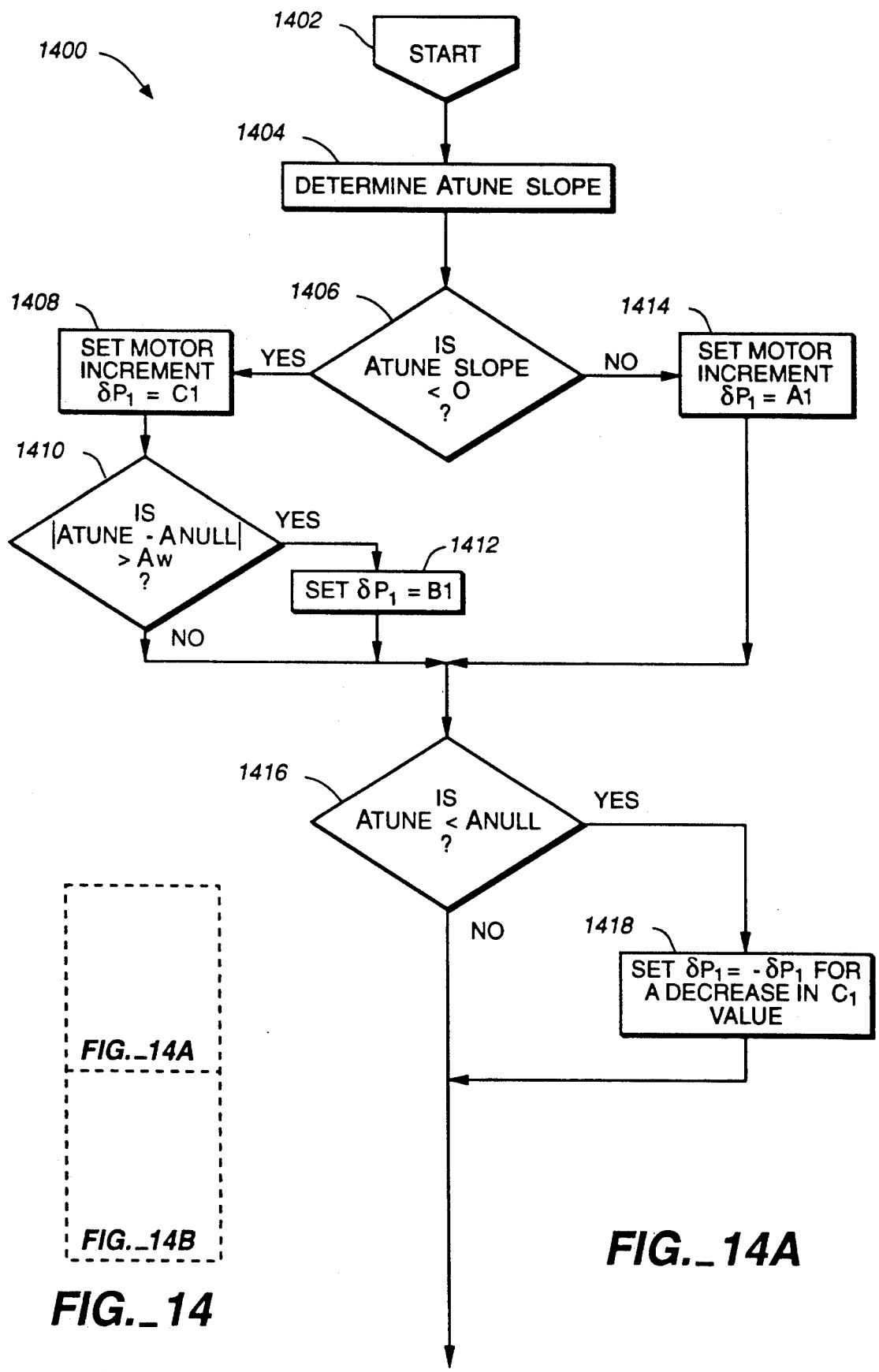
FIG._14A
FIG._14

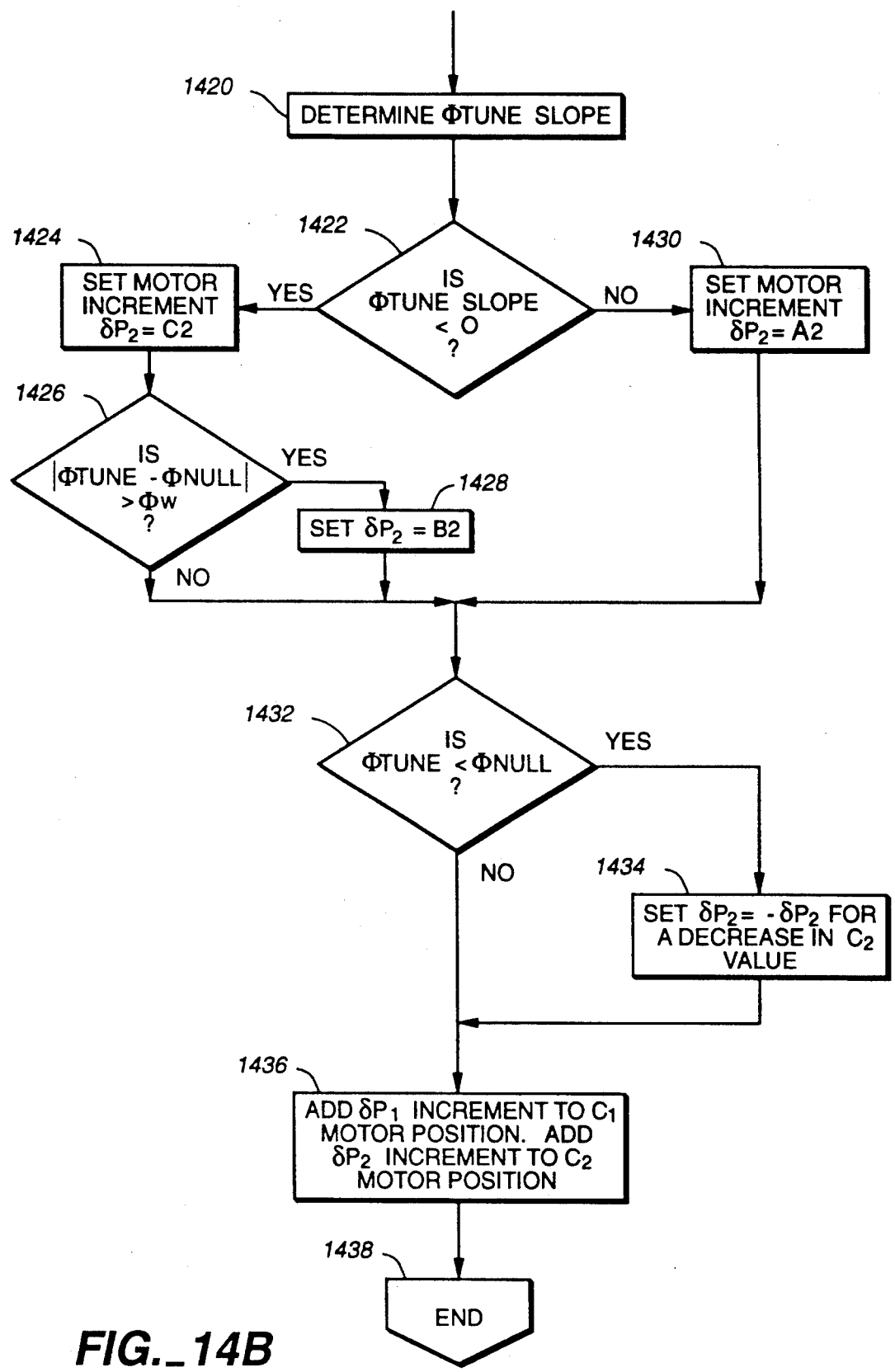
*FIG._14B*

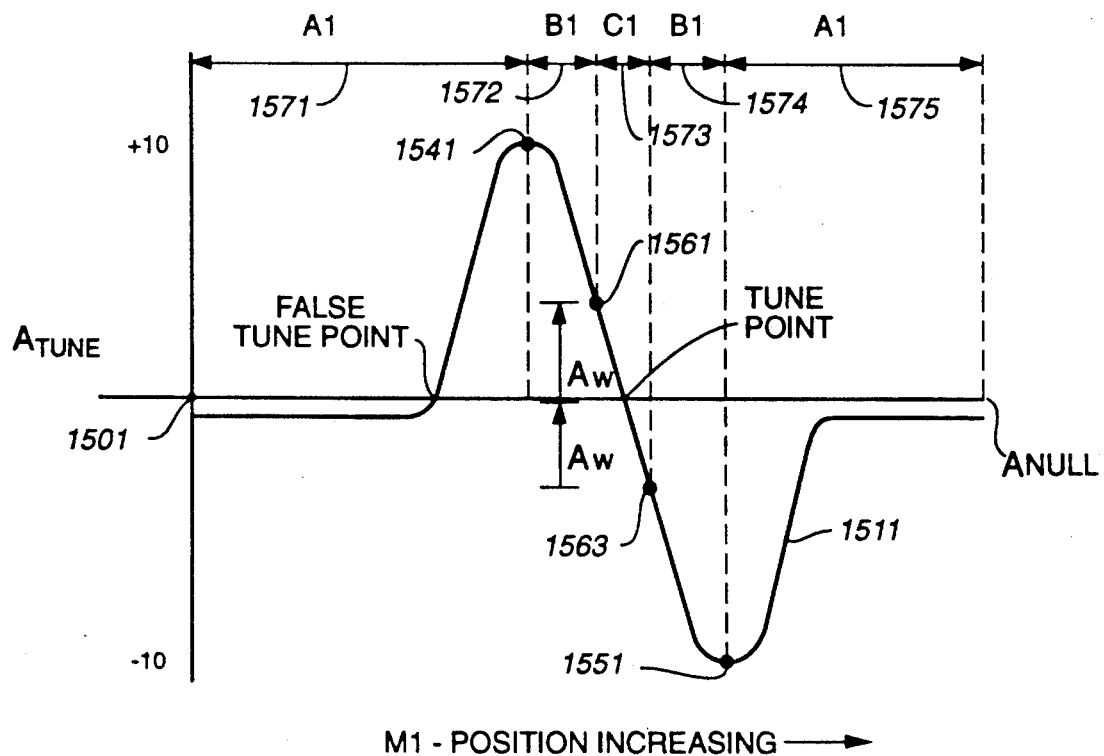
FIG._15A
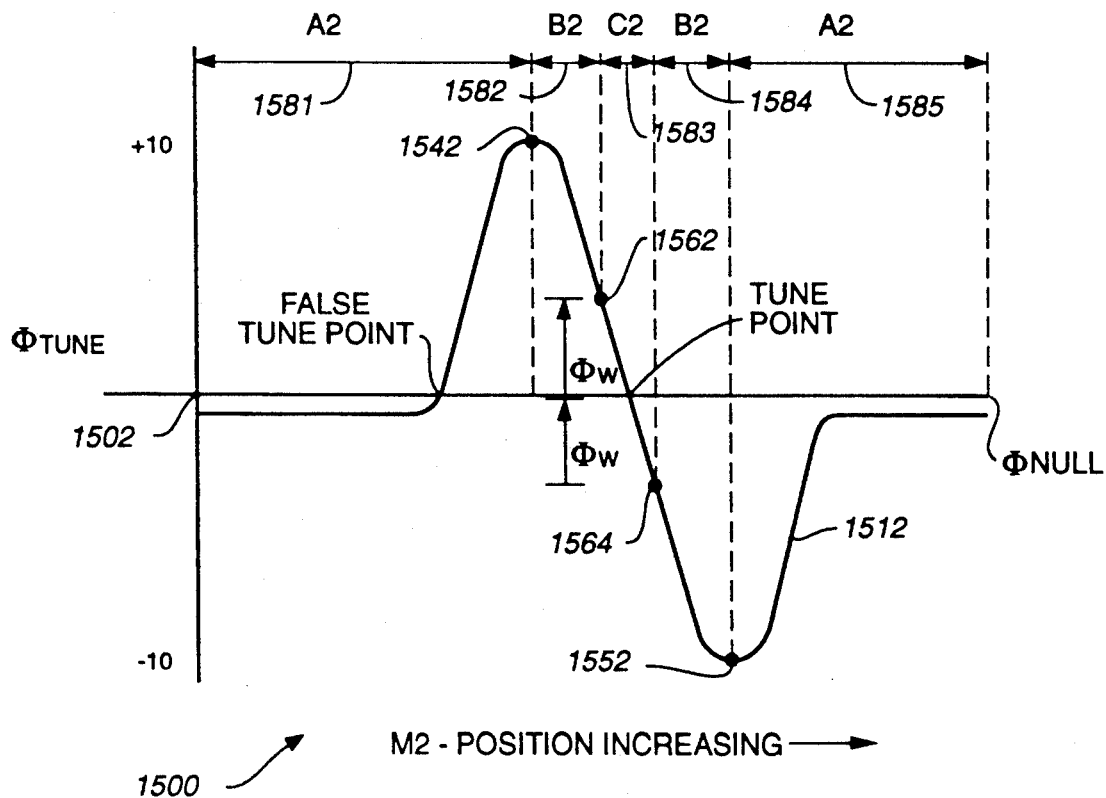
FIG._15B

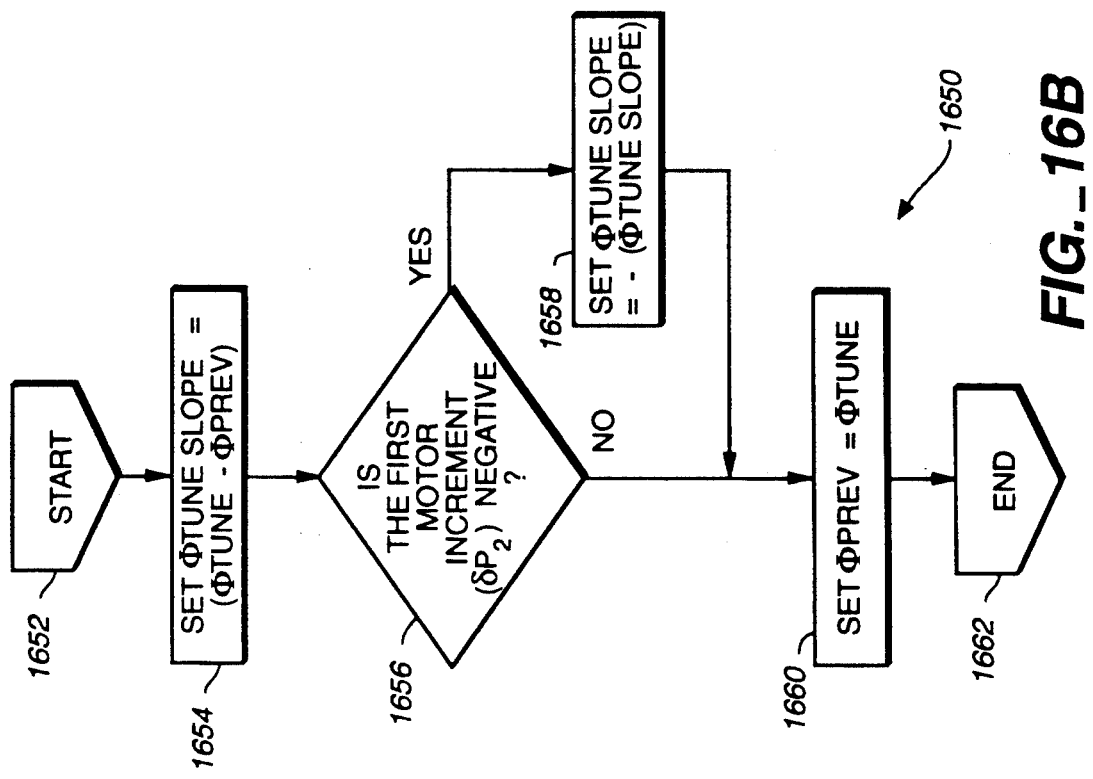
FIG._16B
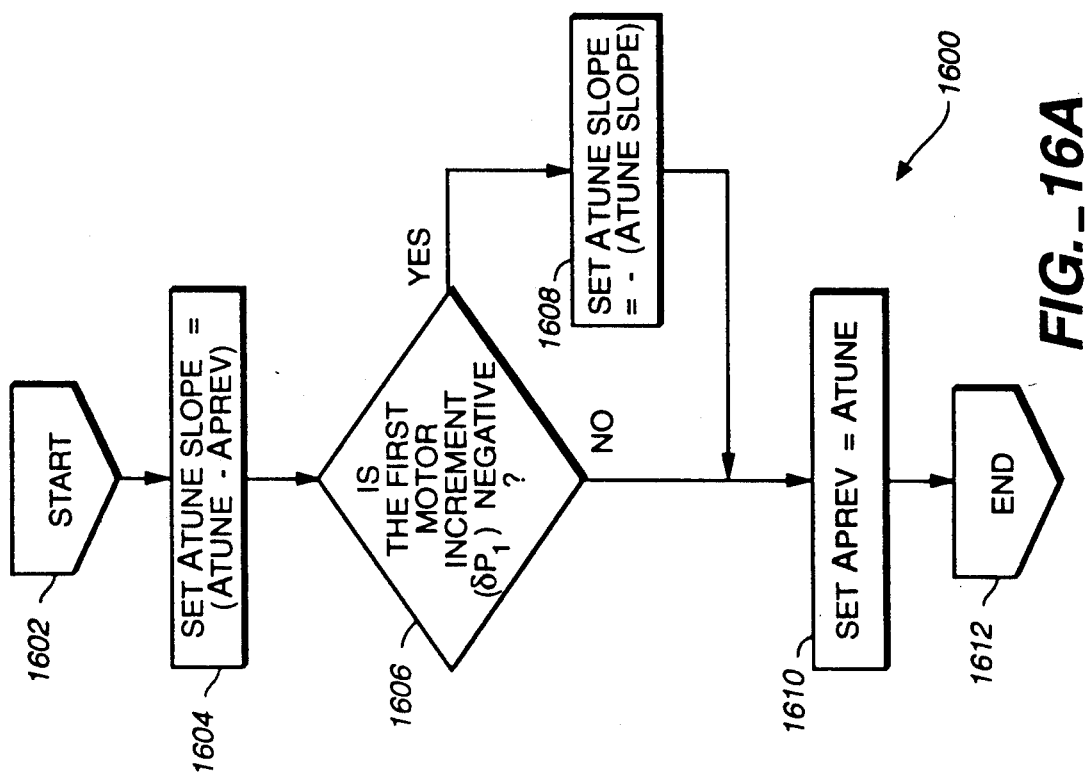
FIG._16A

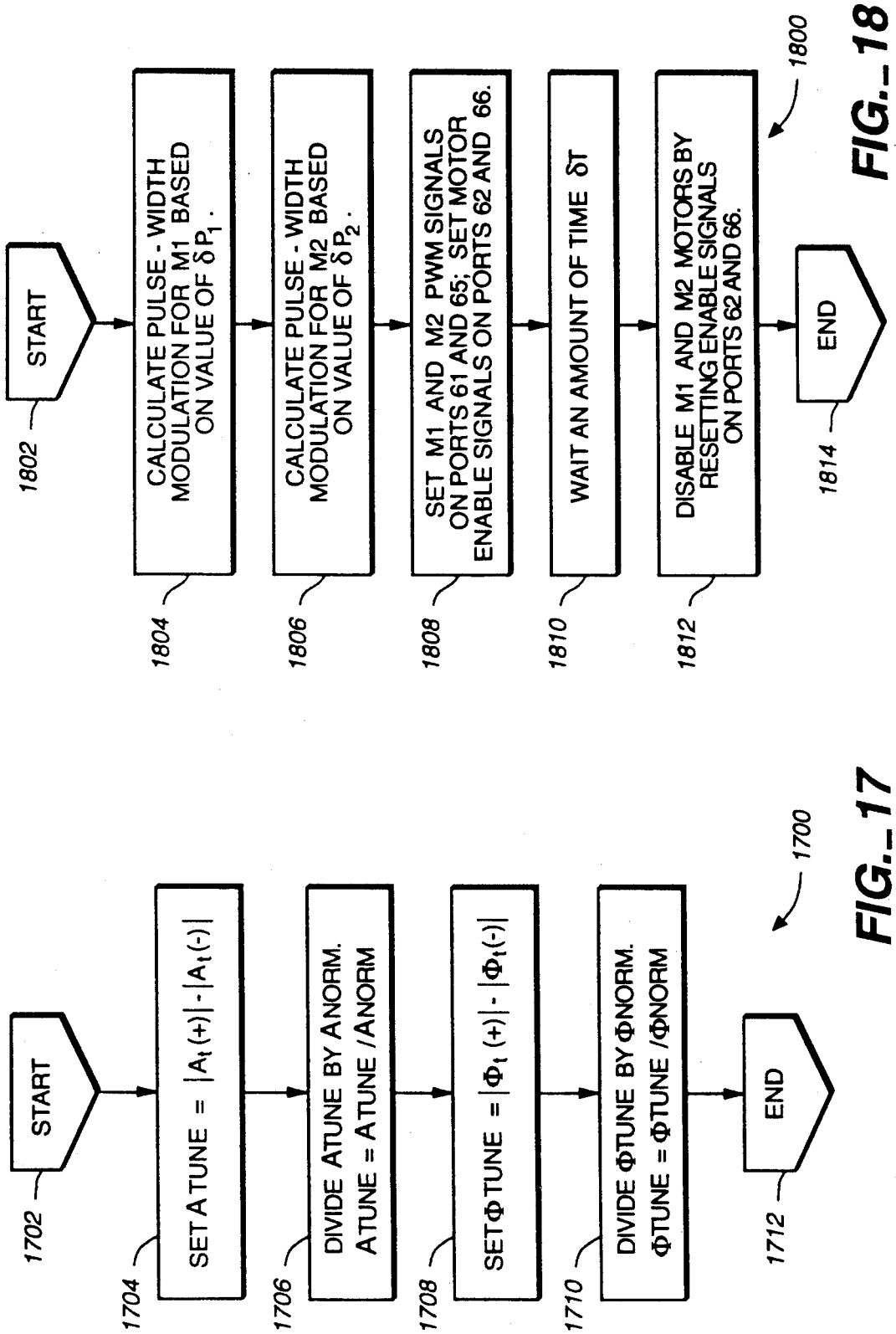

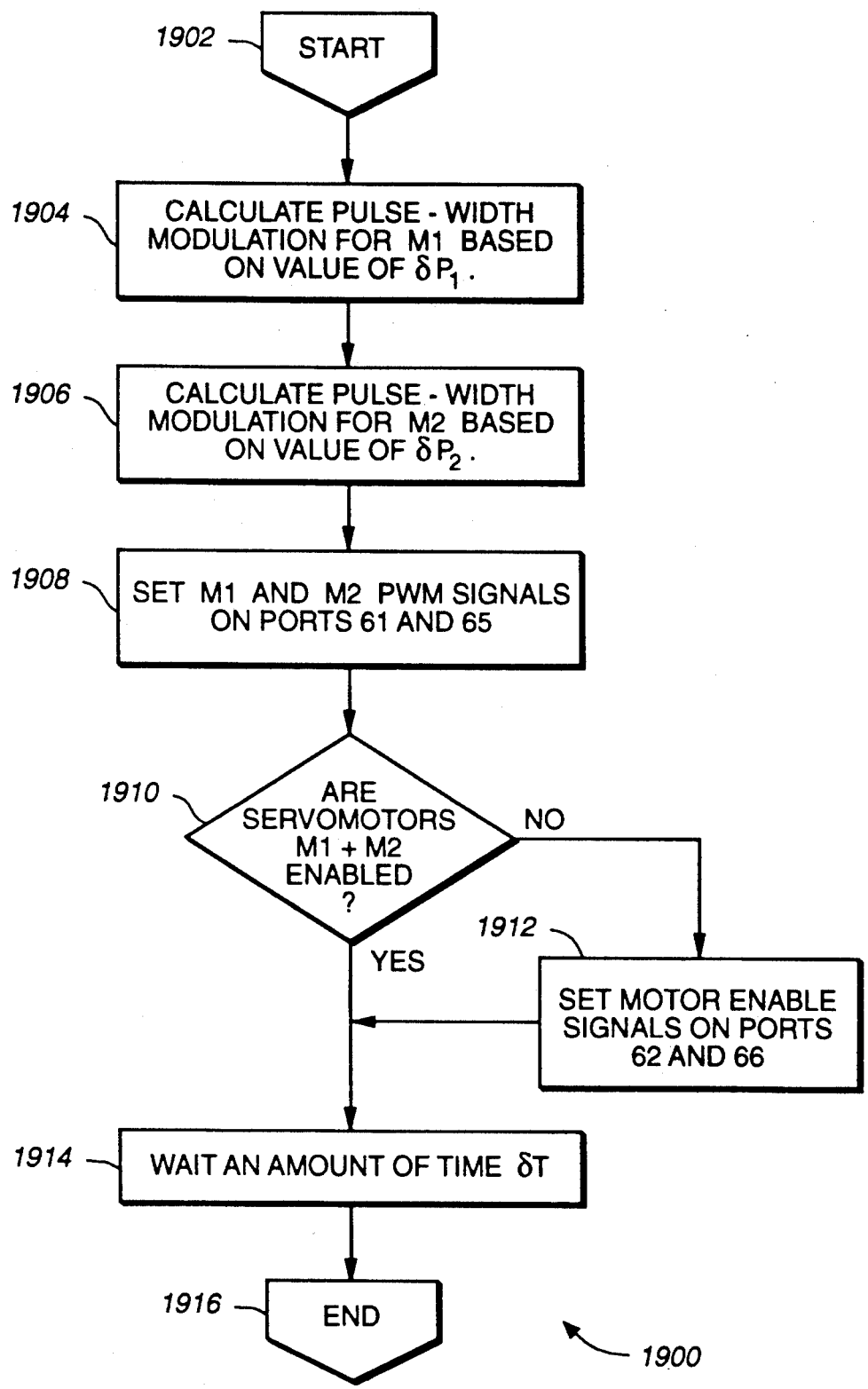
FIG._19

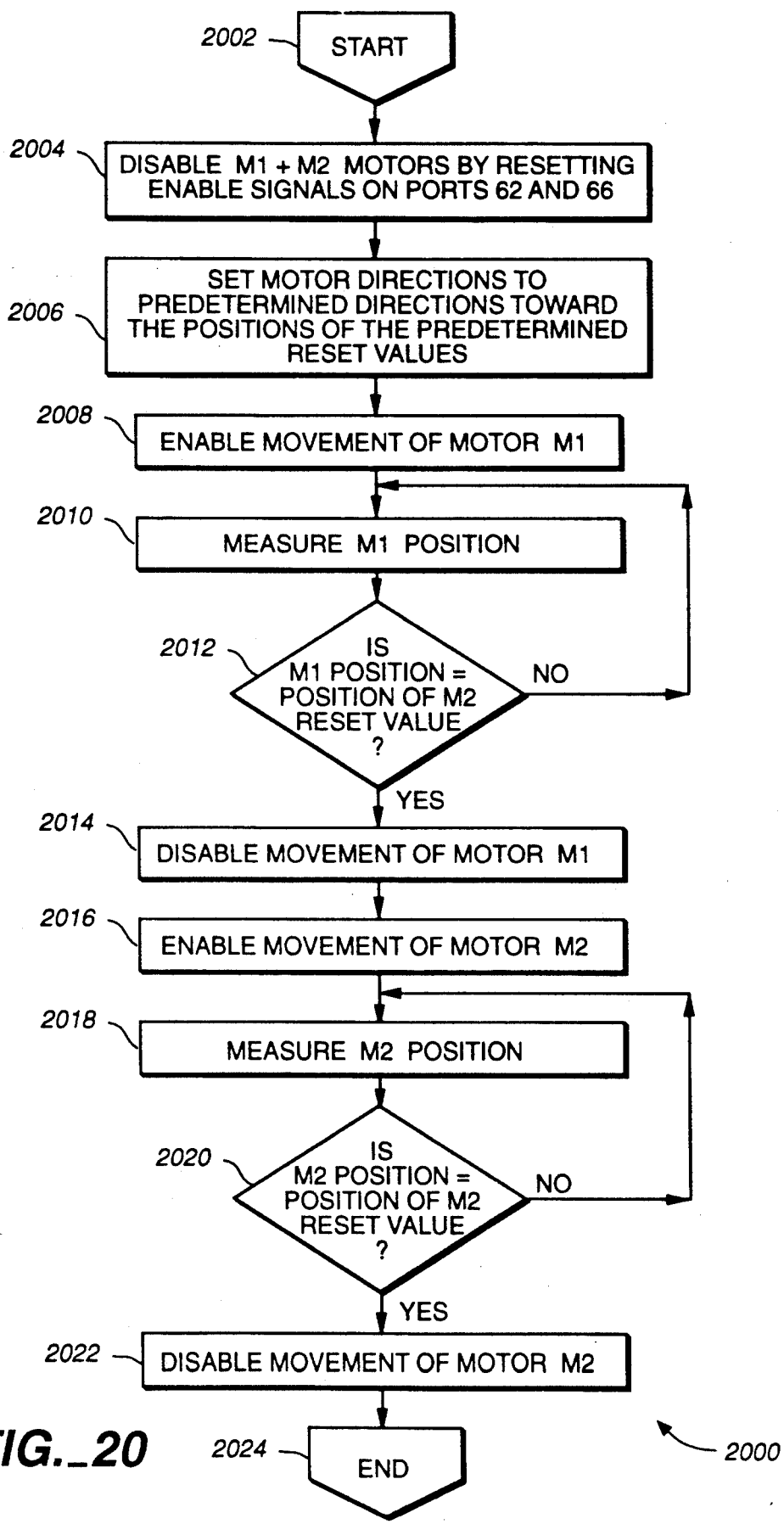
FIG._20

5,195,045

AUTOMATIC IMPEDANCE MATCHING APPARATUS AND METHOD

FIELD OF THE INVENTION

The present invention relates to automatic impedance matching networks. In particular, the present invention relates to automatic impedance matching networks for gas plasma-etching applications.

BACKGROUND OF THE INVENTION

Gas plasma etching devices are commonly used in the semiconductor fabrication and thin film industries to etch selected patterns on semiconductor wafer surfaces. Plasma etching devices generally comprise two large parallel plate electrodes contained within an evacuated chamber. The chamber is filled with a small amount of etching gases, usually chlorine and fluorine based compounds such as $CF_4$ and $CF_6$, and the wafer to be etched is placed on the lower electrode. A radio-frequency (RF) signal provided from a high-power signal generator is then applied between the parallel-plate electrodes to effect the etching of the wafer, as is well known to the etching art. Due to the high-power level of the RF signal, the Federal Communications Commission (FCC) has assigned a standard frequency value of 13.56 Megahertz (Mhz) for the signal generator so as to not interfere with other communication systems.

The etching rate of the plasma system and consistency of the final etched pattern depend heavily upon the efficient and consistent coupling of RF power from the signal generator to the plate electrodes of the plasma system. Efficient power coupling from the generator to the plate electrodes (the load) occurs when the load impedance of the plate electrodes has a value equal to the complex conjugate of the generator's characteristic impedance. The generator's characteristic impedance is the impedance seen looking into the output of the generator. (An impedance and its complex conjugate have the same resistance, or real part, and the same magnitude of reactance, or imaginary part. Their imaginary parts, however, have opposite signs.) High-power signal generators are generally designed to have a characteristic impedance having a resistance of 50 ohms and a reactance of zero ohms. The load impedance of the plate electrodes of the plasma system, however, is both capacitive and resistive (e.g., 5-j110 ohms) and is extremely mismatched from the impedance of the signal generator. Furthermore, the value of the load impedance changes during the etching process as the composition of the gases and the etching by-products in the chamber change.

This mismatch problem has generally been addressed in the prior art by placing a matching network in series between the signal generator and the mismatched load. The matching network usually comprises two or three reactive components, i.e., capacitors and inductors, arranged in either an L-, Pi-, or T-network. At a fixed frequency and with the proper component values, the matching network presents a 50-ohm load to the signal generator and a conjugate matched impedance to the load, i.e., the plate electrodes. As such, the matching network transfers substantially all of the power from the generator to the load. Little power is dissipated in the matching network since the matching network uses only reactive components.

As the load impedance varies, the values of the network's components must be changed to maintain the conjugate matches presented to the generator and load by the network. This process is often referred to as tuning the network or referred to as finding the tune point. In the above described matching networks, where they include three components, two of the components usually have variable values while the third has a fixed value. A servomotor is generally used to precisely position the mechanical control element of the variable component. Variable capacitors are generally selected as the variable-value components because they are easier to construct, are more mechanically reliable, and dissipate less power than variable inductors.

To guide in the adjustment of the variable components, a tune detector is generally placed in series between the signal generator and the matching network. It generally comprises a 50-ohm transmission line, which couples power through the detector without affecting the impedance matching process, and a plurality of sampling couplers. The samplers monitor the magnitude and phase relationships between the current and voltage in the 50-ohm transmission line. Under a tuned condition, the current and voltage waveforms are substantially in phase and the ratio of their amplitudes is substantially equal to 50 ohms. In general, the tune detector provides a signal indicative of the current-voltage phase relationship and a signal indicative of the amplitude-ratio relationship between the current and voltage waveforms. These signals are designed to each be near or at zero under a tuned condition. In some cases, the tune detector provides the phase and amplitude signals in the form of four or more basic signals which must be mathematically combined to provide the phase and amplitude signals. For example, see U.S. Pat. No. 4,679,007 issued to Reese, et al.

The automatic matching networks in the prior art generally include a controller of varying sophistication to interpret the phase and amplitude signals from the tune detector and to adjust the values of the variable components of the network. Most of these controllers comprise analog components (e.g., op-amp based comparators, summers, etc.) which implement two control loops, each loop for controlling one of the variable components in the network. The first control loop measures the amplitude signal and adjusts a first one of the variable components and the second control loop measures the phase signal and adjusts the second variable component. To adjust its corresponding variable component, each control loop measures the magnitude and sign of its corresponding signal (e.g., phase or amplitude) and adjusts the variable component so as to force the signal to zero, indicating a tuned 1 condition. In these systems, the sign of the corresponding signal determines whether to increase or decrease the value of the corresponding variable component.

Unfortunately, the prior art controllers suffer from a number of problems which impact the precision, responsiveness, and repeatability of the match between the high-power signal generator and the parallel plate electrode load. First, these controllers have a so-called "dead-band" designed into the control loop to ensure that the control loops do not "jitter" around the tune point. The jittering reduces the accuracy of the match, as the variable components are constantly changing, and it also wears out the motor drives used to mechanically adjust the variable components. The dead-band prevents unnecessary jittering but, unfortunately, causes a region of uncertainty around the tune point that is proportional to the size of the dead-band and, hence, reduces the precision of the tuning process.

A second problem arises in the prior art controllers in that the rate of change in the variable components (i.e., the rate of motor movement) is dependent on the characteristics of the control loops. Specifically, the control loops must be designed to be stable over a wide operating range. As a consequence, the region of highest instability places an upper limit on the rate of motor movement for each motor. Thus, the time required to reach a tuned condition is often slow.

A third problem in the prior art controllers arises because there are often false tuning points in the amplitude and phase signals provided by the tune detector. To prevent a false tune condition, the prior art controllers include additional detection and control circuitry which is designed to "kick" the control loops away from the false tune point. The additional circuitry is designed for worst case conditions and, as such, often provides too much of a "kick" away from the false tune point, thus increasing the tuning time.

The above drawbacks and constraints in the prior art systems have led to a degraded level of performance in gas-etching systems which is not commensurate with the precise and uniform etching tolerances currently needed in the semiconductor fabrication industry. The present invention is generally directed towards overcoming these drawbacks and constraints and improving the performance of automatic impedance matching systems in general and as used in plasma-etching systems.

SUMMARY OF THE INVENTION

According to the present invention, these and other problems of the prior art are addressed by the provision of automatic impedance matching apparatus according to the present invention.

Broadly stated, the invention encompasses an automatic impedance matching apparatus having an input port coupled to a signal generator and an output port coupled to a load. The input and output ports each have a signal line and a ground line. The signal generator has a predetermined characteristic impedance. The impedance matching apparatus comprises a matching means coupled between the input port and output port for matching the impedance of the load to the predetermined characteristic impedance of the signal generator. The matching means includes a first variable reactive component and second variable reactive component.

The matching apparatus further comprises a detection means for generating an amplitude tune signal related to the difference of the voltage waveform amplitude at the input port and the product of the predetermined characteristic impedance and the current waveform amplitude at the input port, and for generating a phase tune signal related to the phase difference between the voltage and current waveforms at the input port. The amplitude tune signal increases as the voltage waveform amplitude increases and decreases as the current waveform amplitude increases. The phase tune signal is substantially equal to zero when the input voltage and input current waveforms are in phase. The phase tune signal increases as the input voltage waveform leads the input current waveform and decreases as the input voltage waveform lags the input current waveform.

The matching apparatus further comprises a control means responsive to the amplitude and phase tune signals for adjusting the component values of the first and second variable reactive components to provide a tuned condition at the input port. The control means includes a first adjustment means for modifying the value of the first variable reactive component as a function of the amplitude tune signal and a second adjustment means for modifying the value of the second variable reactive component as a function of the phase tune signal.

One feature of the present invention is that the control means includes a reset means for setting the value of the first variable reactive component to a first predetermined reset value and the value of the second variable reactive component to a second predetermined reset value when either the first variable reactive component reaches a first predetermined end value or the second variable reactive component reaches a second predetermined end value. With this feature, the variable components may be reset to predetermined component values when a false-tune point is encountered.

Another feature of the present invention is that the control means includes a convergence means having hysteresis for directing the adjustments of the first and second variable components. The convergence means includes a means for generating a first tolerance standard signal when the magnitude of the amplitude tune signal is less than a predetermined first amplitude tolerance value and the magnitude of the phase tune signal is less than a predetermined first phase tolerance value. The convergence means also includes a means for generating a second tolerance standard signal when the magnitude of the amplitude tune signal is less than a predetermined second amplitude tolerance value and the magnitude of said phase tune signal is less than a predetermined second phase tolerance value. In the preferred embodiment of the present invention, the second amplitude and phase tolerance values are smaller, i.e., more stringent, than the first amplitude and phase tolerances.

The convergence means further includes two states, a tuning state where deviations from the match point are corrected though adjustments to the variable reactive components, and a hysteresis state where the servomotors are disabled until a substantial deviation from the match point is detected. The convergence means remains in the tuning state until the second tolerance standard signal is generated, indicating that the more stringent, or fine, tolerance standard has been met by the tune signals. The convergence means then enters the hysteresis state, where it remains until the first tolerance standard signal is no longer generated, indicating that tune signals have deviated from the less stringent, or crude, tolerance standard. With this feature, the "deadband" around the tuning point in prior art controllers is eliminated while achieving a precise match.

For controlling the transitions between the tuning and hysteresis states, the convergence means comprises a means for initially placing the convergence means in the tuning state and for initially enabling the first and second adjustment means, and a means responsive to the second tolerance standard signal for causing the convergence means to enter the hysteresis state when the convergence means is in the tuning state. The convergence means further comprises a means for placing the convergence means in the tuning state and for enabling said first and second adjustment means when said convergence means is in the hysteresis state and the first tolerance standard signal is not being generated.

Another feature of the present invention is that each adjustment means further comprises a step-width control means for adjusting its associated variable component in variable increments, or step-widths. The step width control means includes a first step width, a second step width, and a third step-width. The second step width is smaller than the first step width, and the third step width is larger than the second step width and is smaller than the first step width. For the first adjustment means, the step width control means includes means for generating an amplitude slope signal related to the derivative of the amplitude tune signal with respect to the value of the first variable component. For the second adjustment means, the step width control means includes means for generating a phase slope signal related to the derivative of the phase tune signal with respect to the value of the second variable component. Each step width control means selects among its associated step widths depending upon the slope and value of its associated tune signal. With this feature, small step widths may be used in regions of high instability while large step widths may be used to decrease the time needed for the tuning operation.

Yet another feature of the present invention is that the detection means includes means for generating a normalizing signal as a function of a selected one of the voltage waveform amplitude and current waveform amplitude at the input port. Additionally in this feature, the control means includes means for normalizing the amplitude tune and phase tune signals with respect to the normalizing signal. With this feature, the variations in performance due to variations in input power level are substantially reduced.

Accordingly, it is an object of the present invention to provide an automatic tuning apparatus and method for impedance-matching networks.

It is another object of the present invention to increase tuning accuracy and tuning repeatability for impedance-matching networks.

It is yet another object of the present invention to increase tuning range and decrease tuning time for impedance-matching networks.

These and other objects of the present invention will become apparent to those skilled in the art from the following detailed description of the invention and from the accompanying drawings.

BRIEF DESCRIPTION OF THE DRAWINGS

FIG. 1 is a block diagram of the automatic impedance matching apparatus according to the present invention.

FIG. 2 is a circuit diagram of an exemplary embodiment of the matching network according to the present invention.

FIG. 2A is a circuit diagram of a second exemplary embodiment of the matching circuit 220 shown in FIG. 2 according to the present invention.

FIG. 2B is a circuit diagram of a third exemplary embodiment of the matching circuit 220 shown in FIG. 2 according to the present invention.

FIG. 3 is a circuit diagram of an exemplary embodiment of the tune detector according to the present inventon.

FIG. 4 is a diagram of the construction of the resultant phase phasors of the exemplary tune detector according to the present invention.

FIG. 5 is a block diagram of an exemplary embodiment of the controller according to the present invention.

FIG. 6 is a circuit diagram of an exemplary embodiment of the null adjuster according to the present invention.

FIG. 7 is an impedance diagram of the impedance-matching construction according to the present invention.

FIGS. 8A and 8B are diagrams of an exemplary tuning-curve set according the present invention.

FIG. 9 is a flow diagram of the operation of an exemplary setup means of the present invention.

FIG. 10 is a flow diagram of the operation of a first exemplary convergence means of the present invention.

FIG. 10A is a partial flow diagram of the operation of an augmented first exemplary convergence means of the present invention shown in FIG. 10.

FIG. 11 is a logic flow diagram of the hysteresis means of the present invention.

FIGS. 12A and 12B are flow diagrams of the operation of a second exemplary convergence means of the present invention.

FIG. 12C is a partial flow diagram of the operation of an augmented second exemplary convergence means of the present invention shown in FIGS. 12A and 12B.

FIG. 13 is a flow diagram of the operation of a first exemplary adjustment means of the present invention.

FIGS. 14A and 14B are flow diagrams of the operation of a second exemplary adjustment means of the present invention.

FIGS. 15A and 15B are diagrams of an exemplary tuning-curve set showing the step widths according to the present invention.

FIG. 16A is a flow diagram of the operation of an exemplary embodiment of the amplitude slope means of according to the present invention.

FIG. 16B is a flow diagram of the operation of an exemplary embodiment of the phase slope means of according to the present invention.

FIG. 17 is a flow diagram of the operation of an exemplary embodiment of the normalization means according to the present invention.

FIG. 18 is a flow diagram of the operation of a first exemplary embodiment of the increment means according to the present invention.

FIG. 19 is a flow diagram of the operation of a second exemplary embodiment of the increment means according to the present invention.

FIG. 20 is a flow diagram of the operation of an exemplary embodiment of the portion of the reset means according to the present invention wherein the variable reactive components are caused to be reset to their predetermined reset values.

DETAILED DESCRIPTION OF THE INVENTION

The Automatic Matching Apparatus of the present invention is shown at 10 in FIG. 1. Matching Apparatus 10 comprises a signal input port 12 and associated ground 13 for receiving a radio frequency input signal from a signal generator 2100. Signal generator 2100 has a predetermined characteristic impedance $Z_0$, or internal impedance, which is notated by a resistor 2200 in series between signal generator 2100 and port 12. An exemplary value of the characteristic impedance $Z_0$ of signal generator 2100 is 50 ohms (real). Matching Apparatus 10 further comprises an output port 14 and an associated ground 15 for directing a matched RF signal to a load impedance 2300. Load impedance 2300 is a representation of the parallel plate electrodes of a plasma etching chamber. Load impedance 2300 is primarily capacitive and resistive in nature. A typical impedance value for load impedance 2300 at a frequency of 13.56 Megahertz is (5-j110) ohms. Matching apparatus 10 further comprises a UART port 16 for providing standard asynchronous serial data communication to an outside terminal. Specifically, UART port 16 provides means for allowing a user to communicate instructions and configuration commands in a conventional fashion from a user interface 2400 to Matching Apparatus 10.

Matching Apparatus 10 further comprises a Matching Network 20 which provides means for matching load impedance 2300 to the characteristic impedance of signal generator 2300 (e.g., 50 ohms), a Tune Detector 40 for providing amplitude and phase signals used for detecting a tuned condition, and a Controller 50 for adjusting the characteristics of Matching Network 20. The radio frequency signal from signal generator 2100 is coupled to load impedance 2300 through Tune Detector 40 and Matching Network 20. Tune Detector 40 comprises an input port 42 coupled to input port 12, an associated ground port 43 coupled to ground 13, an output signal port 44 for coupling the RF signal to Matching Network 20, and an associated ground 45. Likewise, Matching Network 20 comprises a signal input port 22 coupled to signal output port 44, an associated ground port 23 coupled to ground 45, an output signal port 24 coupled to output port 14, and an associated ground port 25 coupled to ground 15. Tune Detector 40 functions to sample various characteristics of the RF signal propagating between input port 42 and output port 44 and does not significantly disturb the propagation of signals between these ports. On the other hand, Matching Network 20 serves to introduce reactive components within the RF signal path between input port 22 and output port 24 to provide a match between load impedance 2300 and signal generator 2100.

Matching Network 20 comprises a first variable reactive component and a second variable reactive component. In one embodiment of Matching Network 20 as described in greater detail below with reference to FIG. 2, the first variable component comprises a variable capacitor and the second variable component comprises a variable capacitor. An inductor having a fixed inductance value is included and the reactive components are arranged in a Pi-network. Specifically, the first variable capacitor is coupled between ports 22 and 23, and the second variable capacitor is coupled between ports 24 and 25. The fixed inductor is coupled between input port 22 and output port 24.

In a second embodiment of Matching Network 20, as described in greater detail below with reference to FIG. 2A, the first variable component comprises a variable capacitor and the second variable component comprises a variable inductor. In this embodiment, the variable capacitor and variable inductor are arranged in an L-network. Specifically, the variable capacitor is coupled between ports 22 and 23 and the variable inductor is coupled between input port 22 and output port 24.

In a third embodiment of Matching Network 20, as described in greater detail below with reference to FIG. 2B, the first variable component comprises a variable capacitor and the second variable component comprises a variable capacitor. An inductor having a fixed inductance value is included and the reactive components are arranged in an L-network. The first variable capacitor is coupled between ports 22 and 23. The second variable capacitor and the fixed inductor are coupled to one another in a series combination and the series combination is coupled between input port 22 and output port 24.

The variable components are constructed by techniques well known within the art. Servomotors are preferably employed to adjust the component value of each variable component and means are included to monitor the component value (i.e., mechanical position) of each variable component. For components comprising capacitors, the component value is measured in capacitance. For components comprising inductors, the component value is measured in inductance.

Matching Network 20 further comprises ports 31 and 32 for receiving motor-drive signals for positioning the servomotor of the first variable component and ports 35 and 36 for receiving motor-drive signals for positioning the servomotor of the second variable component. Matching Network 20 further comprises an output port 30 for transmitting a signal related to the value of the first variable component and an output port 34 for transmitting a signal related to the value of the second variable component. The signals received and provided on ports 30-36 are coupled to various ports of Controller 50, described below. Matching Network 20 further comprises a port 26 for receiving a supply voltage of 5 volts, a port 27 for receiving a power supply of 1-5 volts, a port 28 for receiving a power supply of 30 volts, and a port 29 for receiving a ground reference.

In a preferred embodiment of the present invention, the signals provided on ports 31 and 35 indicate the direction in which the motors are to move in. Each signal comprises a pulse-width modulated (PWM) format having a constant frequency of modulation and voltage levels of 0 and 5 volts. A duty-cycle of less than 50% instructs the associated motor to rotate clockwise, which reduces the value of the variable component, and a duty-cycle greater than 50% instructs the associated motor to rotate counterclockwise, which increases the value of the variable component. A duty cycle of exactly 50% causes no rotation. The speed of rotation increases linearly with the deviation away from the 50% duty-cycle point. For example, a 0% duty cycle rotates the associated motor clockwise twice as fast as a 25% duty cycle, and a 100% duty cycle rotates the associated motor counterclockwise twice as fast as a 75% duty cycle.

In a preferred embodiment of the present invention, the signals provided on ports 32 and 36 enable the movement of the first and second servomotors, respectively. Each signal comprises a standard digital format where a "high" value enables the associated motor for positioning and a "low" value disables the associated motor. In this manner, a precise digital control of the location and speed of motion of each servomotor is possible and, hence, a fine control of the values for the variable components is possible. It may be understood that other signaling formats for motor direction and speed control are well known to the art and that these may be substituted for the formats described herein.

In general, Tune Detector 40 comprises means for determining the relationships between the current and voltage passing between input port 42 and output port 44. More specifically, means are included for .1 measuring the peak amplitude of the voltage and the peak amplitude of the current passing through Tune Detector 40. A signal proportional to the amplitude of the voltage is provided on a port 46 and a signal proportional to the amplitude of the current is provided on a port 47. The signal on port 46 is positive with respect to ground and is denoted by $A_T(+)$. The signal on port 47 is negative with respect to ground and is denoted by the symbol $A_T(-)$. The signal values on ports 46 and 47 are scaled such that they are substantially equal in magnitude, but opposite in sign, when the effective impedance seen looking into port 42 ($Z_{in}$) is equal in magnitude (i.e., magnitude=$|Z_{in}|$) to the real part of the characteristic impedance, which is denoted as the characteristic resistance $R_0$ and is 50 ohms in the preferred embodiment.

The amplitude signals $A_T(+)$ and $A_T(-)$ provide information on the ratio of the amplitude of the voltage waveform at the detector input to the amplitude of the product of the characteristic impedance and the current waveform at the input. The relationship of this ratio to unity is useful in describing the adjustments of the variable reactive components of Matching Network 20 which are made in response to the amplitude signals. The ratio is defined below as:

$$\text{Ratio} = \frac{|V_{in}|}{|R_0 I_{in}|}$$

where $V_{in}$ denotes the phasor representation of the input voltage waveform and $I_{in}$ denotes the phasor representation of the input current waveform. In the preferred embodiment, the characteristic impedance is at a value of 50 ohms. The above Ratio is equal to unity when the amplitude signals $A_T(+)$ and $A_T(-)$ are equal in magnitude, but opposite in sign. The ratio is greater than unity when the magnitude of $A_T(+)$ is greater than the magnitude of $A_T(-)$, and is less than unity when the magnitude of $A_T(+)$ is less than the magnitude of $AT(-)$.

Additionally, Tune Detector 40 comprises means for detecting the phase difference between the current and voltage waveforms passing through Tune Detector 40. A first phase signal $\Phi_T(+)$ present on a port 48 and a second phase signal $\Phi_T(-)$ present on a second port 49 indicate the phase difference between the voltage and current waveforms. The $\Phi_T(+)$ signal is generally positive while the $\Phi_T(-)$ signal is generally negative. These signals are scaled such that their sum is substantially zero when the impedance seen at port 44 has no imaginary (reactive) part. When the voltage waveform leads the current waveform at the Detector 40 input, as in the case of an inductive load (positive reactance), the magnitude of the $\Phi_T(+)$ signal increase and the magnitude of the $\Phi_T(-)$ signal decreases. When the voltage waveform lags the current waveform at the Detector 40 input, as in the case of a capacitive load (negative reactance), the magnitude of the $\Phi_T(+)$ signal decreases and the magnitude of the $\Phi_T(-)$ signal increases.

Controller 50 comprises means for receiving the amplitude and phase information from Tune Detector 40 and means for controlling the servomotors in Matching Network 20 in response thereto. The information from Tune Detector 40 is received by four ports 56–59 of Controller 50, which are coupled to ports 46–49, respectively. Each of the amplitude and phase signals present at these ports comprises an analog-signal format. Controller 50 further comprises means for providing an amplitude tune signal $A_{TUNE}$ related to the difference in magnitudes of the signals $A_T(+)$ and $A_T(-)$, e.g., $A_{TUNE}=|A_T(+)|-|A_T(-)|$, and for providing a phase tune signal $\Phi_{TUNE}$ related to the difference in magnitudes of the signals $\Phi_T(+)$ and $\Phi_T(-)$, e.g., $\Phi_{TUNE}=|\Phi_T(+)|-|\Phi_T(-)|$. In one exemplary embodiment of Controller 50, the analog amplitude and phase signals are converted to digital representations and the above described tune signals are obtained using digital signal processing techniques.

For controlling the operation of the servomotors in Matching Network 20, Controller 50 includes a plurality of ports 60–62 and ports 64–66 for receiving and transmitting information to Matching Network 20. Ports 60 and 64 are coupled to ports 30 and 34, respectively, and receive information on the position of the motors controlling the first and second variable components, respectively. Ports 61 and 65 are coupled to ports 31 and 35, respectively, and provide digital signals for enabling the first and second servomotors, respectively, as discussed above. Ports 62 and 66 are coupled to ports 32 and 36, respectively, and provide pulse-width modulated signals to set the direction and speed of rotation for the first and second servomotors, respectively, as discussed above.

Controller 50 further comprises a load-matching control means responsive to the tune signals $A_{TUNE}$ and $\Phi_{TUNE}$ for directing the adjustments to the variable reactive components of Matching Network 20 to provide a tuned condition between signal source 2100 and load 2300. The control means comprises a first adjustment means for modifying the component value of the first variable reactive component as a function of the amplitude tune signal $A_{TUNE}$ and a second adjustment means for modifying the value of the second variable reactive component as a function of the phase tune signal $\Phi_{TUNE}$. For the embodiments of Matching Network 20 detailed below in FIGS. 2 and 2A, the first adjustment means increases the component value of the first variable component when $A_{TUNE}$ is greater than zero and decreases the component value of the first variable component when $A_{TUNE}$ is less than zero. Also for the embodiments of Matching Network 20 detailed below in FIGS. 2 and 2A, the second adjustment means increases the component value of the second variable component when $\Phi_{TUNE}$ is greater than zero and decreases the component value of the second variable component when $\Phi_{TUNE}$ is less than zero. The control relationships between the tune signals and the variable components are described in greater detail below.

The load-matching control means of Controller 50 further comprises a reset means for setting the variable components to predetermined reset values when either of the variable components reaches a respective predetermined end value. The condition of reaching a predetermined end value generally indicates a failure to tune (a false-tune condition). For Matching Circuits 220, 220a, and 220b, the end value for each variable reactive component is preferably the minimum component value of the variable reactive component. The predetermined reset values are chosen to provide a precise and reliable starting point for a successful tune operation. In one embodiment of the reset means, the predetermined reset values are the maximum component values of the variable components.

Additionally, Controller 50 comprises a port 51 for receiving a power supply of 5 volts, a port 52 for receiving a power supply of 15 volts, a port 53 for receiving a power supply of −15 volts, and a ground port 54 for receiving a ground reference. Included within Controller 50 is a bus port 55 for communicating information on the status of Automatic Matching Network 10 to an outside user. In one exemplary embodiment of Controller 50, a UART system for communicating with an outside user is included. In this exemplary embodiment, bus port 55 functions as a standard UART bus port, as well known in the microprocessor art.

In a further embodiment of Controller 50, the load-matching control means comprises a convergence means for directing the adjustments of the first and second variable components. The convergence means enables adjustments to the variable components while the $A_{TUNE}$ and $\Phi_{TUNE}$ signals greater than predetermined tolerance levels. The convergence means disables adjustments to the variable components once the tune signals are reduced below the tolerance levels. In an additional embodiment, the convergence means includes hysteresis means for converging to a first tolerance standard and for allowing a divergence to a second tolerance standard before re-converging to the first tolerance standard. Under tuned conditions, the convergence means and hysteresis means prevent continual movement of the variable components and, consequently, increase the lifetime of the servomotors. In addition, the convergence and hysteresis means more precisely define the tuned condition than prior art means and, as a result, provide greater repeatability and accuracy that the "dead-band" techniques of the prior art. The convergence and hysteresis means are discussed in greater detail below.

In a further embodiment of Controller 50, the load-matching control means comprises a step-width control means for adjusting the variable components in variable increments. Information on the values of the tune signals and the rate of change in the tune signals with respect to the variable component values is used to guide the selection of the increment size for each variable component. The step-width control means provides stable adjustments to the variable components over their entire range of operation while minimizing the time required to reach a tuned condition. The step-width control means effectively eliminates the constraint of the region of highest instability placing an upper limit on the rate of motor movement. The step-width control means is discussed in greater detail below.

In a preferred embodiment of the present invention, the load-matching control means of Controller 50 comprises a Setup Means for initialization, a Convergence Means for maintaining a tuned condition, an Adjustment Means responsive to the tuning signals for adjusting the variable components, and an Increment Means comprising a Step-Width Control Means for incrementing the positions of the servomotors. Exemplary embodiments of each of these means are provided and discussions of their operations are detailed below. In a preferred embodiment of the present invention, these means are implemented in a processor comprising a microprocessor, a memory unit, a control program, and I/O data communication ports, as well known in the art. It may be appreciated that these means may also be implemented with analog circuitry, digital circuitry, or a hybrid of analog and digital circuitry.

A general description for the operation of the Automatic Matching Apparatus of the present invention has thus far been given. The discussion that follows focuses on describing in greater detail exemplary embodiments of Matching Network 20, Tune Detector 40, Controller 50, and the coupling between these components. The discussion will also further address the load-matching control means of Controller 50 and the principles of operation for Matching Network 20 and Tune Detector 40.

An exemplary embodiment of Matching Network 20 is shown at 200 in FIG. 2. The ports of Matching Network 200 correspond to the ports of Matching Network 20, shown in FIG. 1. Ports 202 and 203 correspond to ports 22 and 23 and serve to couple in the radio-frequency (RF) signal. Ports 204 and 205 correspond to ports 24 and 25, respectively, and serve to couple out the RF signal from Matching Network 200. Ports 206 through 209 provide power at various voltages and correspond to ports 26 through 29 of Matching Network 20 respectively. Ports 210 and 214 correspond to ports 30 and 34, respectively, and provide position information on the first and second servomotors, respectively. Ports 211 and 212 correspond to ports 31 and 32, respectively, and couple in signals which control the positioning of the first servomotor. Ports 215 and 216 correspond to ports 35 and 36 respectively, and couple in signals which control the positioning of the second servomotor.

Matching Network 200 comprises a Matching Circuit 220 for introducing a first variable reactive component and a second variable reactive component in the RF-signal path and for providing an impedance match between the signal generator and the impedance load. In one preferred embodiment of Matching Network 200, the first variable component comprises a first variable capacitor 231 and the second variable component comprises a second variable capacitor 232. Matching Circuit 220 further includes an inductor 226 of fixed inductance coupled between ports 202 and 204. Inductor 226 has been given a symbol designation of $L_\pi$. First variable capacitor 231 is coupled between RF input port 202 and ground port 203, and has been given the symbol designation of $C_1$. Second variable capacitor 232 is coupled between RF output port 204 and associate ground 205, and has been given the symbolic designation of $C_2$. The associate ground ports 203 and 205 are coupled together to provide a common ground. Matching Circuit 220 further comprises four ports 222-225 to indicate the points of coupling between Matching Circuit 220 and ports 202-205. Ports 222-225 are coupled to ports 202-205, respectively.

The values for capacitors 231, 232 and inductor 226 have been designed for a fixed frequency of 13.56 Megahertz and a target load impedance value of (5-j110) ohms, and are given below in Table I.

TABLE I

| | |
|---|---|
| $C_1$ | 220 pF–1160 pF |
| $C_2$ | 30 pF–200 pF |
| $L_\pi$ | 0.75 μH |

The construction of capacitors 231, 232 and inductor 226 are well known in the gas-plasma and impedance-matching arts. Variable capacitors 231 and 232 are preferably constructed using standard rotating parallel plate technology and comprises a set of fixed parallel plates interleaved with a set of rotating parallel plates. The parallel plates are separated by air gaps and the rotating parallel plates have an 180° range of rotation. The rotating parallel plates are coupled to a mechanical shaft to provide an external means of positioning the rotating plates.

The rotation shaft of variable capacitor 231 is mechanically coupled to the shaft of a servomotor 261 and to the rotation shaft of a potentiometer 251. This mechanical connection is denoted in FIG. 2 by the dashed line shown at 241. Likewise, the rotation shaft of variable capacitor 232 is mechanically coupled to the shaft of a servomotor 262 and to the rotation shaft of a potentiometer 252. This mechanical coupling is denoted by a dashed line at 242 in FIG. 2.

Potentiometers 251 and 252 are configured electrically to generate voltages which are proportional to the shaft positions of first capacitor 231 and second capacitor 232, respectively. These voltages are generated at the wiper terminal of potentiometers 251 and 252 and are also proportional to the capacitance values of capacitors 231 and 232. An end resistance terminal of each potentiometer 251, 252 is grounded. The other end resistance terminal of each potentiometer 251, 252 is coupled to a node 253, which has a stable voltage, for example 10.0 volts. The voltage at node 253 is developed by a Zener diode 254 having an anode terminal coupled to node 253 and a cathode terminal coupled to ground. Zener diode 254 is fed with current by a resistor 257 coupled between node 253 and a 15 V supply voltage. A capacitor 256 is used to filter out noise signals on node 253.

The wiper terminal of potentiometer 251 is coupled to port 210 as an output and the wiper terminal of potentiometer 252 is coupled to port 214 as an output. Each potentiometer 251 and 252 acts as a simple resistor voltage divider to generate a voltage which is proportional to the shaft position and thus the capacitance value of the associated variable capacitor. Other means for providing position information are well known in the art and it may be appreciated that other such means may be used according to the present invention.

Servomotors 261 and 262 comprise standard high voltage servomotors well known to the art and are denoted symbolically in FIG. 2 as M1 and M2, respectively. Each servomotor comprises two power terminals marked with the standard "+" and "−" voltage reference symbols to denote the power terminal and the ground terminal, respectively. When a positive voltage is applied across the terminals of servomotor 261, the mechanical coupling 241 is rotated in the forward direction to increase the value of first capacitor 231. Likewise, when a negative voltage is applied across the terminals of servomotors 261, the mechanical coupling 241 is rotated in the reverse direction to reduce the capacitance value of capacitor 231. The same relationship between applied voltage and rotational direction holds for the combination of second motor 262, mechanical coupling 242, and second variable capacitor 232. It may be appreciated that the choice of rotation directions with respect to applied voltages is arbitrary and that a different choice may be used in the present invention. For example, the servomotor may be placed on the opposite shaft end of the variable capacitor and a positive applied voltage to motor M1 may rotate the capacitor plates in the reverse direction to decrease the capacitance value.

Matching Network 200 further comprises a Motor Drive Unit 280 responsive to the direction and drive signals on ports 211-216 for driving servomotors 261 and 262. In the preferred embodiment of the present invention, Motor Drive Unit 280 comprises two servomotor drivers powered from a high voltage 30 V power supply. Preferably, Motor Drive Unit 280 comprises an L298 device manufactured by Texas Instruments, Inc. The L298 device comprises two full-H drivers and is well known in the servomotor art. Motor Drive Unit 280 receives a low level power supply of 5 V at a port 284, a high voltage power supply of roughly 30 V at a port 290, and a ground reference at a port 294. The first servomotor driver of Unit 280 comprises a first direction input 1A1 at a port 281, a second direction input 1A2 at a port 282, an enable input IEN at a port 283, a first output port 1Y1 at a port 291, a second output port 1Y2 at a port 292, and a high voltage ground 1E at a port 293. The first servomotor driver of Unit 280 is used to drive servomotor 261 as described in greater detail below. The second servomotor driver of Unit 280 comprises a first drive input 2A1 at a port 285, a second drive input 2A2 at a port 286, an enable input 2EN at a port 287, a first output 2Y1 at a port 295, a second output 2Y2 at a port 296, and a high voltage ground 2E at a port 297. The second servomotor driver of Unit 280 is used to drive servomotor 262, as described in greater detail below.

The drive enable signal for servomotor 261 (M1) is provided on port 212, which is coupled to Motor Drive Unit 280 at port 283. Likewise, the motor enable signal for servomotor 262 (M2) is provided on port 216, which is coupled to port 287 of Motor Drive Unit 280. The motor drive signals on ports 212 and 216 enable their corresponding servomotor drivers with a high signal (3 V5 V) and disable their corresponding servomotor driver with a low signal (0 V). The motor direction signal for servomotor 261 (M1) is provided on port 211 and is coupled to Unit 280 at port 282. The direction signal on port 211 is also coupled to port 281 via an inverter 288. Likewise, the direction signal for servomotor 262 (M2) is provided on port 215 and is directly coupled to port 286 of Unit 280. The direction signal on port 215 is also coupled to port 285 of Unit 280 via an inverter 289. As mentioned above, the direction signals on ports 211 and 215 are pulse width modulated signals. When the duty cycle of a direction signal is greater than 50%, the corresponding servomotor is rotated counterclockwise to increase the component value of the corresponding variable component. When the duty cycle of the direction signal is less than 50%, the corresponding servomotor is rotated clockwise to reduce the component value of the corresponding variable component.

Each of the servomotor drivers of Unit 280 converts the low level voltage signals present on ports 211-216 to high voltage signals present on ports 291-296. The first output of the first servomotor driver at port 291 is coupled to the positive terminal of servomotor 261 via a resistor 298. The second output of the first servomotor driver at port 292 is coupled to the negative terminal of servomotor 261. Likewise, the first output of the second servomotor driver at port 295 is coupled to the positive terminal of servomotor 262 via a resistor 299. The second output of the second servomotor driver at port 296 is coupled to the negative terminal of servomotor 262. Both of the high voltage grounds at ports 293 and 297 are coupled to ground. Additionally, high-speed output-clamp diodes 270-277 are provided on the terminals of servomotors 261 and 262 to suppress the inductive transients that may occur in operating servomotors 261 and 262. The coupling of diodes 270-277 is well known in the servomotor art and is shown in FIG. 2.

Motor Drive Unit 280 serves to translate the directional information on ports 211 and 215 to appropriate high voltage and high current signals on ports 291-296 as follows. When the direction signal on port 211 is high (3 V-5 V) and the drive signal on port 212 is high (3 V-5 V), the first servomotor driver of Unit 280 provides a high voltage level (30 V) at port 291 and a voltage near 0 on port 292. In this case, servomotor 261 will rotate mechanical coupling 241 counterclockwise (forward direction) to increase the capacitance value of capacitor 231 ($C_1$). When the drive enable signal on port 212 is high but the direction signal on port 211 is low (0 V), the first servomotor driver of Unit 280 will provide a high voltage (30 V) on output port 292 and a near ground potential on output port 291. In this case, servomotor 261 rotates mechanical coupling 241 clockwise (reverse direction) to reduce the capacitance value of capacitor 231 ($C_1$). When the drive enable signal at port 212 is low, the first servomotor driver of Unit 280 provides a near ground potential for both output ports 291 and 292, regardless of the direction signal present on port 211.

The second servomotor driver of Unit 280 operates in a similar manner. When the direction signal on port 215 is high (3 V-5 V) and the drive signal on port 216 is high (3 V-5 V), the second servomotor driver of Unit 280 provides a high voltage level (30 V) at port 295 and a voltage near 0 on port 296. In this case, servomotor 262 will rotate mechanical coupling 242 counterclockwise (forward direction) to increase the capacitance value of capacitor 232 ($C_2$). When the drive enable signal on port 216 is high but the direction signal on port 215 is low (0 V), the second servomotor driver of Unit 280 will provide a high voltage (30 V) on output port 296 and a near ground potential on output port 295. In this case, servomotor 262 rotates mechanical coupling 242 clockwise (reverse direction) to reduce the capacitance value of capacitor 232 ($C_2$). When the drive enable signal at port 216 is low, the second servomotor driver of Unit 280 provides a near ground potential for both output ports 295 and 296, regardless of the direction signal present on port 215.

In a second preferred embodiment of Matching Network 200, Matching Circuit 220 comprises an L-network shown at 220a in FIG. 2A. Matching Circuit 220a comprises a variable capacitor 231a as the first variable component, a variable inductor 232a as the second variable component, an input signal port 222a, an input ground port 223a, an output signal port 224a, and an output ground port 225a. Ports 222a-225a of Matching Circuit 220a have the same function as Ports 222-225, respectively, of Matching Circuit 220 shown in FIG. 2 and are coupled to ports 202-205 of Matching Circuit 200, respectively.

Variable capacitor 231a is coupled between ports 222a and 223a and has been given a symbol designation of $C_1$, and variable inductor 232a is coupled between ports 222a and 224a and has been given the symbol designation of L2. The ground ports 223a and 225a are coupled together to provide a common ground. Mechanical coupling 241 of Matching Network 220 is coupled to the rotation shaft of variable capacitor 231a and mechanical coupling 242 of Matching Network 220 is coupled to the rotation shaft of variable inductor 232a. As in Matching Circuit 220, the capacitance value of variable capacitor 231a increases when mechanical coupling 241 rotates in the forward direction and decreases when mechanical coupling 241 rotates in the reverse direction. Likewise, the inductance value of variable inductor 232a increases when mechanical coupling 242 rotates in the forward direction and decreases when mechanical coupling 242 rotates in the reverse direction. As described in further detail below, Matching Circuit 220a is useful with highly capacitive loads. In effect Matching Circuit 220a does not require a variable capacitor 232, as used in Matching Circuit 220. In Matching Circuit 220a, the adjustment function of capacitor 232 ($C_2$) is provided by inductor 232a ($L_2$).

The construction of a variable inductor that has a wide range of inductances, a low loss characteristic, and high-current handling capability is oftentimes difficult and expensive. It may be appreciated that for fixed frequency operation, as is done in the present invention, the variable inductance function of inductor 232a may be replaced by a series combination of a fixed value inductor and a variable capacitor. The reactance of the series combination is $j(wL_s - 1/(wC_s))$, where j is the square root of $-1$, w is the operating frequency in radians per second, $L_s$ is the inductance of the fixed inductor, and $C_s$ is the capacitance of the variable capacitor. As seen by the above equation, the reactance of the series combination increases as the variable capacitance increases and decreases as the variable capacitance decreases. The effective inductance of the series combination is $L_{eff} = L_s - 1/(w^2 C_s)$. To replace variable inductor 232a ($L_2$) of FIG. 2A by the series combination, the inductance of the fixed series inductor, $L_s$, is set to a value greater than the maximum inductance of variable inductor 232a and the minimum value of the variable capacitor is chosen such that the effective inductance $L_{eff}$ remains positive.

A third preferred embodiment of Matching Circuit 220 is shown at 220b in FIG. 2B. Matching Circuit 220b comprises a variable capacitor 231b as the first variable reactive component, an inductor 236b having a fixed inductance value, a second variable capacitor 232b as the second variable reactive component, an input signal port 222b, an input ground port 223b, an output signal port 224b, and an output ground port 225b. Ports 222b-225b of Matching Circuit 220b have the same function as Ports 222-225, respectively, of Matching Circuit 220 shown in FIG. 2 and are coupled to ports 202-205 of Matching Circuit 200, respectively.

Variable capacitor 231b is coupled between ports 222b and 223b and has been given a symbol designation of $C_1$, inductor 236b has been coupled between port 222b and an intermediate node 235b and has been given the symbol designation of $L_3$, and variable capacitor 224b and has been given the symbol designation of $C_3$. The ground ports 223b and 225b are coupled together to provide a common ground. Mechanical coupling 241 of Matching Network 220 is coupled to the rotation shaft of variable capacitor 231b and mechanical coupling 242 of Matching Network 220 is coupled to the rotation shaft of variable capacitor 232b. As in Matching Circuit 220, the capacitance value of variable capacitor 231b increases when mechanical coupling 241 rotates in the .1 forward direction and decreases when mechanical coupling 241 rotates in the reverse direction. Likewise, the capacitance value of variable capacitor 232b increases when mechanical coupling 242 rotates in the forward direction and decreases when mechanical coupling 242 rotates in the reverse direction.

As with Matching Circuit 220a, Matching Circuit 220b is useful with highly capacitive loads. For the functional needs of the present invention, Matching Circuits 220a and 220b are functional equivalents. The statements made below for Matching Circuit 220a apply to Matching Circuit 220b with the understanding that the series combination of inductor 236b (L₃) and variable capacitor 232b (C₃) is functionally equivalent to variable inductor 232a (L₂) and that the effective inductance of the series combination is increased by increasing the capacitance of capacitor 232b (C₃).

An exemplary embodiment of Tune Detector 40 is shown at 300 in FIG. 3. Tune Detector 300 comprises an RF input port 302 and an associated ground port 303 for receiving an RF signal, an RF output port 304 and an associated ground port 305 for transmitting an RF signal, two ports 306 and 307 for providing positive and negative amplitude signals, respectively, and two ports 308 and 309 for providing negative and positive phase signals, respectively. Ports 302 through 309 of Tune Detector 300 correspond to ports 42 through 49 of Tune Detector 40, shown in FIG. 1. Tune Detector 300 measures key relationships between the amplitudes and phases of the current and voltage waveforms (phasors) of the RF signal traveling between ports 302 and 304. The construction and theory of operation of Tune Detector 300 are well known to the art.

Tune Detector 300 comprises a Main Microstrip Coupling Line 310 for transporting the RF signal from port 302 to port 304, three Sampling Coupling Lines 316, 320, and 330 for sampling the current passing through Main Coupling Line 310, and three coupling capacitors 313, 324, and 334 for sampling the voltage on Main Coupling Line 310. The sampling lines and the sampling capacitors are used to construct four basic output signals: a signal which is proportional to the peak voltage present on Main Coupling Line 310, a signal proportional to the peak current flowing through Main Coupling Line 310, and two signals which are related to the phase difference between the current and voltage waveforms (i.e., current and voltage phasors) on Main Coupling Line 310. The construction of these signals is discussed first and their meaning and intended use are addressed later.

The voltage on Line 310 is sampled by coupling capacitor 313, which is coupled between Line 310 and a node 314. A 50-ohm resistor 315 is coupled between node 314 and ground to develop a voltage at node 314 which is proportional to the voltage on Line 310. In the preferred embodiment of Tune Detector 300, capacitor 313 has a capacitance value approximately equal to 5 pF and the voltage at node 314 has an amplitude which is approximately 2% of the peak amplitude on Main Line 310. A standard Diode Detector 340 is used to sample the peak amplitude at node 314 to develop a DC voltage proportional to the peak amplitude on node 314.

Detector 340 comprises a diode 341 coupled in series with a limiting resistor 342, a node 343, a holding capacitor 344, a filtering inductor 345, and a filtering capacitor 346. Limiting resistor 342 is coupled between the cathode of diode 341 and node 343, holding capacitor 344 is coupled between node 343 and ground, filtering inductor 345 is coupled between node -:: 343 and port 306, and filtering capacitor 346 is coupled between ground and port 306. Node 314 is coupled to Detector 340 at the anode terminal of diode 341 and the output of Detector 340 is coupled from filtering inductor 345 and capacitor 346 to port 306. The orientation of diode 341 ensures that a positive voltage is developed at port 306. The signal at port 306 is proportional to the peak voltage on Main Line 310 and is referred to as the positive amplitude signal $A_T(+)$.

The current waveform (phasor) through Main Line 310 is sampled by Sampling Line 316 via magnetic coupling between Lines 310 and 316. Sampling Line 316 comprises a first end 317 coupled to ground and a second end 318 coupled to a second Diode Detector 350. Since the voltage at first end 317 is fixed, the magnetic interaction between Lines 310 and 316 acts as a standard mutual inductive coupling and the voltage developed at second end 318 is proportional to the product of the radian frequency $w$ times the mutual inductance $L_M$. The developed voltage at second end 318 is sinusoidal in nature and is converted into a DC voltage by Detector 350.

Diode detector 350 comprises a diode 351, a limiting resistor 352, a node 353, a holding capacitor 354, a filtering inductor 355 and a filtering capacitor 356. The components of Diode Detector 350 are arranged in a topology that is identical to that shown in Diode Detector 340, with the exception that the orientation of diode 351 is reversed. The cathode terminal of diode terminal 351 serves as the input of Detector 350 and is coupled to second end 318 of Sampling Line 316. The coupled terminals of filtering inductor 355 and filtering capacitor 356 serve as the output of Detector 350 and are coupled to port 307. The peak voltage developed at second end 318 is proportional to the current passing through main line 310 and, in turn, the magnitude of the D.C. voltage signal at port 307 is proportional to the peak current through Main Line 310. The signal at port 307 is referred to as the negative amplitude signal $A_T(-)$ and the voltage developed at port 307 is negative due to the orientation of diode 351.

As mentioned above, the positive amplitude signal at port 306 is proportional to 2%, or 1/50th, of the peak voltage on Main Line 310 and the negative amplitude signal at port 307 is proportional to the peak current on Main Line 310. Under tuned conditions, i.e., when the real component of the impedance across ports 304, 305 is equal to 50 ohms, the peak amplitude of the current through Main Line 310 is 1/50th of the peak amplitude of the voltage on Main Line 310. The voltage at port 306 is roughly equal in magnitude, but opposite in sign, to the voltage on 307 under tuned conditions. The positive amplitude signal and the negative amplitude signal are combined, in a manner as described below, to produce an amplitude tune signal $A_{TUNE} = |A_T(+)| - |A_T(-)|$, which is near or equal to zero under tuned conditions.

In fact, the amplitude tune signal $A_{TUNE}$ is equal to zero whenever the real component of the impedance between ports 304 and 305 is 50 ohms, regardless of the value of the imaginary (reactive) part of the load. As the real part of the load decreases, the magnitude of the signal $A_{TUNE}$ decreases since the current in Main Line 310 increases with decreasing resistance. Conversely, the signal $A_{TUNE}$ increases as the real part of the load impedance increases. On a Smith Chart, which diagrams complex impedances, the locus of impedance points where the signal $A_{TUNE}=0$ is a vertical line through the Smith Chart which passes through the center impedance point at 50 ohms. The vertical line is shown in FIG. 7 at 750. The signal $A_{TUNE}$ is positive for impedance points on the right side of Line 750 and is negative for impedance points on the left side of Line 750. $A_{TUNE}$ increases in magnitude as the distance between Line 750 and the load-impedance point increases.

The construction and significance of the phase signals $\Phi_T(+)$ and $\Phi_T(-)$ are more complex than the construction and significance of the amplitude signals. Each phase signal is derived from a sampling line which is coupled inductively as well as capacitively to Main Line 310. At the tune point, the negative and positive phase signals have equal magnitudes but opposite signs. The phase signals are combined, in a manner as described below, to generate a phase tune signal $\Phi_{TUNE} = |\Phi_T(+)| - |\Phi_T(-)|$, which is near or equal to zero under tuned conditions.

When the load impedance across ports 304 and 305 becomes inductive, the voltage waveform leads the current waveform on Main Line 310. In response, the positive phase signal $\Phi_T(+)$ increases, the negative phase signal $\Phi_T(-)$ decreases, and the signal $\Phi_{TUNE}$ increases to a positive value. When the load at ports 304 and 305 becomes capacitive, the voltage waveform lags the current waveform on Main Line 310. In response, the positive phase signal decreases, the negative phase signal increases, and the signal $\Phi_{TUNE}$ decreases to a negative value. The signal $\Phi_{TUNE}$ provides information on the reactive (imaginary) part of the load, being negative for capacitive loads, positive for inductive loads, and zero for resistive loads. The theory and techniques used to construct the phase signals are well known in the art and are described in greater detail below.

A common method for constructing a phase detector from lumped components comprises sampling current and voltage waveforms on Main Line 310 to derive phasor representations of the current and voltage waveforms. One of these phasors is shifted by 90° and the shifted phasor is added to the other phasor to generate a first resultant phasor and subtracted from the other phasor to generate a second resultant phasor. Each resultant phasor is converted to a DC signal by means of a standard diode detector circuit to generate the positive and negative phase signals. The diode detection circuit generates an output voltage which is proportional to the magnitude of the phasor signal.

In Tune Detector 300, the current phasor is shifted by 90° and added to the voltage phasor to generate the resultant phasor for $\Phi_T(-)$, and is subtracted from the voltage phasor to generate the resultant phasor for $\Phi_T(+)$. The construction of these phasors is shown by a phasor diagram at 400 in FIG. 4. Phasor diagram 400 comprises a real axis 401 and an imaginary axis 402, both of which define a two-dimensional cartesian plane to represent complex numbers. The real axis 401 and imaginary axis 402 intersect at an origin point 403. For the purposes of discussion, the current and voltage on Main Line 310 are assumed to be in phase. A phasor proportional to the sampled voltage on Main Line 310 is shown at 410 and a phasor proportional to the sampled current on Main Line 310 is shown at 411. In general, different constants of proportionality are used in scaling the sampled voltage and current phasors 410 and 411, and sampled current phasor 411 is shown with a larger magnitude than sampled voltage phasor 410.

To construct the resultant phasor related to the $\Phi_T(-)$ phase signal, current phasor 411 is rotated by −90° to produce a phasor 421. Phasor 421 is then added to sampled voltage phasor 410, which is shown by a phasor 420, to produce a resultant phasor 422. The magnitude of the negative phase signal $\Phi_T(-)$ is equal to the magnitude of resultant phasor 422. To produce the second resultant phasor, the negative of current phasor 421 is constructed, as shown by a phasor 431. Phasor 431 is then added to sampled voltage phasor 410, which is shown by a phasor 430, to produce a second resultant phasor 432. The positive phase signal $\Phi_T(+)$ is equal to the magnitude of resultant phasor 432. Under tuned conditions, the magnitudes of the phasors 422 and 432, leading to equal magnitudes for the positive and negative phase signals. The summation of the phase signals produces a zero value for the phase tune signal $\Phi_{TUNE}$.

Under inductive loading conditions at port 304, voltage phasor 410 will rotate counterclockwise with respect to current phasor 411. The counter clockwise rotation of voltage phasor 410 is shown by a phasor 416 in FIG. 4. When the rotated voltage phasor 416 is added to current phasors 421 and 431, the resultant phasors 422 and 432 rotate counterclockwise, as shown by phasors 427 and 437, respectively. As a result, the magnitude of phasor 437 increases and the magnitude of phasor 427 decreases. Consequently, the positive phase signal $\Phi_T(+)$ increases while the negative phase signal $\Phi_T(-)$ decreases, and the phase tune signal $\Phi_{TUNE}$ becomes positive. In this manner, the summation of the phase signals produces a positive signal to indicate an inductive load. In a similar manner, a capacitive load rotates voltage vector 410 in a clockwise direction. For reasons of clarity in FIG. 4, the resulting rotations of resultant vectors 422 and 432 are not shown. The capacitive loading results in an increase in magnitude for resultant phasor 422 and a decrease in magnitude for the result phasor 432, resulting in a negative value for $\Phi_{TUNE}$.

Referring now again to FIG. 3, the resultant phasors 422 and 432 are constructed by separate circuits. The circuit for providing the negative phase signal $\Phi_T(-)$ comprises Sampling Line 320, coupling capacitor 324, a 90° phase shifting capacitor 326, a DC-bypass inductor 328, and a Diode Detector 360. Sampling Line 320 is magnetically coupled to Main Line 310. Coupling capacitor 324 is coupled between Main Line 310 and Sampling Line 320, phase shifting capacitor 326 is coupled between first end 321 of Sampling Line 320 and ground, and bypass inductor 328 is coupled between first end 321 and ground. Inductor 328 serves to generate a zero D.C. voltage reference for the alternating currents and voltages on Sampling Line 320. The current flow in Sampling Line 320, which is induced by the magnetic coupling of the current flow in Main Line 310, is directed in an opposite direction to the main current flow in Main Line 310. This is shown in FIG. 3 by the reference current arrow $I_{RF}$ for Main Line 310 and $I_{S2}$ for Sampling Line 320.

Without loss of generality, the current reference $I_{RF}$ can be set to correspond to current phasor 411, shown in FIG. 4. The oppositely directed current $I_{S2}$ in Sampling Line 320 produces a phasor voltage on phase shifting capacitor 326 which has a magnitude equal to the current phasor 411 but has a phase value of −90°. The phasor voltage induced by current $I_{S2}$ on capacitor 326 corresponds to current phasor 421 shown in FIG. 4. The phasor voltage on Main Line 310 is then added to the voltage on capacitor 326 via a voltage divider formed by capacitors 324 and 326. By the principle of linear superposition, these voltages may be added together to generate a phasor corresponding to resultant phasor 422. The resultant phasor corresponding to 42 is provided at second end 322 of Sampling Line 320 and detected by Diode Detector 360.

Diode Detector 360 comprises a diode 361, a limiting resistor 362, a node 363, a holding capacitor 364, a filtering inductor 365 and a filtering capacitor 366. The components of Diode Detector 360 are arranged in a topology that is identical to that shown in Diode Detector 350. The cathode terminal of diode 361 serves as the input of Detector 360 and is coupled to second end 322. The coupled terminals of filtering inductor 365 and filtering capacitor 366 serve as the output of Detector 360 and are coupled to port 308 to provide the $\Phi_T(-)$ signal.

In a similar manner, the circuit for providing the positive phase signal $\Phi_T(+)$ comprises Sampling Line 330, coupling capacitor 334, a 90° phase shifting capacitor 336, a DC-bypass inductor 338, and a Diode Detector 370. Sampling Line 330 is magnetically coupled to Main Line 310. Coupling capacitor 334 is coupled between Main Line 310 and Sampling Line 330, phase shifting capacitor 336 is coupled between second end 332 of Sampling Line 330 and ground, and bypass inductor 338 is coupled between second end 332 and ground. Inductor 338 serves to generate a zero D.C. voltage reference for the alternating currents and voltages on Sampling Line induced by the magnetic coupling of the current flow in Main Line 310, is directed in an opposite direction to the main current flow in Main Line 310. This is shown in FIG. 3 by the reference current arrow $I_{RF}$ for Main Line 310 and $I_{S3}$ for Sampling Line 330.

In a similar manner, the current $I_{S3}$ in Sampling Line 320 produces a phasor voltage on phase shifting capacitor 326 which has a magnitude equal to the current phasor 411 but has a phase value of $-270°$ ($+90°$). The $-270°$ phase shift is produced by a $-180°$ phase shift due to the direction of reference current arrow $I_{S3}$ away from capacitor 336 and a $-90°$ phase shift by capacitor 336. The phasor voltage induced by current $I_{S3}$ on capacitor 336 corresponds to current phasor 431 shown in FIG. 4. The phasor voltage on Main Line 310 is then added to the voltage on capacitor 336 via a voltage divider formed by capacitors 334 and 336. By the principle of linear superposition, these voltages may be added together to generate a phasor corresponding to resultant phasor 432. The resultant phasor corresponding to 432 is provided at first end 331 of Sampling Line 330 and detected by Diode Detector 370.

Diode Detector 370 comprises a diode 371, a limiting resistor 372, a node 373, a holding capacitor 374, a filtering inductor 375 and a filtering capacitor 376. The components of Diode Detector 370 are arranged in a topology that is identical to that shown in Diode Detector 340. The anode terminal of diode 371 serves as the input of Detector 370 and is coupled to first end 331. The coupled terminals of filtering inductor 375 and filtering capacitor 376 serve as the output of Detector 370 and are coupled to port 309 to provide the $\Phi_T(+)$ signal.

Thus far, a discussion of the means for generating the amplitude and phase signals has been given. These signals are provided to Controller 50. Means within Controller 50 combines the amplitude signals to form the amplitude tune signal $A_{TUNE} = |A_T(+)| - |A_T(-)|$ and the phase signals to form $\Phi_{TUNE} = |\Phi_T(+)| - |\Phi_T(-)|$. It may be appreciated that Tune Detector 300 and the combining means within Controller 50 comprise means for generating $A_{TUNE}$ as being related to the difference of the input voltage waveform amplitude and the product of the characteristic impedance and the input current waveform and for generating a $\Phi_{TUNE}$ as being related to the phase difference between the input voltage and current waveforms. Additionally, the positive amplitude signal $A_T(+)$ provides a signal related to the input voltage amplitude and the negative amplitude signal $A_T(-)$ provides a signal related to the input current amplitude. In some embodiments of the present invention, the amplitude signals $A_T(+)$ and $A_T(-)$ are used to normalize the tune signals $A_{TUNE}$ and $\Phi_{TUNE}$, e.g., $A_{TUNE}/|A_T(+)|$ or $A_{TUNE}/|A_T(-)|$. As discussed below, such a normalization process reduces the variations of the tune signals with respect to changes in the power level of the signal generator.

It may be appreciated that circuit means other than those used by Tune Detector 300 may be used to generate the amplitude, phase, and tune signals of Tune Detector 40. For example, the transformer means and circuit means detailed in U.S. Pat. No. 4,679,007 issued to Reese, et al. may be used to generate the tune signals. For millimeter frequencies well above 13.56 Mhz, distributed sampling means may also be employed to generate these signals.

An exemplary embodiment of Controller 50, shown in FIG. 1, is shown at 500 in FIG. 5. Controller 500 comprises four power supply terminals 501-504 for receiving power at 5 volts, 15 volts, $-15$ volts, and 0 volts respectively. Ports 501-504 correspond to ports 51-54 of Controller 50 shown in FIG. 1. Controller 500 further comprises ports 506-509 for receiving the amplitude and phase signals $A_T(+)$, $A_T(-)$, $\Phi_T(+)$, and $\Phi_T(-)$ from Tune Detector 40, shown in FIG. 1. Ports 506-509 correspond to ports 56-59 of Controller 50. Additionally, Controller 500 comprises six ports 510-512 and 514-516 for receiving and transmitting information to Matching Network 20, shown in FIG. 1. Ports 510-512 correspond to ports 60-62 of Controller 50 and ports 514-516 correspond to ports 64-66 of Controller 50. Controller 500 further comprises a UART bus port 505 for receiving and transmitting information to a user interface, such as that shown at 2400 in FIG. 1, using asynchronous serial data communication protocols. UART bus port 505 of Controller 500 corresponds to UART bus port 55 of Controller 50.

To process the signal information from Tune Detector 40 and to direct the tuning of Matching Network 20, Controller 500 comprises a Digital Microprocessor 520, which is supported by an 8-bit Data Bus 521, a 16-bit Address Bus 522, an Octal Latch 540, and a Memory Unit 560. In the preferred embodiment of Controller 500, Microprocessor 520 comprises a PCB83C552 processor manufactured by The Philips Corporation. This processor has been specifically designed for data acquisition applications. Along with standard microprocessor functions, Microprocessor 520 includes an analog-to-digital converter, a pulse-width-modulation timebase generator, bi-directional digital I/O ports, and a universal asynchronous receive and transmit unit (UART), all under the control of the microprocessor within Microprocessor 520. The integration of all these facilities within a single microprocessor package greatly simplifies the design of many data-acquisition and control systems.

To support the memory needs of Microprocessor 520, Memory Unit 560 comprises a segment of volatile random access memory (RAM) for storing data processed by Microprocessor 520 and a segment of read only memory (ROM) for storing the program instructions, or control words, that direct the operations of Microprocessor 520. These two memory segments share a common data bus and a common address bus but are selected by different control signals. The RAM segment is selected for reading by a RD signal generated by Microprocessor 520 and selected for writing by a WR signal generated by Microprocessor 520. The ROM segment is selected for reading by a PSEN (Program Store ENable) signal generated by Microprocessor 520. A write signal is not required for the ROM segment. At most, only one of the signals RD, WR, and PSEN are active.

In terms of standard microprocessor functions, Microprocessor 520 comprises an address bus port 525 coupled to Address Bus 522, an address/data port 526 coupled to Data Bus 521, a write signal port 523 (WR), a read signal port 524 (RD), a program-store enable signal port (PSEN), and an address/data select signal port (ALE). To reduce the number of pins required in the packaging of the PCB83C552 microprocessor, the lowest 8 address lines are multiplexed with the data lines of the microprocessor on port 526, as is often done in the microprocessor art. In operation, Microprocessor 520 first outputs an address value on ports 525 and 526. The address lines from port 526 are fed into the D-inputs 541 of Octal Latch 540 to be latched and output on the Q-outputs 542 of Octal Latch 540. The ALE signal present at port 527 of Microprocessor 520 is coupled to the clock port 543 of Octal Latch 540 and is used to trigger the latching of the address lines. After the address lines have been latched, Microprocessor 520 then outputs the data lines on port 526. At this point, Data Bus 521 and Address Bus 522 have correct stable values for the current address cycle. The Microprocessor then outputs one of the signals WR, RD, or PSEN on ports 523, 524, and 528, respectively, to specify a RAM read, a RAM write, or a ROM program read operation, respectively. The multiplexing of the lowest 8 address lines via Octal Latch 540 is well known to the art and is commonly used where pin count is critical.

Memory Unit 560 is used as a means for storing the program instructions and random access memory (RAM) needed to operate Microprocessor 520. Memory Unit 560 comprises a data bus port 561 coupled to Data Bus 521, an address Port 562 coupled to Address Bus 522, a write enable port 563 coupled to write port 523, a read-enable port 564 coupled to read port 524, and a program-store enable port 568 coupled to program-store enable port 528. Memory Unit 560 comprises several byte-wide RAM chips for the RAM segment and ROM chips for the ROM (program instruction) segment. To provide the read and write function to the chips, the WR and RD signals are fed to each of the RAM memory chips and the PSEN signal is fed to each of the ROM memory chips. The data pins of each memory chip is coupled to Data Bus 521 via port 561 and the address pins of each chip are coupled to the least significant bits of the Address Bus 522 via port 562. The more significant bits on the Address Bus 522 are used to select one of the RAM chips and one of the ROM chips at a time. The activation of one of the RD, WR, and PSEN signals then chooses one of the RAM and ROM chips selected by the address on the Address Bus 522.

The construction of Memory Unit 560 is well known within the microprocessor art and can be found in many standard microprocessor mother board products. The construction of Memory Unit 560 and the use of Octal Latch 540 and the multiplexing of address and data lines can be found in many textbooks on microprocessor design and in many application notes provided by microprocessor manufacturers. Thus, the finer details of a design for an exemplary memory unit 560 and Octal Latch 540 are not discussed herein.

To support many of its processes, Microprocessor 520 comprises an analog-to-digital conversion bus 530, two pulse-width-modulation signal ports 531 and 532, a bi-directional and digital I/O bus 534, and an UART bus port 536. Analog-to-digital bus 530 comprises eight analog input signals labeled ADC[7]-ADC[0], each of which are multiplexed by Microprocessor 520 to be separately sampled by an analog-to-digital converter within Microprocessor 520. Pulse-width-modulation ports 531 and 532 couple out pulse-width-modulation signals generated by the PWM facility within Multiplexer 520. The PWM facility comprises three registers, one for storing a common frequency period for each signal present on ports 531 and 532, one register for storing the pulse-width duration, or duty-cycle, of pulses appearing on port 531, and a register for storing the width of pulses appearing on port 532. These registers may be written to and read from Microprocessor 520 to set the period and pulse width values for the signals on ports 531 and 532. Bi-directional I/O Bus Port 534 provides standard digital input and output facilities for Microprocessor 520, as is well known within the art. For controlling the information on port 534, Microprocessor 520 comprises a register containing a byte which indicates the direction of information flow (i.e. either input or output) and a register indicating the value of the data being sent or received by port 534. Each of these registers is internal to Microprocessor 520, and can be read and written to by Microprocessor 520.

To support its power and timing needs, Microprocessor 520 includes an analog voltage reference port 536 for receiving a stable voltage needed by the analog-to-digital conversion facility, a standard 5 volt power-supply port 537 ($V_{CC}$) for receiving power for its digital components, an analog power-supply port 538 ($AV_{CC}$) for receiving power for its analog components, and a clock input 539 for receiving a standard clock signal needed for sequencing the instruction operations. A standard voltage reference circuit 590 is coupled to voltage reference port 536 to provide a stable source of voltage. Voltage reference 590 comprises a Zener diode, a resistor, and a voltage buffer configured in a manner well known to the art. Port 537 is coupled to port 501 for receiving power from a 5 volt power source. Analog voltage port 538 is coupled to port 501 via a resistor 593 and is filtered by a capacitor 594, as well known to the art. Clock input port 539 is coupled to the output of a standard oscillator clock source 595, in a manner well known to the art.

Motor position signals from Matching Network 20 are received on ports 510 and 514 and are coupled directly to the first and third signal lines of A/D Conversion Bus Port 530 to be sampled by the analog-to-digital converter in Microprocessor 520. The amplitude and phase signals present on ports 506 through 509 are coupled to A/D Bus Port 530 via a Null Adjuster 570 Null Adjuster 570 performs a simple scaling on the amplitude and phase signals before these signals are coupled to Microprocessor 520 for conversion to digital representations. A central purpose of Null Adjuster 570 is to scale the amplitude signals such that they are equal in magnitude at the tune point so that their sum is substantially zero. Likewise, another central purpose of Adjuster 570 is to scale the phase signals such that they are substantially equal in magnitude at the tune point so that their sum is zero under this condition. The incorporation of Null Adjuster 570 allows for a wider range of manufacturing tolerances in Tune Detector 20 and is not an essential element of the present invention.

Null Adjuster 570 comprises ports 576-579 coupled to ports 506-509, respectively, for receiving the amplitude and phase signals. Adjuster 570 further comprises output ports 580-583 for transmitting scaled amplitude and phase signals to A/D Converter Bus Port 530 of Microprocessor 520. The scaled negative amplitude signal $A_T'(-)$ is provided on port 580, which is coupled to line ADC[0] of Bus 530. The negative scaled phase signal $\Phi_T'(-)$ is provided on port 581, which is coupled to line ADC[2] of port 530. The positive scaled amplitude signal $A_T'(+)$ is provided at port 582, which is coupled to line ADC[5] of Bus Port 530. The positive scaled phase signal $\Phi_T'(+)$ is provided on port 583, which is coupled to signal line ADC[7] of Bus Port 530.

To scale the amplitude and phase signals from the tune detector of the present invention, Null Adjuster 570 receives digital instructions from Microprocessor 520 via Address Bus 522 and Data Bus 521. Specifically, Null Adjuster 570 comprises an Address Bus Port 585 coupled to Address Bus 522, a Data Bus Port 586 coupled to Data Bus 521, and a write enable signal port 587 (WR ) coupled to port 523 for receiving write signals from Microprocessor 520. These ports and couplings provide means for Microprocessor 520 to communicate scaling values to Null Adjuster 570 to control its scaling of the amplitude and phase signals In this respect, Null Adjuster 570 may comprise one or more digitally programmable signal scaling units to provide the scaling of the amplitude and phase signals To power the internal components within it, adjuster 570 comprises power ports 571-574 coupled to ports 501-504 respectively. Ports 571-574 receive power and ground signals at 5 V, 15 V, −15 V, and ground. An exemplary embodiment of Null Adjuster 570 is described below with reference to FIG. 6.

The operation of Controller 500 is directed by a control process stored in Memory Unit 560 acting in combination with Microprocessor 520. Specifically, this control process directs Microprocessor 520 to sample the amplitude and phase signals present on A/D Converter Bus Port 530. The amplitude and phase signals are converted to digital values in Microprocessor 520 and these values are then stored in Memory Unit 560. The control process also directs Microprocessor 520 to store previous digital values of these signals with respect to time so that their variations, or slope changes, may be used by the control process. The control process also uses information received on ports 510 and 514, which provide the motor positions of the variable components in Matching Network 20, shown in FIG. 1. Additionally, the control process directs Microprocessor 520 to issue control instructions on ports 511 and 512 for the first servomotor, and on ports 515 and 516 for the second servomotor. An exemplary control process for controller 500 is discussed below and shown in series of flow diagrams.

Although in the preferred embodiment of Controller 500, Microprocessor 520 comprises a PCB83C552 processor manufactured by The Philips Corporation, it may be appreciated that other microprocessors may be used and that the present invention is not limited to the use of any specific microprocessor. It may be further appreciated that the data acquisition and control facilities provided by the PCB83C552 processor may be implemented by other analog and digital circuitry and/or components known in the data-acquisition art.

An exemplary embodiment of Null Adjuster 570 is shown at 600 in FIG. 6. Null Adjuster 600 comprises ports 601-604 for receiving power at 5 V, 15 V, −15 V, and ground. Adjuster 600 further comprises ports 606-609 for receiving the amplitude and phase signals $A_T(+)$, $A_T(-)$ $\Phi_T(+)$, and $\Phi_T(-)$, respectively, and comprises ports 610-616 for transmitting the scaled amplitude and phase signals $A_T'(-)$, $\Phi_T'(-)$, $A_T'(+)$, and $\Phi_T'(+)$, respectively. For receiving programming instructions from Microprocessor 520, Adjuster 600 comprises an address bus port 615 for receiving address signals, a data bus Port 616 for receiving data signals, and a write port 617 for receiving the write enable control signal from Microprocessor 520.

Null Adjuster 600 in a preferred embodiment functions to scale the negative amplitude and phase signals $A_T(-)$ and $\Phi_T(-)$ while transmitting the positive amplitude and phase signals unaltered. To scale the negative amplitude and phase signals, Adjuster 600 comprises a Dual 8-bit Multiplying Digital/Analog Unit 620, an inverter 650, and two differential amplifiers 660 and 670. D/A Unit 620 comprises two independent digital/analog scaling units which are used to scale the negative amplitude and negative phase signals, respectively. The positive amplitude and phase signals present on ports 606 and 608 are coupled directly to output ports 612 and 613. The Multiplying D/A Unit is preferably an AD 7528 manufactured by Analog Devices, Inc.

Multiplying D/A Unit 620 comprises a first analog input 621 coupled to port 609 for receiving the negative amplitude phase $\Phi_T(-)$ and a second analog input port 622 coupled to port 607 for receiving the negative amplitude signal $A_T(-)$. Multiplying D/A Unit 620 receives instructions for multiplying each of the signals present on ports 621 and 622 by an 8-bit scalar value ranging from $00_H$ to $FF_H$. If a signal is scaled by the scalar value 00, then its value is reduced to zero. If a signal is scaled by the scaler value $FF_H$, then its value is scaled by a factor near unity (255/256). The scaling of the signals with values between $00_H$ and $FF_H$ is substantially linear with the hexadecimal value.

The scaled value of the signal present on port 621 is coupled to output port 631, and the scaled value of the signal on port 622 is coupled to output port 632. The scalar values for the input signals are stored in two internal registers of Multiplying D/A Unit 620. These values are placed in Multiplying D/A Unit 620 via a 1-bit address port 623, a chip-select port 624, a write-enable port 625, and an 8-bit data bus port 626. Address port 623 is coupled to the first address line A[0] of port 615. Chip-enable port 624 is coupled to the sixteenth bit A[15] of address bus port 615 via inverter 650. Write-enable port 625 is coupled to write-enable port 617, and data bus port 626 is coupled to data bus port 616.

To set a scalar value for either multiplying unit, Microprocessor 520 first activates address line A[15] with a logic "high" signal, which in turn provides a logic "low" signal at port 624 and enables Multiplying D/A Unit 620. Microprocessor 520 then selects one of the independent multiplying units by providing a logic "low" signal on Port 623 to specify the first multiplying unit and a logic "high" signal to specify the second multiplying unit. Microprocessor 520 then couples a scalar value to data port 626 for the selected unit and then issues a write command by coupling a logic "low"

signal to write-enable port 625. In this manner, Microprocessor 520 is able to scale the analog signals present on ports 621 and 622 by selected scalar values.

Multiplying D/A Unit 620 further comprises a power port 629 for receiving a supply of power at 5 V, a digital ground port 627 for providing a ground reference for the digital components within Multiplying D/A Unit 620, and an analog ground unit 628 for receiving a ground reference for the analog components within Multiplying D/A Unit 620. Multiplying D/A Unit 620 comprises two output feedback signal ports 633 and 634 which are associated with the signals on output ports 631 and 632, respectively. The function of output feedback ports 633 and 634 are explained below in further detail.

In Multiplying D/A Unit 620, the scaling of each input signal on ports 621 and 622 is provided by a separate digital/analog scaling unit internal to the Unit 620. The scaling is accomplished in each scaling unit of the Analog Devices AD7533 by a standard 2R-R resistor ladder network, as is well known in the digital-to-analog signal conversion art. Depending on the digital scaling value presented to the unit, specific branches of the 2R-R ladder network are coupled into the ladder network. The 2R-R ladder functions to convert each input voltage on ports 621 and 622 to a current which is modulated, or scaled, by the corresponding digital scaling value. The scaled currents corresponding to the voltage inputs on ports 621 and 622 are output by Multiplying D/A Unit 620 on ports 631 and 632, respectively.

The scaled currents on ports 631 and 632 are then converted to voltages by differential amplifiers 660 and 670, respectively. A feedback resistor coupled between the output and inverting-input of each differential amplifier is required for the current-to-voltage conversion. The feedback resistors are provided within Multiplying D/A Unit 620 so as to be matched with the resistors of the 2R-R ladder networks. The feedback resistor for amplifier 660 is present between ports 631 and 633 and the feedback resistor for amplifier 670 is present between ports 632 and 634. As shown in FIG. 6, the ports for these feedback resistors are appropriately coupled to the inverting and output terminals of amplifiers 660 and 670. As a consequence of the current-to-voltage conversion provided by amplifiers 660 and 670, the scaled signals $\Phi_T'(-)$ and $A_T'(-)$ are positive in value and are opposite in sign to their original signals $\Phi_T(-)$ and $A_T(-)$, respectively. This, however, does not present a problem since Microprocessor 520 of FIG. 5 is enabled to perform a subtraction operation to compute the tune signals $A_{TUNE}$ and $\Phi_{TUNE}$.

It may be appreciated that while Null Adjuster 600 provides 8-bit scaling, the Digital-to-Analog converter in Microprocessor 520 comprises 10-bits of resolution. As a consequence, Null Adjuster 600 may not always provide fully scaled amplitude and phase signals and the resulting tune signals $A_{TUNE}$ and $\Phi_{TUNE}$ may not be substantially zero under tuned conditions. The resolution mismatch may be acceptable in applications not requiring great accuracy for the tuned condition. In applications where accuracy is critical, one can substitute a higher resolution null adjuster. Alternatively, one can define two digital quantities $A_{NULL}$ and $\Phi_{NULL}$ within Microprocessor 520 to account for the resolution mismatch. Quantities $A_{NULL}$ and $\Phi_{NULL}$ are subtracted from the tune signals $A_{TUNE}$ and $\Phi_{TUNE}$, respectively, to compensate for the resolution mismatch. In effect, these quantities may be viewed as defining the zero level for their corresponding signals. In cases where accuracy is not critical, $A_{NULL}$ and $\Phi_{NULL}$ are each set to zero.

Although exemplary Null Adjuster 600 comprises digitally controlled D/A multiplying units to scale the tune signals, it may be appreciated that other means comprising analog and/or digital components well known in the art may be used and that the present invention is not limited to the use of any specific circuitry. For example, the scaling function for a single tune signal may be provided by a single potentiometer configured as a standard voltage divider.

Preferred embodiments for Matching Network 20, Tune Detector 40 and Controller 50, shown in FIG. 1, have thus far been discussed. As mentioned previously, Controller 50 comprises load-matching control means for sampling the phase and amplitude signals from Tune Detector 40 and for adjusting the variable reactive components in Matching Network 20. Before covering the load-matching control means in greater detail, the principles of operation for Matching Circuits 220, 220a and 220b in Matching Network 200, shown in FIGS. 2, 2A and 2B, are discussed. In addition, this discussion addresses the relationships between the variable reactive components and the outputs of Tune Detectors 40 and 300.

An impedance diagram for the impedance-match construction employed by Matching Networks 20 and 200 is shown at 700 in FIG. 7. Impedance diagram 700 comprises a standard Smith Chart 705 and an impedance match construction comprising four impedance points 720, 724, 728, and 732. As well known to the art, Smith Chart 705 comprises a plurality of circles, each representing a locus of constant resistance (real part of impedance), and a plurality of arcs, each representing a locus of constant reactances (imaginary part of impedance). Smith Chart 705 comprises a short point 710 indicating zero resistance and zero reactance, an open point 712 indicating infinite resistance, and a characteristic-impedance point 714 indicating a characteristic resistance of $R_0$ ohms and zero reactance. Without loss of generality, $R_0$ is taken as 50 ohms. As well known to the art, the circles and arcs of Smith Chart 705 have value indications, such as 0.2, 0.4, etc., which must be multiplied by the characteristic resistance $R_0$ to obtain the impedance of the points specified by the circles and arcs.

As well known to the art, the Smith impedance chart is complimented by a Smith admittance chart comprising circles of constant conductance and arcs of constant susceptance, which provides a similar representation for admittance. (Conductance is the numerical reciprocal of resistance, and susceptance is the numerical reciprocal of reactance.) The admittance chart is identical in nature to the impedance chart except that it is the mirror reflection of the impedance chart across a horizontal line passing through characteristic-impedance point 714. As also well known to the art, the Smith admittance and impedance charts are often combined together in a dual chart format. For ease of presentation, however, this dual format is not used in FIG. 7.

The impedance of the parallel plate electrodes in the gas-plasma etching chamber is represented on Smith Chart 705 by impedance point 720. A typical value of this impedance shown by point 720 is approximately 20-j98 ohms. The object of Matching Circuit 220 shown in FIG. 2 is to "rotate" impedance point 720 into the characteristic-impedance point 714 by a construction of three arcs. This construction is accomplished by a series of three impedance-rotation operations performed by capacitor 232 ($C_2$), inductor 226 ($L_\pi$), and capacitor 231 ($C_1$). As well known to the art, the parallel combination of capacitor 232 ($C_2$) with the load impedance rotates point 720 to impedance point 724 along a circle of constant conduction which has a point in common with short point 710. The series placement of inductor 226 ($L_\pi$) rotates impedance point 724 into impedance 728 along a circle of constant resistance (5 ohms) which has a point in common with open point 712. The shunt combination of capacitor 231 ($C_1$) rotates impedance point 728 into impedance point 732 along a second circle of constant conductance which has a point in common with short point 710. By judicious choice of the values for capacitors $C_1$ and $C_2$, impedance 732 can be made to coincide with characteristic-impedance point 714, thereby providing a match between the signal generator and the load.

Given no changes in capacitance values, the position of impedance point 732 will vary as the position of impedance point 720 varies. An object of the automatic matching network of the present invention is to vary the values of the reactive components, specifically $C_1$ and $C_2$, to compensate for the variations in impedance point 720 such that impedance point 732 always coincides with characteristic-impedance point 714. As the value of the capacitance $C_1$ and $C_2$ increase and decrease, their respective arc lengths increase in length and decrease in length, respectively. For example, as capacitance $C_1$ increases, the arc length between impedance point 728 and 732 increases in the direction indicated by the arrow of the arc and in a circular trajectory. Likewise, as capacitance $C_2$ increases, the length of the arc between impedance points 720 and 724 increases in the direction indicated by the arrow of the arc and in a circular trajectory. In this manner, adjustments to the values of capacitors $C_1$ and $C_2$ may be used to position impedance point 732 to coincide with characteristic-impedance point 714.

For highly capacitive loads, such as those loads having impedance points in the third quadrant of Smith Chart 705, the impedance-rotation operation provided by capacitor $C_2$ is not needed. Instead, the impedance rotation provided by the inductance $L_\pi$ is sufficient to rotate the load impedance into the second quadrant of Smith Chart 705 where Capacitor $C_1$ can further rotate the load impedance to the characteristic-impedance point 714. To provide this matching over a large range of load impedance values, the fixed inductor $L_\pi$ should be replaced by a variable inductor. As shown in FIG. 2A, Matching Circuit 220a removes capacitor $C_2$ and replaces $L_\pi$ by variable inductor 232a ($L_2$). Matching Circuit 220a retains variable Capacitor $C_1$.

The operation of Matching Circuit 220a is similar to the operation of Matching Circuit 220. For the purposes of discussion, the load impedance point is now shifted to point 724. Given the impedance-rotation operations for $C_1$ and $L_\pi$ mentioned above, impedance 732 can be made to coincide with characteristic-impedance point 714 with the proper choice of values for capacitor 231a ($C_1$) and inductor 232a ($L_2$). Given no changes in values for the variable components, the position of impedance point 732 will vary as the position of impedance point 724 varies. As in Matching Circuit 220, the values of the variable components in Circuit 220a are changed to compensate for the variations in impedance point 724 such that impedance point 732 always coincides with characteristic-impedance point 714. As the values of $C_1$ and $L_2$ increase and decrease, their respective arc lengths increase in length and decrease in length, respectively. As the capacitance of capacitor 231a ($C_1$) increases, the arc length between impedance point 728 and 732 increases in the direction indicated by the arrow of the arc and in a circular trajectory. Likewise, as the inductance of inductor 232a ($L_2$) increases, the length of the arc between impedance points 724 and 728 increases in the direction indicated by the arrow of the arc and in a circular trajectory. In this manner, adjustments to the values of capacitor $C_1$ and inductor $L_2$ may be used to position impedance point 732 to coincide with characteristic-impedance point 714.

The relationship between Smith chart 705 and the $A_{TUNE}$ and $\Phi_{TUNE}$ signals generated by Tune Detectors 40 and 300 may best be explained by a zero-amplitude line 750 passing vertically through characteristic-impedance point 714 and a zero-phase line 760 passing horizontally through characteristic-impedance point 714. Zero-amplitude line 750 contains the locus of all impedance points which have a real part equal to $R_0$ ohms, 50 ohms in this case. With an impedance along this line, the magnitude of the current phasor will be equal to 1/50th of the magnitude of the voltage phasor across the impedance. To the left of zero-amplitude line 750, the resistance increases, causing the magnitude of the current phasor to decrease. This causes an increase in the signal $A_{TUNE}$ since the voltage contribution is now larger than the current contribution in the $A_{TUNE}$ signal. To the right of zero-amplitude line 750, the resistance decreases and the magnitude of the current phasor increases. The $A_{TUNE}$ signal is negative in this region since the current contribution is greater than the voltage contribution.

Zero-phase line 760 comprises the locus of all impedance points having imaginary parts equal to zero. Impedance points on zero phase line 760 produce current and voltage waveforms (phasors) which are in phase. An impedance point above zero-phase line 760 contains a positive imaginary value while an impedance point below zero-phase line 760 contains a negative imaginary part. Above zero-phase line 760, the load is inductive and causes the $\Phi_{TUNE}$ signal to become positive as previously discussed in FIG. 4. Below line 760, the load is capacitive causing the voltage to lag the current in the load and causing the $\Phi_{TUNE}$ signal to become negative, as discussed previously in regard to FIG. 4.

Zero-phase line 760 and zero-amplitude line 750 are perpendicular to one another and intersect at the characteristic-impedance point 714. As such, the signals $A_{TUNE}$ and $\Phi_{TUNE}$ provide a set of orthogonal metric variables, i.e., an orthogonal cartesian plane, by which the deviation of impedance point 732 from the characteristic-impedance point 714 can be measured. The measurement of the deviation in this way provides the directional information needed for adjusting the component values of the variable components, e.g., variable capacitors $C_1$ and $C_2$, to reduce the deviation so as to provide a match condition between the signal generator and the load.

The task of constructing a control process for adjusting the variable components to reduce the deviation o point 732 from point 714 could be greatly simplified if the motion of point 732 with respect to the changes in variable components $C_1$ and $C_2$ ($L_2$) followed the orthogonal nature of Lines 750 and 760. In other words, the task would be greatly simplified if the changes in variable component $C_1$ moved point 732 perpendicular to one of Lines 750, 760 and the changes in variable component $C_2$ ($L_2$) moved point 732 perpendicular to the other of Lines 750, 760. Unfortunately, the circular nature of the rotations on Smith Chart 705 produced by the reactive components (i.e., $C_1$, $C_2$, $L_2$, and $L_\pi$) preclude such an orthogonal relationship.

Instead, the present invention uses an alternate control means for adjusting the variable components to converged impedance point 732 to characteristic-impedance point 714. The alternate control means is explained in the context of the matching Pi-network of Matching Circuit 220. It, however, may be appreciated that the alternate control means is applicable to the L-network of Matching Circuits 220a and 220b. To apply the following teachings to Circuit 220a, one applies the statements made with respect to capacitor 232 ($C_2$) of Circuit 220 to inductor 232a of Circuit 220a and applies the statements made with respect to capacitor 231 ($C_1$) of Circuit 220 to capacitor 231a ($C_1$) Circuit 220a.

The alternate control means comprises a dominant control loop and a sub-dominant control loop. The dominant control loop comprises means for adjusting capacitor 232 ($C_2$) such that the phase signal $\Phi_{TUNE}$ is driven towards zero for any value of capacitance $C_1$ of capacitor 231. The sub-dominant control loop comprises means for adjusting capacitor 231 ($C_1$) such that the amplitude signal $A_{TUNE}$ is driven towards zero.

The sub-dominate control loop operates indirectly through the dominate control loop to effect changes in the $A_{TUNE}$ signal. To effect a reduction in the magnitude of $A_{TUNE}$, for example, the sub-dominate control loop instructs an adjustment in the first variable component $C_1$ which increases the magnitude of $\Phi_{TUNE}$. The dominate control loop then instructs an adjustment in the second variable component $C_2$ which decreases the magnitudes of both the $\Phi_{TUNE}$ and $A_{TUNE}$ signals. To facilitate the indirect operation, adjustments to the first variable component (capacitor 231, $C_1$) are done at a much slower rate than the adjustments to the second variable component (capacitor 232, $C_2$). It has been found empirically that this alternative control means provides the greatest reliability and the greatest range of tuning, i.e., the region of largest area on Smith Chart 705 in which point 732 will converge to characteristic-impedance point 714. The load-matching control means of the present invention implements the alternative control means by means of a first adjustment means for adjusting the component value of the first variable component (capacitor 231, $C_1$) under the control of the sub-dominate control loop and a second adjustment means for adjusting the component value of the second variable component (capacitor 232, $C_2$) under the control of the dominate control loop.

The operation of the control principle and load-matching control means may be better comprehended by the introduction and discussion of an exemplary Tuning-Curve Set shown at 800 in FIG. 8. Set 800 comprises an exemplary Amplitude-Tuning Curve 801 having an $A_{TUNE}$ characteristic 811 plotted as a function of the capacitance value of $C_1$ (M1 position) and an exemplary Phase-Tuning Curve 802 having phase an $\Phi_{TUNE}$ characteristic 812 plotted as a function of the capacitance value of $C_2$ (M2 position). Amplitude-Tune Curve 801 comprises a zero-level indicator 803 for indicating the value of $A_{NULL}$ and Phase-Tune Curve 802 comprises a zero-level indicator 804 for indicating the value of $\Phi_{NULL}$.

Characteristics 811 and 812 each comprise a generally sinusoidal form having a positive peak, a negative peak, and two zero-crossings. Amplitude characteristic 811 comprises a first zero crossing 821, a second zero crossing 831, a positive peak 841, and a negative peak 851. Phase characteristic 812 comprises a first zero crossing 822, a second zero crossing 832, a positive peak 842, and a negative peak 852. Zero crossing 831 and 832 correspond to the tuned condition where impedance point 732, shown in FIG. 7, coincides with characteristic-impedance point 714. Zero crossings 821 and 822 correspond to false tuning conditions which may occur due to limitations in Tune Detector 300, negative resistance loads (i.e., active loads), or other conditions.

The path which point 732 transverses on Smith Chart 705 during the tuning operation of the load matching means is referred to as a tuning trajectory. An exemplary tuning trajectory for point 732 is shown at 740 in FIG. 7. Trajectory 740 begins at point (a) with the capacitances of capacitors 231 ($C_1$) and 232 ($C_2$) near their maximum values. Trajectory 740 progresses through points (b), (c), (d), and (e) as the load-matching control means adjusts the values of capacitors 231 and 232. At points (a) and (b), both the $A_{TUNE}$ and the $\Phi_{TUNE}$ signals are negative and the capacitance values of both $C_1$ and $C_2$ are reduced in value. At points (c)-(e), the $A_{TUNE}$ signal is positive and the $\Phi_{TUNE}$ signal is negative. At these points, the capacitance of $C_1$ is increased and the capacitance of $C_2$ is decreased. The points (a)-(e) of trajectory 740, shown in FIG. 7, are correlated on Tuning Curves 801 and 802 with the corresponding notations (a)-(e) and the increases and decreases may be correlated with the sign of the tune signals.

In one embodiment of the present invention, the first and second adjustment means under the control of the load matching means adjust the component values of the first and second variable components, e.g. capacitors 231 and 232, based on the sign of the $A_{TUNE}$ and $\Phi_{TUNE}$ signals. The second adjustment means increases the value of capacitor 232 ($C_2$) when the $\Phi_{TUNE}$ signal is positive and decreases the value of capacitor 232 ($C_2$) when the $\phi_{TUNE}$ signal is negative. The first adjustment means increases the value of capacitor 231 ($C_1$) when the $A_{TUNE}$ signal is positive and decreases the value of capacitor 231 ($C_1$) when the $A_{TUNE}$ signal is negative. The operation of the first and second adjustment means may be visually verified on Tuning-Curves 801 and 802 near the zero crossings 831 and 832. Impedance point 732 is guided to characteristic-impedance point 714 provided that the impedance point 732 does not enter either of the regions to the left of false-tune crossings 821 and 822, shown in FIG. 8.

In the preferred embodiment of the present invention, the loadmatching control means comprises a Setup Means for initialization, a Convergence Means for maintaining a tuned condition, an Adjustment Means responsive to the tuning signals for adjusting the variables components, and an Increment Means for incrementing the positions of the servomotors. In one embodiment of the present invention, the Increment Means includes a Step-Width Control Means for varying the magnitude of the motor position increments. Exemplary embodiments of each of these means are provided and discussions of their operations are detailed below with reference to a series of flow diagrams. As mentioned above, the load-matching control means is preferably implemented by a computer program stored in a Memory Unit 560 running on a Microprocessor 520 in a Controller 500.

A flow diagram of the operation of an exemplary embodiment of the Setup Means is shown at 900 in FIG. 9. The operation of Setup Means 900 begins at block 902 and proceeds to block 904, where it determines if preset values of the variable components have been specified by the user. The preset values are useful in cases where the load has a fixed impedance. If preset values are specified, the variable components are adjusted to the preset values in block 906. Setup Means 900 then tests for the presence of an RF-source signal at block 908. The test may be accomplished, for example, by detecting a minimum value for any of the amplitude and phase signals from Tune Detector 40, shown in FIG. 1. If no RF signal is present, Setup Means 900 waits for the RF-source signal to appear, as shown at block 910.

If the source signal is present, Setup Means 900 tests each variable component to determine if any variable component is t a predetermined end value, as shown at block 912. This test may, for example, be accomplished by comparing the position indication signals present on ports 30 and 34 of Matching Network 20 to predetermined position values corresponding to the end values. If a variable component is at an end value, Setup Means 900 sets these components to reset values, as shown at block 914. The reset values are suitable starting point for a successful tuning trajectory and may, for example, be the maximum values of the variable components.

If the RF-source signal is present, the load matching means causes the system to go to the Convergence Means at block 920. The operation of a first exemplary embodiment of Convergence Means is detailed in a Flow Chart at 1000 shown in FIG. 10. The Convergence Means 'unctions to match the load impedance to the source impedance by adjusting the variable components. The operation of Convergence Means 1000 begins at block 1002 and proceeds to block 1004, where various motor-control parameter and tuning-convergence parameters are obtained. The motor-control parameters are utilized by various adjustment means detailed below. The tuning convergence parameters comprise an amplitude-signal convergence criterion value $A_{TOL}$ and a phase-signal convergence criterion value $\Phi_{TOL}$. Convergence Means 1000 proceeds to block 1006, where the amplitude-signal null level $A_{NULL}$ and the phase-signal null level $\Phi_{NULL}$ are obtained.

The null levels $A_{NULL}$ and $\Phi_{NULL}$ represent the zero-crossing levels and are subtracted from $A_{TUNE}$ and $\Phi_{NULL}$, respectively. The convergence parameters $A_{TOL}$ and $\Phi_{TOL}$ represent the acceptable deviation of the amplitude and phase signals, respectively, from the tuned condition specified by $A_{NULL}$ and $\Phi_{NULL}$, respectively. The acceptable deviation is defined by the two inequalities:

$$|A_{TUNE} - A_{NULL}| < A_{TOL} \quad (1)$$

$$|\Phi_{TUNE} - \Phi_{NULL}| < \Phi_{TOL} \quad (2)$$

Convergence Means 1000 seeks to adjust the variable components to meet both of these inequalities.

Once obtaining the control and convergence parameters, Convergence Means 1000 obtains the present values of $A_{TUNE}$ and $\Phi_{TUNE}$, as shown at a sampling block 1008. In Controller 500, these values are obtained by sampling the amplitude and phase signals present at port 530, by combining $A_{T'}(+)$ and $A_{T'}(-)$ to produce $A_{TUNE}$, and by combining $\Phi_{T'}(+)$ and $\Phi_{T'}(-)$ to produce $\Phi_{TUNE}$, as discussed above. Convergence Means 1000 proceeds to block 1010 to test the deviations of $A_{TUNE}$ and $\Phi_{TUNE}$ from their respective null points, as defined by equations (1) and (2), above. If both deviations are within tolerance, Convergence Means 1000 returns to sampling block 1008 to obtain a new set of signal values. Under tuned conditions, the system idles in a loop between blocks 1008 and 1010 until the deviations are not within tolerance. If the deviations are not within tolerance at block 1010, the variable components are adjusted to reduce the deviation by an Adjustment Means shown at block 1012. Embodiments of Adjustment Means 1012 are given below. It may be appreciated that the comparison of the tune signals with the tolerance values at block 1010 comprises means for generating a first tolerance standard signal which is active (i.e., being generated) when the tune signals are less than their respective tolerances values and is inactive (i.e., not being generated) otherwise.

After adjusting the variable components, Convergence Means 1000 tests each variable component to determine if any variable component is at a predetermined end value, as shown at block 1014. This test may, for example, be accomplished by comparing the position indication signals present on ports 30 and 34 of Matching Network to predetermined position values corresponding to the end values. If a variable component is at an end value, Convergence Means 1000 sets these components to values that will generate a suitable starting point for a successful tuning trajectory, as shown at 1016. The reset values may, for example, be the maximum values of the variable components. Convergence Means 1000 then returns to sampling block 1008 to obtain a new set of signal values. In this manner, Convergence Means 1000 directs the adjustment of the variable components to provide an impedance match between the load and source.

The accuracy of the matched condition is inversely proportional to the tolerance parameters $A_{TOL}$ and $\Phi_{TOL}$. In practice, the tolerance parameters can be reduced in value to increase the accuracy. The reduction, however, increases the amount of movement in each servomotor as it continually adjusts the components to meet more exacting standards and, consequently, increases the wear on the servomotors, which decreases their lifetimes. To balance the need for accuracy and the need for servomotor reliability, a second embodiment of the Convergence Means includes a hysteresis means for alternating between a crude tolerance standard and a fine tolerance standard. This embodiment begins in a tracking mode where the crude tolerance values are used. Once the crude tolerance values are met, the second Convergence Means switches to a tuning mode where the fine tolerance values are used. Once the fine tolerance standards are achieved, the second Convergence Means uses the crude tolerance standards to limit excessive positioning of the servomotors.

The hysteresis means may be better understood and comprehended by a Logic Flow Diagram shown at 1100 in FIG. 11. Logic Flow Diagram 1100 comprises a start entry point 1102, a track mode state 1104, a tune mode state 1106, and a hysteresis mode state 1108. The hysteresis means begins in track state 1104 with a crude tolerance standard of $A_{TOL1}$ and $\Phi_{TOL1}$. It remains in track state 1104 until $A_{TUNE}$ and $\Phi_{TUNE}$ have been converged to the crude tolerances. Once converged, the hysteresis means moves to tune mode state 1106 and uses a fine convergence standard of $A_{TOL2}$ and $\Phi_{TOL2}$. Typically, the value of $A_{TOL2}$ is one-third the value of $A_{TOL1}$ and the value of $\Phi_{TOL2}$ is one-third the value of $\Phi_{TOL1}$. The hysteresis means remains in tune state 1106 until $A_{TUNE}$ and $\Phi_{TUNE}$ have been converged to the fine tolerances. Once converged to the fine standard, the hysteresis means moves to hysteresis state 1108 where positioning instructions to the servomotors are suspended. It remains in this state until the $A_{TUNE}$ and $\Phi_{TUNE}$ signals diverge from the crude tolerance standard. Once a divergence has occurred, the hysteresis means moves to track state 1104 and restarts positioning instructions to the servomotors.

In one embodiment of the hysteresis means, a third tolerance standard intermediate the fine and crude tolerance standards is introduced and associated with the hysteresis state. The hysteresis-state standard comprises an amplitude tolerance $A_{TOL3}$, which is less than $A_{TOL1}$ and greater than $A_{TOL2}$, and a phase tolerance $\Phi_{TOL3}$, which is less than $\Phi_{TOL1}$ and greater than $\Phi_{TOL2}$. The additional tolerance standard removes the constraint of using the crude tolerance standard for both the track and hysteresis states.

The hysteresis means described in Logic Flow Diagram 1100 is incorporated in a second embodiment of the Convergence Means as shown at 1200 in FIG. 12. Convergence Means 1200 begins at block 1202 and proceeds to block 1004, where various motor-control parameter and tuning-convergence parameters are obtained. The motor-control parameters are utilized by various adjustment means detailed below. The tuning convergence parameters comprise the crude and fine standards detailed above. Convergence Means 1200 proceeds to block 1206, where the amplitude-signal null level $A_{NULL}$ and the phase-signal null level $\Phi_{NULL}$ are obtained. Convergence Means 1200 then sets the hysteresis mode in the track state, as shown at block 1208.

Once the control and convergence parameters are set, Convergence Means 1200 obtains the present values of $A_{TUNE}$ and $\Phi_{TUNE}$, as shown at a sampling block 1210. In Controller 500, these values are obtained by sampling the amplitude and phase signals present at port 530, by combining $A_{T'}(+)$ and $A_{T'}(-)$ to produce $A_{TUNE}$, and by combining $\Phi_{T'}(+)$ and $\Phi_{T'}(-)$ to produce $\Phi_{TUNE}$. Convergence Means 1200 then checks the hysteresis mode at block 1212, and chooses the fine tolerance standard at block 1216 if the hysteresis mode is in the tune state or chooses the crude tolerance standard at block 1214 if the hysteresis mode is not in the tune state. The selection is accomplished in blocks 1214 and 1216 by setting the two tolerance values $A_{TOL}$ and $\Phi_{TOL}$ to the corresponding crude or fine standards.

Convergence Means 1200 proceeds to block 1218 to test the deviations of $A_{TUNE}$ and $\Phi_{TUNE}$ from their respective null points, as defined by equations (1) and (2), above. If both deviations are within the selected tolerance, Convergence Means 1200 returns to sampling block 1210 via blocks 1220, 1222, 1224, and 1226 to obtain a new set of signal values. If the deviations are not within tolerance, Convergence Means 1200 proceeds to block 1234 via blocks 1230 and 1232 to adjust the variable components. Embodiments of Adjustment Means 1234 are given below.

It may be appreciated that the selection of crude tolerance values at block 1214 and the comparison of the tune signals with the crude tolerance values at block 1218 comprise means for generating a first tolerance standard signal which is active (i.e., being generated) when the tune signals are less than their respective tolerances values and is inactive (i.e., not being generated) otherwise. Similarly, it may be appreciated that the selection of fine tolerance values at block 1216 and the comparison of the tune signals with the crude tolerance values at block 1218 comprise means for generating a first tolerance standard signal which is active (i.e., being generated) when the tune signals are less than their respective tolerances values and is inactive (i.e., not being generated) otherwise.

After adjusting the variable components at Adjusting Means block 1234, Convergence Means 1200 tests each variable component to determine if any variable component is at a predetermined end value, as shown at block 1236. If a variable component is at an end value, Convergence Means 1200 sets these components to values that will generate a suitable starting point for a successful tuning trajectory, as shown at 1238. Convergence Means 1200 then returns to sampling block 1210 to obtain a new set of signal values.

The hysteresis means detailed in FIG. 11 comprises blocks 1208, 1220, 1222, 1224, 1226, 1230, and 1232. Block 1208 starts the hysteresis means in the track state. Convergence Means 1200 selects the crude convergence standard and adjusts the variable components until the crude standard is met. When the crude standard is met, Convergence Means 1200 proceeds to block 1220. If the hysteresis mode is in the track state, the mode is changed to the tune state at block 1222 before returning to sampling block 1210 for a new selects the fine convergence standard (at block 1212) and continues the direction of adjustments to the variable components until the fine standard is met.

When the fine standard is met, Convergence Means 1200 proceeds to block 1224 via block 1222, where the tune state is detected. The hysteresis mode is then set to the hysteresis state at block 1226. Convergence Means 1200 then selects the crude convergence standard (at block 1212) and does not direct an adjustment of variable components until a deviation is detected. When a deviation is detected at block 1218, Convergence Means 1200 proceeds to block 1230 where the hysteresis mode state is detected. The hysteresis mode is then set to the track state at block 1232 and adjustments to the variable components are resumed. In this manner, Convergence Means 1200 adjusts the variable components to provide an impedance match between the load and source while providing a hysteresis means for reducing the wear on the servomotors.

It may be appreciated that the tune state and the track state of Convergence Means 1200 may be viewed as a single "tuning" state since both states enable the adjustment of the variable components in contrast to the hysteresis state. In effect, Convergence Means 1200 initially enters the "tuning" state and remains in the tuning state until the tune signals satisfy the fine convergence standard. While in the "tuning" state, the first and second adjustment means are enabled to make adjustments to the first and second variable components, respectively. When the fine convergence standard is satisfied by the tune signals, Convergence Means 1200 enters the hysteresis state and the first and second adjustments are disabled from making adjustments to the variable components. When the tune signals no longer satisfy the crude tolerance standard, Convergence Means 1200 re-enters the "tuning" state and the first and second adjustment means are re-enabled.

An exemplary embodiment of Adjustment Means 1012 shown in FIG. 10 and Adjustment Means 1234 shown in FIG. 12 is shown at 1300 in FIG. 13. Adjustment Means 1300 compares each of the tune signals $A_{TUNE}$ and $\Phi_{TUNE}$ to the null levels $A_{NULL}$ and $\Phi_{NULL}$, respectively, and adjusts the component values of the first and second variable components, e.g., capacitors $C_1$ and $C_2$, as discussed above. Specifically, when $A_{TUNE}$ is less than $A_{NULL}$ the component value the first variable component ($C_1$) is reduced and when $A_{TUNE}$ is greater than $A_{NULL}$ the component value of the first variable component ($C_1$) is increased. Likewise, when $\Phi_{TUNE}$ is less than $\Phi_{NULL}$ the component value of the second variable component ($C_2$) is reduced and when $\Phi_{TUNE}$ is greater than $\Phi_{NULL}$ the component value of the second variable component ($C_2$) is increased. Adjustment Means 1300 comprises a first motor increment indicator $\delta P_1$ for storing the current position changes to be made to the servomotor for the first variable component ($C_1$) and a second motor increment indicator $\delta P_2$ for storing position changes to be made to the servomotor for the second variable component ($C_2$). Indicators $\delta P_1$ and $\delta P_2$ indicate the direction of change by the sign of their values with a positive sign indicating an increase in component value and a negative sign indicating a decrease in component value. Adjustment Means 1300 further comprises a first predetermined step-width $\delta_1$ for setting the magnitude of $\delta P_1$ and a second predetermined step-width $\delta_2$ for setting the magnitude of $\delta P_2$.

Adjustment Means 1300 begins at block 1302 and proceeds to block 1304, where the value of $A_{TUNE}$ is compared with the value of $A_{NUL}$. If $A_{TUNE}$ is less than $A_{NULL}$, first indicator $\delta P_1$ is set to the negative of first step-width $\delta_1$ at block 1306 to decrease the component value of the first variable component (capacitor $C_1$). Otherwise, first indicator $\delta P_1$ is set to the value of first step-width $\delta_1$ at block 1308 to increase the component value of the first variable component ($C_1$). Adjustment Means 1300 then proceeds to block 1310, where the value of $\Phi_{TUNE}$ is compared with the value of $\Phi_{NULL}$. If $\Phi_{TUNE}$ is less than $\Phi_{NULL}$, second indicator $\delta P_2$ is set to the negative of second step-width $\delta_2$ at block 1312 to decrease the component value of the second variable component (capacitor $C_2$). Otherwise, second indicator $\delta P_2$ is set to the value of second step-width $\delta_2$ at block 1314 to increase the component value of the second variable component ($C_2$). Adjustment Means 1300 then proceeds to a means for incrementing the servomotor positions shown at 1316 in FIG. 13. Increment Means 1316 increments the position of first servomotor M1, $P_1$, as indicated by first indicator $\delta P_1$ and increments the position of second servomotor M2, $P_2$, as indicated by second indicator $\delta P_2$. Exemplary embodiments of Increment Means 1316 are detailed below.

Some primary considerations arise in the selection of values for $\delta_1$ and $\delta_2$. First, to facilitate the operation of the sub-dominate control of first variable component (capacitor 231, $C_1$), the magnitude of $\delta_1$ is chosen to be less than the magnitude of $\delta_2$. In the preferred embodiments of the present invention, the value of $\delta_1$ is roughly two-thirds the value of $\delta_2$. Additionally, the magnitudes of $\delta_1$ and $\delta_2$ must be coordinated with the convergence tolerances $A_{TOL}$ and $\delta_{TOL}$ such that the adjustments made to the variable components can guide the $A_{TUNE}$ and $\Phi_{TUNE}$ signals into the convergence window defined by the tolerances. If the step-width is too large, the adjustments can step through the window without reaching convergence. As an example, the value for the minimum step-width may lie between 0.0125% and 0.25% of the full range of the servomotor.

It may be appreciated that as the step-widths are reduced to meet more stringent converge tolerances, the number of steps needed to achieve convergence increases. The increased number of steps leads to an increase in the time for convergence. A second exemplary embodiment of Adjustment Means 1012 shown in FIG. 10 and Adjustment Means 1234 shown in FIG. 12 is shown at 1400 in FIG. 14 which overcomes the above restrictive tradeoff by including a Step Width Control Means having three different step-widths for each servomotor. A large step-width is initially used to achieve a course degree of convergence. Two successively smaller step-widths are then used to reach the specified convergence tolerance while reducing the time required for convergence. It may be appreciated that more than two successively smaller step-widths may be used to provided better performance. In Adjusting Means 1400, the different step-widths are related to Tuning Curves 801 and 802 shown in FIG. 8. The Tuning Curves are reproduced at 1500 in FIG. 15 to show the relationship.

Tuning-Curve Set 1500 comprises an exemplary Amplitude-Tuning Curve 1501 having an $A_{TUNE}$ characteristic 1511 plotted as a function of the component value of the first variable component $C_1$ (M1 position) and an exemplary Phase-Tuning Curve 1502 having phase an $\Phi_{TUNE}$ characteristic 1512 plotted as a function of the component value of the second variable component $C_2$ (M2 position). Amplitude characteristic 1511 comprises a false tune point, a true tune point, a positive peak 1541, a negative peak 1551, a first window point 1561, and a second window point 1563. Phase characteristic 1512 comprises a false tune point, a true tune point, a positive peak 1542, a negative peak 1552, a first window point 1562, and a second window point 1564. Window points 1561 and 1563 are defined as the two points in the negative slope region between peaks 1541 and 1551 which have a deviation from the $A_{NULL}$ level equal in magnitude to a predetermined value of $A_W$. Likewise, Window points 1562 and 1564 are defined as the two points in the negative slope region between peaks 1542 and 1552 which have a deviation from the $\Phi_{NULL}$ level equal in magnitude to a predetermined value of $\Phi_W$.

Amplitude Tuning Curve 1501 comprises five step-width regions 1571-1575 defined by window points 1561 and 1563, peak points 1541 and 1551, and by the extreme ends of Curve 1501. One of three step-widths is associated with each region 1571-1575. The step-widths are denoted by A1, B1, and C1, with step-width A1 being the largest of the three and step-width C1 being the smallest of the three. Step-width A1 is associated with the extreme regions 1571 and 1575, step-width B1 is associated with regions 1572 and 1574, and step-width C1 is associated with region 1573. In this manner, the size of the step-width used for $C_1$ in Adjustment Means 1400 decreases as the amplitude signal $A_{TUNE}$ nears the true tune point.

Likewise, Phase Tuning Curve 1502 comprises five step-width regions 1581-1585 defined by window points 1562 and 1564, peak points 1542 and 1552, and by the extreme ends of Curve 1502. One of three step-widths is associated with each region 1581-1585. The step-widths are denoted by A2, B2, and C2, with step-width A2 being the largest of the three and step-width C2 being the smallest of the three. Step-width A2 is associated with the extreme regions 1581 and 1585, step-width B2 is associated with regions 1582 and 1584, and step-width C2 is associated with region 1583. In this manner, the size of the step-width used for $C_2$ in Adjustment Means 1400 decreases as the phase signal $\Phi_{TUNE}$ nears the true tune point.

The operation of Adjustment Means 1400 begins at block 1402, shown in FIG. 14, and proceeds to block 1404, where the slope of the $A_{TUNE}$ signal with respect to $C_1$ is calculated by an $A_{TUNE}$ slope means. An exemplary of $A_{TUNE}$ slope means 1404 is described below. The sign of the $A_{TUNE}$ slope is tested at block 1406. If the $A_{TUNE}$ slope is zero or positive, the motor increment for M1 ($\delta P_1$) is set to step-width A1 at block 1414. If the $A_{TUNE}$ slope is negative, the motor increment for M1 ($\delta P_1$) is set to step-width C1 when the magnitude of ($A_{TUNE} - A_{NULL}$) is less than the value of $A_W$ and is set to step-width B1 when the magnitude of ($A_{TUNE} - A_{NULL}$) is greater than the value of $A_W$, as shown at blocks 1408, 1410, and 1412. Adjustment Means 1400 then proceeds to block 1416, where $A_{TUNE}$ is tested against $A_{NULL}$. If $A_{TUNE}$ is less than $A_{NULL}$, motor increment $\delta P_1$ is negated at block 1418 for a decrease in $C_1$ value, otherwise $\delta P_1$ remains unaltered for an increase in $C_1$ value.

Adjustment Means 1400 proceeds to block 1420, where the slope of the $\Phi_{TUNE}$ signal with respect to $C_2$ is calculated by a $\Phi_{TUNE}$ slope means. An exemplary $\Phi_{TUNE}$ slope means 1420 is described below. The sign of the $\Phi_{TUNE}$ slope is tested at block 1422. If the $\Phi_{TUNE}$ slope is zero or positive, the motor increment for M2 ($\delta P_2$) is set to step-width A2 at block 1430. If the $\Phi_{TUNE}$ slope is negative, the motor increment for M2 ($\delta P_2$) is set to step-width C2 when the magnitude of ($\Phi_{TUNE} - \Phi_{NULL}$) is less than the value of $\Phi_W$ and is set to step-width B2 when the magnitude of ($\Phi_{TUNE} - \Phi_{NULL}$) is greater than the value of $\Phi_W$, as shown at blocks 1424, 1426, and 1428. Adjustment Means 1400 then proceeds to block 1432, where $\Phi_{TUNE}$ is tested against $\Phi_{NULL}$. If $\Phi_{TUNE}$ is less than $\Phi_{NULL}$, motor increment $\delta P_2$ is negated at block 1434 for a decrease in $C_2$ value, otherwise $\delta P_2$ remains unaltered for an increase in $C_2$ value. Adjustment Means 1400 then proceeds to an Increment Means shown at 1436 which increments the motor positions for $C_1$ and $C_2$ as indicated by the values of $\delta P_1$ and $\delta P_2$, respectively. It may be appreciated that more successively smaller step-widths in addition to step-widths B1, B2, C1, and C2 may be used to provided increased stepping performance.

An exemplary embodiment of $A_{TUNE}$ slope means 1404 is shown at 1600 in FIG. 16A and an exemplary embodiment of $\Phi_{TUNE}$ means 1420 is shown at 1650 in FIG. 16B. Slope Means 1600 begins at block 1602 and proceeds to block 1604, where the value of $A_{TUNE}$ slope is set to the $A_{TUNE}$ signal less the previously sampled value of the $A_{TUNE}$ signal, which is denoted as $A_{PREV}$. The difference is given as ($A_{TUNE} - A_{PREV}$). Slope means 1600 comprises means for storing the value of $A_{PREV}$, which is updated at the end of the slope calculation at block 1610. At this point, the value represented by $A_{TUNE}$ slope is equal to the change in the amplitude signal.

To produce a true slope value with respect to the change in $C_1$, the value represented by $A_{TUNE}$ slope should be divided by the previous change in $C_1$ value. For this application, Adjustment Means 1400 need only require the sign of the $A_{TUNE}$ slope and a complete division need not be performed. Instead, a partial division is performed by multiplying the current value of the $A_{TUNE}$ slope by the sign of the previous increment. This is performed by Slope Means 1600 at blocks 1606 and 1608, where the sign of $A_{TUNE}$ is negated at 1608 if the previous first motor increment $\delta P_1$ is found to be negative at block 1606. In the preferred embodiments of the present invention, the previous value of $\delta P_1$ is stored in a memory means by means within increment means 1436 shown in FIG. 14. Slope Means 1600 then proceeds to block 1610, where the value of $A_{PREV}$ is updated as $A_{TUNE}$, and ends at block 1612.

Likewise, Slope Means 1650 shown in FIG. 16B begins at block 1652 and proceeds to block 1654, where the value of $\Phi_{TUNE}$ slope is set to the $\Phi_{TUNE}$ signal less the previously sampled value of the $\Phi_{TUNE}$ signal, which is denoted as $\Phi_{PREV}$. The difference is given as ($\Phi_{TUNE} - \Phi_{PREV}$) Slope means 1650 comprises means for storing the value of $\Phi_{PREV}$, which is updated at the end of the slope calculation at block 1660. At this point, the value represented by $\Phi_{TUNE}$ slope is equal to the change in the phase signal. A partial division is performed by multiplying the current value of the $\Phi_{TUNE}$ slope by the sign of the previous increment to the second motor. This is performed by Slope Means 1650 at blocks 1656 and 1658, where the sign of $\Phi_{TUNE}$ is negated at 1658 if the previous first second increment $\delta P_2$ is found to be negative at 1656. In the preferred embodiment of the present invention, the previous value of $\delta P_2$ is stored in a memory means by means within increment means 1436 shown in FIG. 14. Slope Means 1650 then proceeds to block 1660, where the value of $\Phi_{PREV}$ is updated as $\Phi_{TUNE}$, and ends at block 1662.

As mentioned earlier, the amplitude signals $A_T(+)$ and $A_T(-)$ are used by a Normalization Means to normalize the tune signals $A_{TUNE}$ and $\Phi_{TUNE}$, e.g., $A_{TUNE}/|A_T(+)|$ or $A_{TUNE}/A_T(-)|$ in a preferred embodiment of the present invention. The Normalization Means reduces the variations of the tune signals with respect to changes in the power level of the signal generator and, thereby, increases the range of operation with respect to power level. The normalization is particularly important for Convergence Means 1000 and 1200 where the deviations of the tune signals from their corresponding null levels are compared to their corresponding tolerance values (cf., block 1012 in FIG. 10 and block 1218 in FIG. 12). In this regard, the normalization provides a uniform application of the tolerance criterion over all operating power levels and, hence, uniformity in the matching accuracy with respect to power level. The normalization is also important in Adjustment Means 1400 where the deviations of the tune signals from their corresponding null levels are compared to their corresponding window values $A_W$ and $\Phi_W$ to determine the step-width selections. Again, the normalization provides a uniform application of the window criterion over all operating power levels and results in a uniform tuning time with respect to power level.

In a preferred embodiment of the present invention, the Normalization Means is included in the means for sampling the amplitude and phase tune signals, as described in sampling block 1008 of FIG. 10 and sampling block 1210 of FIG. 12. A flow diagram of an exemplary embodiment of the Normalization Means of the present invention is shown at 1700 in FIG. 17. Normalization Means begins at block 1702 and proceeds to block 1704, where the un-normalized $A_{TUNE}$ is formed. In Controller 50, the difference $(|A_T(+)| - |A_T(-)|)$ is generated and in Controller 500 the difference $(|A_T'(+)| - |A_T'(-)|)$ is generated by using the scaled amplitude signals. Normalization Means 1700 proceeds to block 706 where the un-normalized $A_{TUNE}$ is divided by a first normalization signal $A_{NORM}$. In controller 50, $A_{NORM}$ may be equal to $|A_T(+)|$, $|A_T(-)|$, a signal proportional to either of the amplitude signals, or a signal related the combination of the amplitude signals. In controller 500, $A_{NORM}$ may be equal to $|A_T'(+)|$, $|A_T'(-)|$, a signal proportional to either of the scaled amplitude signals, or a signal related the combination of the scaled amplitude signals. It may be appreciated that other signals related to the input power level may be used for $A_{NORM}$.

Normalization Means then proceeds to block 1708, where the un-normalized $\Phi_{TUNE}$ is formed. In Controller 50, the difference $(|\Phi_T(+)| - |\Phi_T(-)|)$ is generated and in Controller 500 the difference $(|\Phi_T'(+)| - |\Phi_T'(-)|)$ is generated by using the scaled amplitude signals. Normalization Means 1700 proceeds to block 1710 where the un-normalized $\Phi_{TUNE}$ is divided by a second normalization signal $\Phi_{NORM}$. In controller 50, $\Phi_{NORM}$ may be equal to $|\Phi_T(+)|$, $|\Phi_T(-)|$, a signal proportional to either of the phase signals, or a signal related the combination of the phase signals. In controller 500, $\Phi_{NORM}$ may be equal to $|\Phi_T'(+)|$, $|\Phi_T'(-)|$, a signal proportional to either of the scaled phase signals, or a signal related the combination of the scaled phase signals. It may be appreciated that other signals related to the input power level may be used for $\Phi_{NORM}$. It may also be appreciated that $\Phi_{NORM}$ may be set to $A_{NORM}$, or a scalar multiple thereof. Normalization Means 1700 ends at block 1712, where it returns to the appropriate Convergence Means.

A first embodiment of Increment Means 1316, shown in FIG. 13, and of Increment Means 1436, shown in FIG. 14, is shown at 1800 in FIG. 18. Increment Means 1800 is responsive to the position increments $\delta P_1$ and $\delta P_2$ provided by Adjustment Means 1300 and 1400 and provides means for setting the pulse-width modulation signals on ports 61 and 65 of Controller 50 and for setting the motor drive enable signals on ports 62 and 66 of Controller 50. As mentioned above, a pulse-width duty-cycle of 50% produces no motion in the servomotor, a pulse-width duty-cycle greater than 50% produces an increase in component value and position, and a pulse-width duty-cycle less than 50% produces a decrease in component value and position in the preferred embodiments of the present invention.

Increment Means 1800 begins at block 1802 and proceeds to block 1804, where the pulse-width duty-cycle for the first servomotor is calculated. The details of the calculation are detailed below. Increment Means 1800 proceeds to block 1806 to calculate the pulse-width duty-cycle for the second servomotor in a similar manner. At block 1808, pulse-width modulated signals having the calculated duty-cycles are generated on ports 61 and 65 of Controller 50 and the motor enable signals on ports 62 and 66 are activated, causing servomotors M1 and M2 to change position. Increment Means 1800 then waits a predetermined amount of time $\delta T$, as shown at block 1810. The value of $\delta T$ is approximately 1 millisecond. After the time $\delta T$ has elapsed, Increment Means 1800 disables the servomotors by de-activating the enable signals on ports 62 and 66, as shown at block 1812.

Increment Means 1800 ends at block 1814, where it returns to the appropriate Adjustment Means 1300 or 1400.

The duty-cycle for each PWM signal is calculated with the aid of the following relationships. First, the increment in position is related to the product of the motor speed and the time increment $\delta T$ as follows:

$$\delta P_1 = (M1\ speed) \cdot \delta T \qquad (3)$$

$$\delta P_2 = (M2\ speed) \cdot \delta T, \qquad (4)$$

where the relationship has been provided for each motor M1 and M2. Second, each motor speed is related to the duty-cycle as follows:

$$\alpha_1 \cdot (PWM_1 - 50) = (M1\ speed) \qquad (5)$$

$$\alpha_2 \cdot (PWM_2 - 50) = (M2\ speed) \qquad (6)$$

where $\alpha_1$ and $\alpha_{21}$ are scaling constants to account for physical parameters and differences in units, and $PWM_1$ and $PWM_2$ are numbers between 0 and 100 representing the percentage of required duty-cycle for each motor. Finally, relationships (3), (4) may be combined with relationships (5), (6), respectively, to relate the given position increment to the required duty-cycle as follows:

$$PWM_1 = 50 + \frac{1}{\alpha_1} \frac{\delta P_1}{\delta T} \qquad (7)$$

$$PWM_2 = 50 + \frac{1}{\alpha_2} \frac{\delta P_2}{\delta T}. \qquad (8)$$

In matching applications where the value of the load impedance does not undergo a great deal of variation, the performance provided by Increment Means 1800 is quite acceptable. In applications where the load impedance varies greatly with time, however, the amount of motor starting and stopping performed at blocks 1808 and 1812, respectively, increases. This results in an increase in servomotor wear due to the torque impulses that are applied in starting and stopping the servomotors and, consequently, a reduction in motor lifetime. In a second embodiment of the Increment Means of the present invention, the servomotors are run continuously without stopping and restarting until the tune signals reach an appropriate convergence tolerance standard. In this way, the lifetime of the servomotors is significantly increased.

The exemplary embodiment of Increment Means 1316, shown in FIG. 13, and of Increment Means 1436, shown in FIG. 14, is shown at 1900 in FIG. 19. As with Increment Means 1800, Increment Means 1900 is responsive to the position increments $\delta P_1$ and $\delta P_2$ provided by Adjustment Means 1300 and 1400 and provides means for setting the pulse-width modulation signals on ports 61 and 65 of Controller 50 and for setting the motor drive enable signals on ports 62 and 66 of Controller 50.

Increment Means 1900 begins at block 1902 and proceeds to block 1904, where the pulse-width duty-cycle for the first servomotor is calculated. The details of the calculation are the same as detailed above with respect to Increment Means 1800, cf., equations (3)–(6). Increment Means 1900 proceeds to block 1906 to calculate the pulse-width duty-cycle for the second servomotor in a similar manner. At block 1908, pulse-width modulated signals having the calculated duty-cycles are generated on ports 61 and 65 of Controller 50, causing servomotors M1 and M2 to change position if the servomotors are currently activated. Increment Means 1900 proceeds to block 1910 where ports 62 and 66 are checked to determine if the servomotor M1 and M2 are currently active. Increment Means 1900 comprises memory means for storing the current activity state for ports 62 and 66. In Controller 500, the memory means comprises the I/O registers of Microprocessor 520 which are coupled to each of these ports and the checking operation performed at 1910 may be implemented by reading the contents of these registers. If the servomotors are not active, Increment Means 1900 sets ports 62 and 66 to an active state at block 1912, causing servomotors M1 and M2 to move.

Increment Means 1900 then waits a predetermined amount of time $\delta T$, as shown at block 1914. The value of $\delta T$ is approximately 1 millisecond. After the time $\delta T$ has elapsed, Increment Means 1900 ends at block 1816, Where it returns to the appropriate Adjustment Means 1300 or 1400. The time required to return to block 1914 from the Adjustment Means and Convergence Means of the present invention is generally much smaller than the time interval $\delta T$ so that the position increments $\delta P_1$ and $\delta P_2$ can be properly made. In the preferred embodiment of Increment Means 1900, the average return time to block 1914 is subtracted from $\delta T$ to provide an accurate setting of the position increments $\delta P_1$ and $\delta P_2$.

In contrast to Increment Means 1800, Increment Means 1900 does not comprises means for disabling the servomotors, as is done in block 1812 of FIG. 18. The means for disabling the servomotors are, instead, included within augmented embodiments of Convergence Means 1000 and Convergence Means 1200. In Convergence Means 1000, the motor-disable means is included in the path from block 1010 to block 1008, where Convergence Means 1000 returns to sample the present values of $A_{TUNE}$ and $\Phi_{TUNE}$ at block 1008 after encountering a tuned condition at block 1010. The inclusion of the motor-disable means is detailed in a partial flow diagram of an augmented Convergence Means 1000, shown at 1000A in FIG. 10A. Blocks 1008 and 1010 are reproduced in FIG. 10A as blocks 1008A and 1010A, respectively. With the exception of an additional block 1011A and its associated connections, the flow diagram of Convergence Means 1000A is identical to the flow diagram of convergence Means 1000. If the tune signals are with the tolerance standard specified by $A_{TOL}$ and $\Phi_{TOL}$, Augmented Convergence Means 1000A proceeds to block 1011A, where the servomotors M1 and M2 are disabled by resetting the enable signals on ports 62 and 66 of Controller 50. This ensures that the servomotors are stopped once a tuned condition is reached.

In Convergence Means 1200, which includes the hysteresis means detailed in FIG. 11, the motor-disable means is included in the path from block 1226 to block 1210, where Convergence Means 1200 returns to sample the present values of the tune signals after encountering a tuned condition while in the tune-mode state. The inclusion of the motor-disable means is detailed in a partial flow diagram of an augmented Convergence Means 1200, shown at 1200A in FIG. 12A. Blocks 1210, 1212, 1214, 1216, 1218, 1220, 1222, 1224, and 1226 are reproduced in FIG. 12A as blocks 1210A, 1212A, 1214A, 1216A, 1218A, 1220A, 1222A, 1224A, and 1226A, respectively. With the exception of an additional block 1227A and its associated connections, the flow diagram of Convergence Means 1200A is identical to the flow diagram of convergence Means 1200.

If the tune signals are within the tolerance standard specified by $A_{TOL}$ and $\Phi_{TOL}$ and the hysteresis mode is in the tune state, Augmented Convergence Means 1200A proceeds to block 1226A, where the hysteresis mode is set to the hysteresis state, as is done at 1226 in Convergence Means 1200. Instead of proceeding directly to block 1210A, however, Convergence Means 1200A proceeds to block 1227A, where the servomotors M1 and M2 are disabled by resetting the enable signals on ports 62 and 66 of Controller 50. This ensures that the servomotors are stopped once a tuned condition is reached when the hysteresis mode is in the tune state. Convergence Means 1200A then proceeds to block 1210A, where new values of $A_{TUNE}$ and $\Phi_{TUNE}$ are sampled. In this manner, the means for continuously running the servomotors during the tuning process, as detailed in Increment Means 1900, may be successfully included within the embodiments of the present invention.

The load-matching control means of Controller 50 further comprises a reset means for setting the variable reactive components to predetermined values when either of the variable components is at a predetermined end value of component value (e.g., capacitance or inductance). The condition of a variable component at an end value generally indicates a failure to tune (a false-tune condition). The predetermined reset values are chosen to provide precise and reliable starting point for a successful tune operation. The portion of the reset means which detects the condition of a variable reactive component being at its predetermined end value is detailed at block 912 of Setup Means 900, at block 1014 of Convergence Means 1000, and at block 1236 of Convergence Means 1200. The portion of the reset means which sets the variable components to their predetermined reset values in response to the detected end-value condition is employed by Setup Means 900 at block 914 in FIG. 9, by Convergence Means 1000 at block 1016 in FIG. 10, and by Convergence Means 1200 at block 1238 in FIG. 12.

The operation of an exemplary embodiment of the portion of the reset means according to the present invention which sets the variable components to their predetermined reset values is shown at 2000 in FIG. 20. Reset Means Portion 2000 begins at block 2002 and proceeds to block 2004, where the servomotors are disabled by resetting the enable signals on ports 62 and 66 of Controller 50. This prevents further movement in the servomotors and allows the position of each servomotor to be set separately. Reset Means Portion 2000 proceeds to block 2006 to set a predetermined motor direction for each servomotor which will cause each servomotor to move towards a motor position corresponding to its respective reset value. In the preferred embodiments where each reset value is the variable component's maximum component value, the duty-cycle of the pulse-width modulation signal for each servomotor is set to a value greater than 50%, causing a counterclockwise servomotor rotation and a corresponding increase in the component value.

Reset Means Portion 2000 sets servomotor M1 to its reset value as follows. First, it enables servomotor M1 at block 2008 by generating an enable signal at port 62 of Controller 50. Second, the present position of servomotor M1 is measured at block 2010 by sampling the position signal at port 60 of Controller 50. Third, this position signal is compared against a motor position value corresponding to the predetermined reset value for motor M1 at block 2012. If the present M1-position value is not substantially equal to the position corresponding to the reset value, the process returns for another measurement at block 2010. Once the M1-position value reaches the position corresponding to the reset value, Reset Means Portion 2000 proceeds to block 2014 to disable servomotor M1 by resetting the enable signal on port 62 of Controller 50.

In the analog/digital facilities of Controller 500, the time required to perform the measurement at block 2010 and the test at block 2012 is on the order of 50 microseconds. Since the time to complete the full range of rotation in servomotor M1 is on the order of one second, position measurement at block 2010 changes by approximately one part in 10,000, or 0.01%, from one measurement to the next. For the purposes of the comparison test in block 2012, the measured position and the position corresponding to the reset value are substantially equal if they differ by less than one part in 1,000, or 0.1%.

In a similar manner, Reset Means Portion 2000 resets servomotor M2 by enabling servomotor M2 at block 2016 by generating an enable signal at port 66 of Controller 50, measuring the present position of servomotor M2 at block 2018 by sampling the position signal at port 64 of Controller 50, comparing the position signal against a motor position corresponding to the predetermined reset value for motor M2 at block 2020, and by returning for another measurement at block 2018 if the present M2-position value is not substantially equal to position corresponding to the predetermined M2-reset value. Once servomotor M2 reaches the reset value, Reset Means Portion 2000 proceeds to block 2022 to disable servomotor M2 by resetting the enable signal on port 66 of Controller 50. Reset Means Portion 2000 then ends at block 2024 and returns to the appropriate Setup or Convergence Means.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An automatic impedance matching apparatus having an input port coupled to a signal generator and an output port coupled to a load, said input and output ports each having a signal line and a ground line, said signal generator having a predetermined characteristic impedance, said apparatus comprising:

matching means coupled between said input port and output port for matching the impedance of said load to the impedance of said signal generator, said matching means including a first variable reactive component and a second variable reactive component;

a detection means for generating an amplitude tune signal related to the difference of the voltage waveform amplitude at said input port and the product of said predetermined characteristic impedance and the current waveform amplitude at said input port and for generating a phase tune signal related to the phase difference between the voltage and current waveforms at said input port, said amplitude tune signal increasing as said voltage amplitude increases and decreasing as said current amplitude increases, said phase tune signal being substantially equal to zero when said input voltage and input current waveforms are in phase, said phase tune signal increasing as said input voltage waveform leads said input current waveform and decreasing as said input voltage waveform lags said input current waveform; and control means responsive to said amplitude and phase tune signals for adjusting the values of said first and second variable reactive components to provide a tuned condition at said input port, said control means including a first adjustment for modifying the value of said first variable reactive component as a function of said amplitude tune signal, a second adjustment means for modifying the value of said second variable reactive component as a function of said phase tune signal, reset means for setting the value of said first variable reactive component to a first predetermined reset value and for setting the value of said second variable reactive component to a second predetermined reset value when either said first variable reactive component reaches a first predetermined end value or said second variable reactive component reaches a second predetermined end value, and convergence means for directing the adjustments of said first and second variable components, said convergence means comprising means for generating a first tolerance standard signal when the magnitude of said amplitude tune signal is less than a predetermined first amplitude tolerance value and the magnitude of said phase tune signal is less than a predetermined first phase tolerance value and means responsive to said first tolerance standard signal for disabling said first and second adjustment means.

2. The automatic impedance matching apparatus of claim 1 wherein said first variable reactive component comprises a first variable capacitor coupled between said signal and ground lines of said input port, said second variable reactive component comprises a second variable capacitor coupled between said signal and ground lines of said output port, and wherein said matching means further comprises an inductor coupled between said input port signal line and said output port signal line.

3. The automatic impedance matching apparatus of claim 2 wherein said first adjustment means increases the capacitance of said first variable capacitance when said amplitude tune signal is greater than zero and decreases the capacitance of said first variable capacitor when said amplitude tune signal is less than zero and within said second adjustment means increases the capacitance of said second variable capacitance when said phase tune signal is greater than zero and decreases the capacitance of said second variable capacitor when said phase tune signal is less than zero.

4. The automatic impedance matching apparatus of claim 1 wherein said first variable reactive component comprises a variable capacitor coupled between said signal and ground lines of said input port and wherein said second variable reactive component comprises a variable inductor coupled between said input port signal line and said output port signal line.

5. The automatic impedance matching apparatus of claim 4 wherein said first adjustment means increases the capacitance of said variable capacitor when said amplitude tune signal is greater than zero and decreases the capacitance of said variable capacitor when said amplitude tune signal is less than zero and wherein said second adjustment means increases the inductance of said variable inductor when said phase tune signal is greater than zero and decreases the inductance of said variable inductor when said phase tune signal is less than zero.

6. The automatic impedance matching apparatus of claim 1 wherein said matching means further comprises an intermediate node and an inductor coupled between said input port signal line and said intermediate node, wherein said first variable reactive component comprises a first variable capacitor coupled between said signal and ground lines of said input port, and wherein said second variable reactive component comprises a second variable capacitor coupled between said intermediate node and said signal line of said output port.

7. The automatic impedance matching apparatus of claim 6 wherein said first adjustment means increases the capacitance of said first variable capacitance when said amplitude tune signal is greater than zero and decreases the capacitance of said first variable capacitor when said amplitude tune signal is less than zero and wherein said second adjustment means increases the capacitance of said second variable capacitance when said phase tune signal is greater than zero and decreases the capacitance of said second variable capacitor when said phase tune signal is less than zero.

8. The automatic matching apparatus of claim 1 wherein said first end value is less than said first reset value and said second end value is less than said second reset value.

9. The automatic matching apparatus of claim 8 wherein said first reset value is substantially equal to the maximum component value of said first variable component and said second reset value is substantially equal to the maximum component value of said second variable component.

10. The automatic matching apparatus of claim 8 wherein said first end value is substantially equal to the minimum component value of said first variable component and said second end value is substantially equal to the minimum component value of said second variable component.

11. The automatic matching apparatus of claim 1 wherein said matching network comprises indication means for generating a first position signal related to the component value of said first variable component and a second position signal related to the component value of said second variable component and wherein said reset means comprises means for receiving said first and second position signals.

12. The Automatic matching apparatus of claim 1 wherein said first adjustment means further comprises a step-width control means for adjusting said first variable component in variable increments, said step width control means comprising:
  slope means for generating an amplitude slope signal related to the derivative of said amplitude tune signal with respect to the component value of said first variable component; and
  first stepping means for adjusting the component value of said first variable component in increments equal in magnitude to a first predetermined step width when said amplitude slope signal is greater than zero and for adjusting the component value of said first variable component in increments equal in magnitude to a second predetermined step width when said amplitude slope signal is less than zero, said second step width being smaller than said first step width.

13. The automatic matching apparatus of claim 12 wherein said step-width control means further comprises:
  a second stepping means for adjusting the component value of said first variable component in increments equal in magnitude to a third predetermined step width when said amplitude slope signal is less than zero and the magnitude of said amplitude tune signal is greater than a predetermined amplitude window level, said third step width being larger than said second step width and smaller than said first step width.

14. The Automatic matching apparatus of claim 1 wherein said second adjustment means further comprises a step-width control means for adjusting said second variable component in variable increments, said step width control means comprising:
  slope means for generating a phase slope signal related to the derivative of said phase tune signal with respect to the component value of said second variable component; and
  first stepping means for adjusting the component value of said second variable components in increments equal in magnitude to a first predetermined step width when said phase slope signal is greater than zero and for adjusting said second variable component in increments equal in magnitude to a second predetermined step width when said phase slope signal is less than zero.

15. The automatic matching apparatus of claim 14 wherein said step-width control means further comprises:
  a second stepping means for adjusting the component value of said second variable component in increments equal in magnitude to a predetermined third step width when said phase slope signal is less than zero and the magnitude of said phase tune signal is greater than a predetermine phase window level, said third step width being larger than said second step width and smaller than said first step width.

16. The automatic matching apparatus of claim 1 wherein said detection means comprises means for generating a normalizing signal as a function of a selected one of said voltage waveform amplitude at said input port and said current waveform amplitude at said input port, and wherein said control means comprises amplitude normalization means for normalizing said amplitude tune signal with respect to said normalizing signal.

17. The automatic matching apparatus of claim 16 wherein said control means further comprises phase normalization means for normalizing said phase tune signal with respect to said normalizing signal.

18. The automatic matching apparatus of claim 1 wherein said first adjustment means adjusts the component value of said first variable component at a slower rate than said second adjustment means adjusts the component value of said second variable component.

19. The automatic matching apparatus of claim 1 wherein said first variable component comprises a mechanical adjustment shaft, wherein said first adjustment means comprises a first servomotor for adjusting said first variable component, said first servomotor having a mechanical shaft coupled to said mechanical adjustment shaft of said first variable component, wherein said second variable component comprises a mechanical adjustment shaft, and wherein said second adjustment means comprises a second servomotor for adjusting said second variable component, said second servomotor having a mechanical shaft coupled to said mechanical adjustment shaft of said second variable component.

20. An automatic impedance matching apparatus having an output port coupled to a load, said input and output ports each having a signal line and a ground line, said signal generator having a predetermined characteristic impedance, said apparatus comprising:

matching means coupled between said input port and output port for matching the impedance of said load to the impedance of said signal generator, said matching means including a first variable reactive component and a second variable reactive component;

a detection means for generating an amplitude tune signal related to the difference of the voltage waveform amplitude at said input port and the product of said predetermined characteristic impedance and the current waveform amplitude at said input port and for generating a phase tune signal related to the phase difference between the voltage and current waveforms at said input port, said amplitude tune signal increasing as said voltage amplitude increases and decreasing as said current amplitude increases, said phase tune signal being substantially equal to zero when said input voltage and input current waveforms are in phase, said phase tune signal increasing as said input voltage waveform leads said input current waveform and decreasing as said input voltage waveform lags said input current waveform; and control means responsive to said amplitude and phase tune signals for adjusting the values of said first and second variable reactive components to provide a tuned condition at said input port, said control means including a first adjustment means for modifying the value of said first variable reactive component as a function of said amplitude tune signal, a second adjustment means for modifying the value of said second variable reactive component as a function of said phase tune signal, said control means further comprising a convergence means for directing the adjustments of said first and second variable components, said convergence means comprising:

means for generating a coarse tolerance standard signal when the magnitude of said amplitude tune signal is less than a predetermined first amplitude tolerance value and the magnitude of said phase tune signal is less than a predetermined first phase tolerance value;

means for generating a fine tolerance standard signal when the magnitude of said amplitude tune signal is less than a predetermined second amplitude tolerance value and the magnitude of said phase tune signal is less than a predetermined second phase tolerance value, said second amplitude tolerance value being less than said first amplitude tolerance value and said second phase tolerance value being less than said first phase tolerance value;

means for initially placing said convergence means in a tuning state and for initially enabling said first and second adjustment means;

means responsive to said fine tolerance standard signal for causing said convergence means to enter a hysteresis state when said convergence means is in said tuning state, said first and second adjustment means being disabled in said hysteresis state; and means for placing said convergence means in said tuning state and for enabling said first and second adjustment means when said convergence means is in said hysteresis state and said coarse tolerance standard signal is not being generated.

21. The automatic matching apparatus of claim 20 wherein said tuning state comprises a track state and a tune state, said convergence means being in said track state when said coarse tolerance standard signal is being generated and said fine tolerance standard is not being generated, said convergence means being is said tune state when said fine tolerance standard signal is being generated.

22. The automatic matching apparatus of claim 20 wherein said first adjustment means further comprises a step-width control means for adjusting said first variable component in variable increments, said step width control means comprising:

slope means for generating an amplitude slope signal related to the derivative of said amplitude tune signal with respect to the component value of said first variable component; and first stepping means for adjusting the component value of said first variable component in increments equal in magnitude to a first predetermined step width when said amplitude slope signal is greater than zero and for adjusting the component value of said first variable component in increments equal in magnitude to a second predetermined step width when said amplitude slope signal is less than zero, said second step width, being smaller than said first step width.

23. The automatic matching apparatus of claim 22 wherein said step-width control means further comprises:

a second stepping means for adjusting the component value of said first variable component in increments equal in magnitude to a third predetermined step width when said amplitude slope signal is less than zero and the magnitude of said amplitude tune signal is greater than a predetermined amplitude window level, said third step width being larger than said second step width and smaller than said first step width.

24. The automatic matching apparatus of claim 20 wherein said second adjustment means further comprises a step-width control means for adjusting said second variable component in variable increments, said step width control means comprising:

slope means for generating a phase slope signal related to the derivative of said phase tune signal with respect to the component value of said second variable component; and first stepping means for adjusting the component value of said second variable component in increments equal in magnitude to a first predetermined step width when said phase slope signal is greater than zero and for adjusting said second variable component in increments equal in magnitude to a second predetermined step width when said phase slope signal is less than zero, said second step width being smaller than said first step width.

25. The automatic matching apparatus of claim 24 wherein said step-width control means further comprises:
a second stepping means for adjusting the component value of said second variable component in increments equal in magnitude to a third predetermined step width when said phase slope signal is less than zero and the magnitude of said phase tune signal is greater than a predetermine phase window level, said third step width being larger than said second step width and smaller than said first step width.

26. The automatic matching apparatus of claim 20 wherein said detection means comprises means for generating a normalizing signal as a function of a selected one of said voltage waveform amplitude at said input port and said current waveform amplitude at said input port, and wherein said control means comprises amplitude normalization means for normalizing said amplitude tune signal with respect to said normalizing signal.

27. The automatic matching apparatus of claim 26 wherein said control means further comprises phase normalization means for normalizing said phase tune signal with respect to said normalizing signal.

28. An automatic impedance matching apparatus having an input port coupled to a signal generator and an output port coupled to a load, said input and output ports each having a signal line and a ground line, said signal generator having a predetermined characteristic impedance, said apparatus comprising:
matching means coupled between said input port and output port for matching the impedance of said load to the impedance of said signal generator, said matching means including a first variable reactive component and a second variable reactive component;
a detection means for generating an amplitude tune signal related to the difference of the voltage waveform amplitude at said input port and the product of said predetermined characteristic impedance and the current waveform amplitude at said input port and for generating a phase tune signal related to the phase difference between the voltage and current waveforms at said input port, said amplitude tune signal increasing as said voltage amplitude increases and decreasing as said current amplitude increases, said phase tune signal being substantially equal to zero when said input voltage and input current waveforms are in phase, said phase tune signal increasing as said input voltage waveform leads said input current waveform and decreasing as said input voltage waveform lags said input current waveform; and
control means responsive to said amplitude and phase tune signals for adjusting the values of said first and second variable reactive components to provide a tuned condition at said input port, said control means including a first adjustment means for modifying the value of said first variable reactive component as a function of said amplitude tune signal, a second adjustment means for modifying the value of said second variable reactive component as a function of said phase tune signal, said first adjustment means further comprising a step-width control means for adjusting said first variable component in variable increments, said step width control means comprising:
slope means for generating an amplitude slope signal related to the derivative of said amplitude tune signal with respect to the component value of said first variable component; and
first stepping means for adjusting the component value of said first variable component in increments equal in magnitude to a first predetermined step width when said amplitude slope signal is greater than zero and for adjusting the component value of said first variable component in increments equal in magnitude to a second predetermined step width when said amplitude slope signal is less than zero, said second step width, being smaller than said first step width.

29. The automatic matching apparatus of claim 28 wherein said step-width control means further comprises:
a second stepping means for adjusting the increments equal in magnitude to a third predetermined step width when said amplitude slope signal is less than zero and the magnitude of said amplitude tune signal is greater than a predetermined amplitude window level, said third step width being larger than said second step width and smaller than said first step width.

30. The Automatic matching apparatus of claim 28 wherein said step-width control means comprises a first memory means for storing the sign of the previous adjustment increment of said first variable component, and wherein said slope means comprises:
a second memory means for storing a previous value of said amplitude tune signal; and
means for generating said amplitude slope signal as the value of the amplitude tune signal less the value stored in said second memory means when the sign value in said first memory means is negative and as the value stored in said second memory means less the value of the amplitude tune signal when the sign value stored in said first memory means is positive.

31. The automatic matching apparatus of claim 30 where said first memory means initially stores a first predetermined starting value and said second memory means initially stores a second predetermined starting value.

32. The automatic matching apparatus of claim 28 wherein said detection means comprises means for generating a normalizing signal as a function of a selected one of said voltage waveform amplitude at said input port and said current waveform amplitude at said input port, and wherein said control means comprises amplitude normalization means for normalizing said amplitude tune signal with respect to said normalizing signal.

33. The automatic matching apparatus of claim 32 wherein said control means further comprises phase normalization means for normalizing said phase tune signal with respect to said normalizing signal.

34. An automatic impedance matching apparatus having an input port coupled to a signal generator and an output port coupled to a load, said input and output ports each having a signal line and a ground line, said signal generator having a predetermined characteristic impedance, said apparatus comprising:
matching means coupled between said input port and output port for matching the impedance of said load to the impedance of said signal generator, said matching means including a first variable reactive component and a second variable reactive component;

a detection means for generating an amplitude tune signal related to the difference of the voltage waveform amplitude at said input port and the product of said predetermined characteristic impedance and the current waveform amplitude at said input port and for generating a phase tune signal related to the phase difference between the voltage and current waveforms at said input port, said amplitude tune signal increasing as said voltage amplitude increases and decreasing as said current amplitude increases, said phase tune signal being substantially equal to zero when said input voltage and input current waveforms are in phase, said phase tune signal increasing as said input voltage waveform leads said input current waveform and decreasing as said input voltage waveform lags said input current waveform; and control means responsive to said amplitude and phase tune signals for adjusting the values of said first and second variable reactive components to provide a tuned condition at said input port, said control means including a first adjustment means for modifying the value of said first variable reactive component as a function of said amplitude tune signal, a second adjustment means for modifying the value of said second variable reactive component as a function of said phase tune signal, said second adjustment means further comprising a step-width control means for adjusting said second variable component in variable increments, said step width control means comprising:

slope means for generating a phase slope signal related to the derivative of said phase tune signal with respect to the component value of said second variable component; and first stepping means for adjusting the component value of said second variable component in increments equal in magnitude to a first predetermined step width when said phase slope signal is greater than zero and for adjusting said second variable component in increments equal in magnitude to a second predetermined step width when said phase slope signal is less than zero, said second step width being smaller than said first step width.

35. The automatic matching apparatus of claim 34 wherein said step-width control means further comprises:

a second stepping means for adjusting the component value of said second variable component in increments equal in magnitude to a third predetermined step width when said phase slope signal is less than zero and the magnitude of said phase tune signal is greater than a predetermine phase window level, said third step width being larger than said second step width and smaller than said first step width.

36. The Automatic matching apparatus of claim 34 wherein said step-width control means comprises a first memory means for storing the sign of the previous adjustment increment of said second variable component, and wherein said slope means comprises:

a second memory means for storing a previous value of said phase tune signal; and means for generating said phase slope signal as the value of the phase tune signal less the value stored in said second memory means when the sign value in said first memory means is negative and as the value stored in said second memory means less the value of the phase tune signal when the sign value stored in said first memory means is positive.

37. The automatic matching apparatus of claim 36 where said first memory means initially stores a first predetermined starting value and said second memory means initially stores a second predetermined starting value.

38. The automatic matching apparatus of claim 34 wherein said detection means comprises means for generating a normalizing signal as a function of a selected one of said voltage waveform amplitude at said input port and said current waveform amplitude at said input port, and wherein said control means comprises phase normalization means for normalizing said phase tune signal with respect to said normalizing signal.

39. The automatic matching apparatus of claim 38 wherein said control means further comprises amplitude normalization means for normalizing said amplitude tune signal with respect to said normalizing signal.

40. An automatic impedance matching apparatus having an input port coupled to a signal generator and an output port coupled to a load, said input and output ports each having a signal line and a ground line, said signal generator having a predetermined characteristic impedance, said apparatus comprising:

matching means coupled between said input port and output port for matching the impedance of said load to the impedance of said signal generator, said matching means including a first variable reactive component and a second variable reactive component;

a detection means for generating an amplitude tune signal related to the difference of the voltage waveform amplitude at said input port and the product of said predetermined characteristic impedance and the current waveform amplitude at said input port and for generating a phase tune signal related to the phase difference between the voltage and current waveforms at said input port, said amplitude tune signal increasing as said voltage amplitude increases and decreasing as said current amplitude increases, said phase tune signal being substantially equal to zero when said input voltage and input current waveforms are in phase, said phase tune signal increasing as said input voltage waveform leads said input current waveform and decreasing as said input voltage waveform lags said input current waveform, said detection means further comprising means for generating a normalizing signal as a function of a selected one of said voltage waveform amplitude at said input port and said current waveform amplitude at said input port; and control means responsive to said amplitude and phase tune signals for adjusting the values of said first and second variable reactive components to provide a tuned condition at said input port, said control means including a first adjustment means for modifying the value of said first variable reactive component as a function of said amplitude tune signal, a second adjustment means for modifying the value of said second variable reactive component as a function of said phase tune signal, said control means further comprising amplitude normalization means for normalizing said amplitude tune signal with respect to said normalizing signal.

41. The automatic matching apparatus of claim 40 wherein said control means further comprises phase normalization means for normalizing said phase tune signal with respect to said normalizing signal.

42. An automatic impedance matching apparatus ..having an input port coupled to a signal generator and an output port coupled to a load, said input and output ports each having a signal line and a ground line, said signal generator having a predetermined characteristic impedance, said apparatus comprising:

matching means coupled between said input port and output port for matching the impedance of said load to the impedance of said signal generator, said matching means including a first variable reactive component and a second variable reactive component;

a detection means for generating an amplitude tune signal related to the difference of the voltage waveform amplitude at said input port and the product of said predetermined characteristic impedance and the current waveform amplitude at said input port and for generating a phase tune signal related to the phase difference between the voltage and current waveforms at said input port, said amplitude tune signal increasing as said voltage amplitude increases and decreasing as said current amplitude increases, said phase tune signal being substantially equal tn zero when said input voltage and input current waveforms are in phase, said phase tune signal increasing as said input voltage waveform leads said input current waveform and decreasing as said input voltage waveform lags said input current waveform, said detection means further comprising means for generating a normalizing signal as a function of a selected one of said voltage waveform amplitude at said input port and said current waveform amplitude at said input port; and control means responsive to said amplitude and phase tune signals for adjusting the values of said first and second variable reactive components to provide a tuned condition at said input port, said control means including a first adjustment means for modifying the value of said first variable reactive component as a function of said amplitude tune signal, a second adjustment means for modifying the value of said second variable reactive component as a function of said phase tune signal, said control means further comprising phase normalization means for normalizing said phase tune signal with respect to said normalizing signal.

43. The automatic matching apparatus of claim 42 wherein said control means further comprises amplitude normalization means for normalizing said amplitude tune signal with respect to said normalizing signal.

* * * * *